United States Patent
Kim et al.

(10) Patent No.: US 11,656,730 B2
(45) Date of Patent: May 23, 2023

(54) DISPLAY DEVICE

(71) Applicant: Samsung Display Co., Ltd., Yongin-si (KR)

(72) Inventors: Chang Bum Kim, Pyeongtaek-Si (KR); Hyung Chul Kim, Hwaseong-Si (KR); Jung Mok Park, Hwaseong-Si (KR); Young Sik Kim, Yongin-Si (KR); Young Seok Yoo, Suwon-Si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/592,516

(22) Filed: Feb. 4, 2022

(65) Prior Publication Data
US 2022/0229516 A1 Jul. 21, 2022

Related U.S. Application Data

(63) Continuation of application No. 16/482,238, filed as application No. PCT/KR2019/001248 on Jan. 30, 2019, now Pat. No. 11,243,645.

(30) Foreign Application Priority Data
Aug. 13, 2018 (KR) .......................... 10-2018-0094503

(51) Int. Cl.
*G06F 3/044* (2006.01)
*G06F 3/041* (2006.01)
(Continued)

(52) U.S. Cl.
CPC .......... *G06F 3/0445* (2019.05); *G06F 3/0412* (2013.01); *G06F 3/0416* (2013.01);
(Continued)

(58) Field of Classification Search
CPC ..... G06F 3/0412; G06F 3/0445; G06F 3/0446
See application file for complete search history.

(56) References Cited

U.S. PATENT DOCUMENTS

| 8,816,967 | B2 | 8/2014 | Lyon et al. |
|---|---|---|---|
| 9,146,413 | B2 | 9/2015 | Kim |

(Continued)

FOREIGN PATENT DOCUMENTS

| CN | 108132732 | 6/2018 |
|---|---|---|
| KR | 10-2014-0040428 | 4/2014 |

(Continued)

OTHER PUBLICATIONS

Non-Final Office Action dated Feb. 22, 2021, in U.S. Appl. No. 16/482,238.
(Continued)

*Primary Examiner* — Mark Edwards
*Assistant Examiner* — Chayce R Bibbee
(74) *Attorney, Agent, or Firm* — H.C. Park & Associates, PLC

(57) ABSTRACT

A display device includes a display unit having a display area with a first hole formed therein, and an input sensing unit which is disposed on the display unit and having a second hole corresponding to the first hole, the input sensing unit includes a base layer which includes: an adjacent area adjacent to the second hole; and a sensing area overlapping the display area, detection electrodes disposed on the sensing area; and a first connection wiring disposed on the adjacent area and that electrically connects at least two detection electrodes spaced apart by the second hole, disposed at respective sides of the second hole. The display unit includes dams disposed adjacent to the first hole, each of the dams forming a closed loop along edges of the first hole. The first connection wiring overlaps at least one of the dams.

36 Claims, 44 Drawing Sheets

(51) Int. Cl.
*H01L 27/32* (2006.01)
*H01L 51/52* (2006.01)

(52) U.S. Cl.
CPC .......... *G06F 3/0446* (2019.05); *H01L 27/323* (2013.01); *H01L 27/3276* (2013.01); *H01L 51/5253* (2013.01); *H01L 51/5284* (2013.01); *G06F 2203/04112* (2013.01)

(56) References Cited

U.S. PATENT DOCUMENTS

| | | |
|---|---|---|
| 2013/0279769 A1 | 10/2013 | Benkley et al. |
| 2014/0354586 A1 | 12/2014 | Yousefpor et al. |
| 2016/0170524 A1 | 6/2016 | Kim et al. |
| 2016/0270234 A1 | 9/2016 | Ahn |
| 2017/0097703 A1 | 4/2017 | Lee |
| 2017/0123572 A1 | 5/2017 | Song et al. |
| 2017/0287992 A1 | 10/2017 | Kwak et al. |
| 2019/0033995 A1 | 1/2019 | Teramoto |
| 2019/0079622 A1 | 3/2019 | Choi et al. |

FOREIGN PATENT DOCUMENTS

| | | |
|---|---|---|
| KR | 10-1398171 | 5/2014 |
| KR | 10-1437034 | 11/2014 |
| KR | 10-2014-0142370 | 12/2014 |
| KR | 10-2017-0111827 | 10/2017 |
| KR | 2018-0062155 | 6/2018 |
| WO | 2018008820 | 1/2018 |

OTHER PUBLICATIONS

Notice of Allowance dated Sep. 22, 2021, in U.S. Appl. No. 16/482,238.
Extended European Search Report dated Mar. 21, 2022, issued in European Patent Application No. 19849606.9.

CP2: CP2_R, CP2_11, CP2_12, CP2_13, CP2_21, CP2_22, CP2_23

CP1: CP1_R, CP1_11, CP1_12, CP1_13, CP1_21, CP1_22, CP1_23

CP2: CP2_R, CP2_11, CP2_12, CP2_13, CP2_21, CP2_22, CP2_23

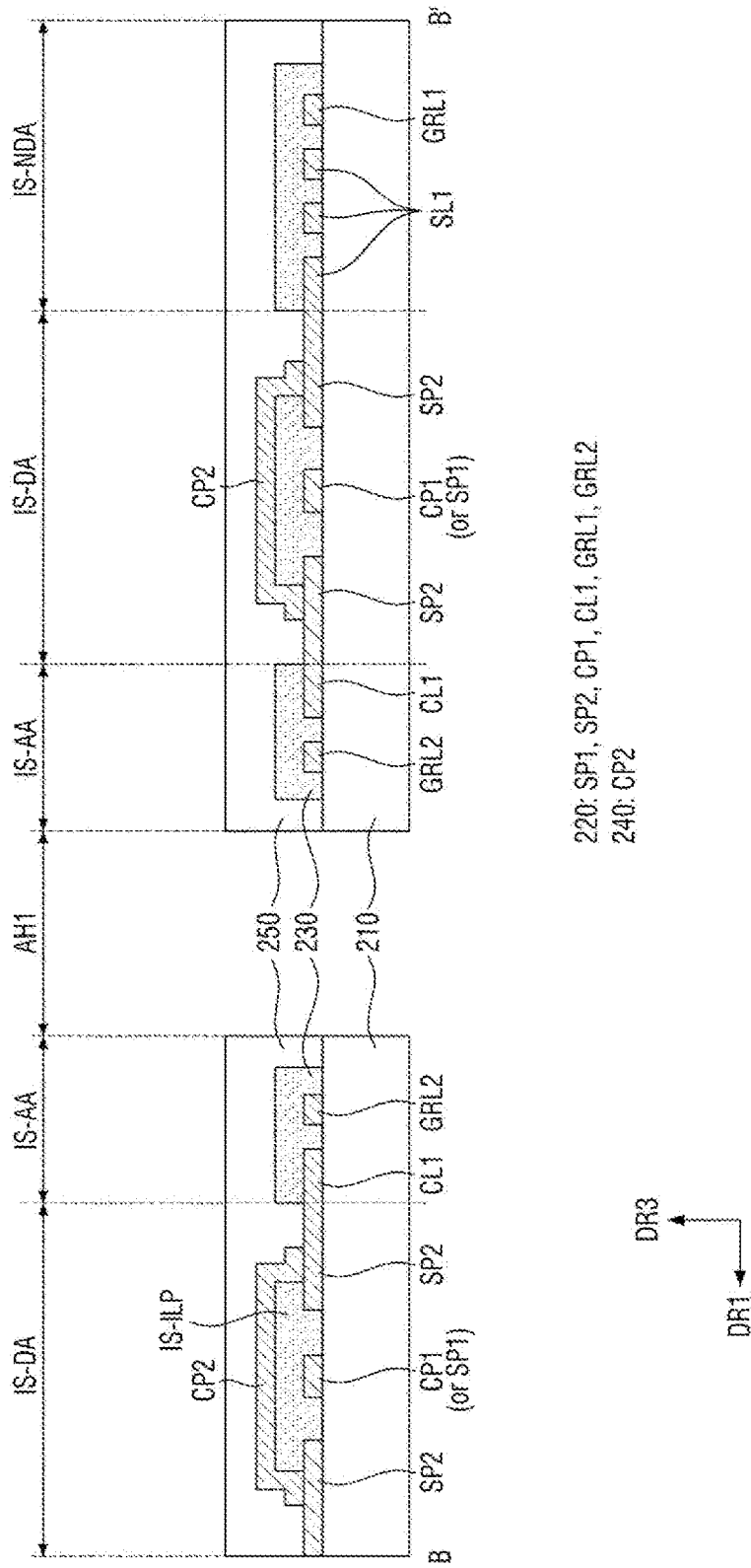

DISPLAY DEVICE

CROSS-REFERENCE TO RELATED APPLICATIONS

This application is a continuation of U.S. application Ser. No. 16/482,238, filed Jul. 30, 2019, which in turn is a National Stage Entry of International Application No. PCT/KR2019/001248, filed Jan. 30, 2019, and which claims priority from and the benefit of Korean Patent Application No. 10-2018-0094503, filed on Aug. 13, 2018, each of which is incorporated by reference for all purposes as if fully set forth herein.

BACKGROUND

Field

Exemplary embodiments/implementations of the invention relates to a display device including an input sensing unit.

Discussion of the Background

Various display devices used in multimedia devices such as televisions, mobile phones, tablet computers, navigation systems and game machines are being developed. The display devices include a keyboard or a mouse as an input device. In addition, the display devices include a touch panel as an input device.

The display devices may further include a camera device, a fingerprint recognition sensor, etc. The above sensors are generally disposed on a side of a display device, thereby increasing a dead space. However, recently, a notch design is applied to a display device, and a camera device, etc. are disposed in a notch area to maximize a display area of the display device.

The above information disclosed in this Background section is only for understanding of the background of the inventive concepts, and, therefore, it may contain information that does not constitute prior art.

SUMMARY

Additional features of the inventive concepts will be set forth in the description which follows, and in part will be apparent from the description, or may be learned by practice of the inventive concepts.

Devices constructed according to exemplary implementations/embodiments of the invention are capable of displaying an image on the entire front surface and sensing an input by including a hole, in which a sensor such as a camera device is disposed, in a display area.

However, aspects of the present disclosure are not restricted to the one set forth herein. The above and other aspects of the present disclosure will become more apparent to one of ordinary skill in the art to which the present disclosure pertains by referencing the detailed description of the present disclosure given below.

According to one or more embodiments of the invention, a display device comprising: a display unit which comprises a display area and a first hole formed in the display area; and an input sensing unit which is disposed on the display unit and comprises a second hole corresponding to the first hole, wherein the input sensing unit further comprises: a base layer which comprises an adjacent area located adjacent to the second hole and a sensing area overlapping the display area and surrounding the adjacent area; detection electrodes which are disposed on the sensing area; and a first connection wiring which is disposed on the adjacent area and electrically connects detection electrodes spaced apart by the second hole among the detection electrodes.

In an exemplary embodiment, wherein the detection electrodes comprise sensing electrodes arranged in a first direction and connected to each other and driving electrodes arranged in a second direction perpendicular to the first direction and connected to each other, wherein a first driving electrode and a second driving electrode spaced apart from each other by the second hole among the driving electrodes are electrically connected by the first connection wiring.

In an exemplary embodiment, electrically connect the sensing electrodes to each other, wherein a first sensing electrode and a second sensing electrode disposed adjacent to the second hole among the sensing electrodes are electrically connected to each other by a first adjacent connection part among the first connection parts, and the first adjacent connection part is located on a first reference boundary line spaced apart from the second hole by a reference distance.

In an exemplary embodiment, wherein the first connection parts are located on one imaginary line, and the first adjacent connection part is located at an intersection point of the imaginary line and the first reference boundary line.

In an exemplary embodiment, wherein the input sensing unit further comprises: pads which are disposed on a non-sensing area of the base layer along edges of the sensing area; and sensing lines which are electrically connected to the pads and are disposed on the non-sensing area, wherein the first sensing electrode and the second sensing electrode are electrically connected to two of the pads by two of the sensing lines.

In an exemplary embodiment, wherein a sensing electrode not adjacent to the second hole among the sensing electrodes is electrically connected to only one of the sensing lines.

In an exemplary embodiment, wherein the input sensing unit further comprises a guard line which is disposed on the adjacent area of the base layer to form a closed loop along edges of the second hole.

In an exemplary embodiment, wherein each of the sensing electrodes and the first connection wiring comprises a transparent conductive pattern, and the first connection wiring comprises a metal conductive pattern disposed on the transparent conductive pattern.

In an exemplary embodiment, wherein the input sensing unit further comprises a sensing wiring which is connected to an end of one of the detection electrodes, and a line width of the first connection wiring is greater than that of the sensing wiring.

In an exemplary embodiment, wherein the input sensing unit further comprises a second connection wiring which is disposed on the adjacent area and electrically connects detection electrodes spaced apart by the second hole among the detection electrodes, wherein the line width of the first connection wiring is different from that of the second connection wiring.

In an exemplary embodiment, wherein the display unit comprises: a first substrate; a second substrate which is disposed opposite the first substrate; a display element layer which is disposed between the first substrate and the second substrate; and a sealing member which is disposed between the first substrate and the second substrate to surround the first hole and seal the first substrate and the second substrate, wherein the first connection wiring overlap the sealing member.

In an exemplary embodiment, the display device further comprising a window unit which is disposed on the display unit, wherein the window unit comprises a light shielding pattern overlapping the adjacent area.

In an exemplary embodiment, wherein the display unit comprises wirings overlapping the adjacent area, and the first connection wiring overlaps at least two of the wirings.

In an exemplary embodiment, wherein the display unit comprises: a base layer; and a plurality of dams which are formed adjacent to the first hole, wherein each of the dams forms a closed loop along edges of the first hole, and the first connection wiring overlaps at least one of the dams.

In an exemplary embodiment, wherein the display unit further comprises a groove formed between the dams, wherein the groove is inversely tapered.

According to another exemplary embodiment of the present application, a display device comprising: a substrate which comprises a display area, a non-display area disposed along edges of the display area, and a first hole formed in the display area; a circuit element layer which is disposed on the substrate and comprises a transistor; a display element layer which is disposed on the circuit element layer, overlaps the display area, and comprises a light emitting element electrically connected to the transistor; a thin-film encapsulation layer which is disposed on the display element layer; and an input sensing layer which is disposed on the thin-film encapsulation layer and comprises detection electrodes overlapping the display area and a connection wiring electrically connecting detection electrodes separated from each other by the first hole among the detection electrodes, wherein the connection wiring is located adjacent to the first hole.

In an exemplary embodiment, wherein the detection electrodes comprise a metal conductive layer of a metal mesh pattern, a portion of the connection wiring which overlaps one of the detection electrodes is a metal mesh pattern, and the detection electrodes do not overlap the light emitting element.

In an exemplary embodiment, wherein the detection electrodes comprise sensing electrodes arranged in a first direction and connected to each other and driving electrodes arranged in a second direction perpendicular to the first direction and connected to each other, wherein a first driving electrode and a second driving electrode spaced apart from each other by the second hole among the driving electrodes are electrically connected by the connection wiring.

In an exemplary embodiment, wherein the detection electrodes further comprise first connection parts which electrically connect the sensing electrodes to each other, wherein a first sensing electrode and a second sensing electrode disposed adjacent to the second hole among the sensing electrodes are electrically connected to each other by a first adjacent connection part among the first connection parts, and the first adjacent connection part is located on a first reference boundary line set based on the second hole.

In an exemplary embodiment, wherein the first connection parts are located on one imaginary line, and the first adjacent connection part is located at an intersection point of the imaginary line and the first reference boundary line.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

FIG. 5 is a cross-sectional view illustrating an example of the input sensing panel taken along line B-B' of FIG. 4A;

DETAILED DESCRIPTION

Figure 1:
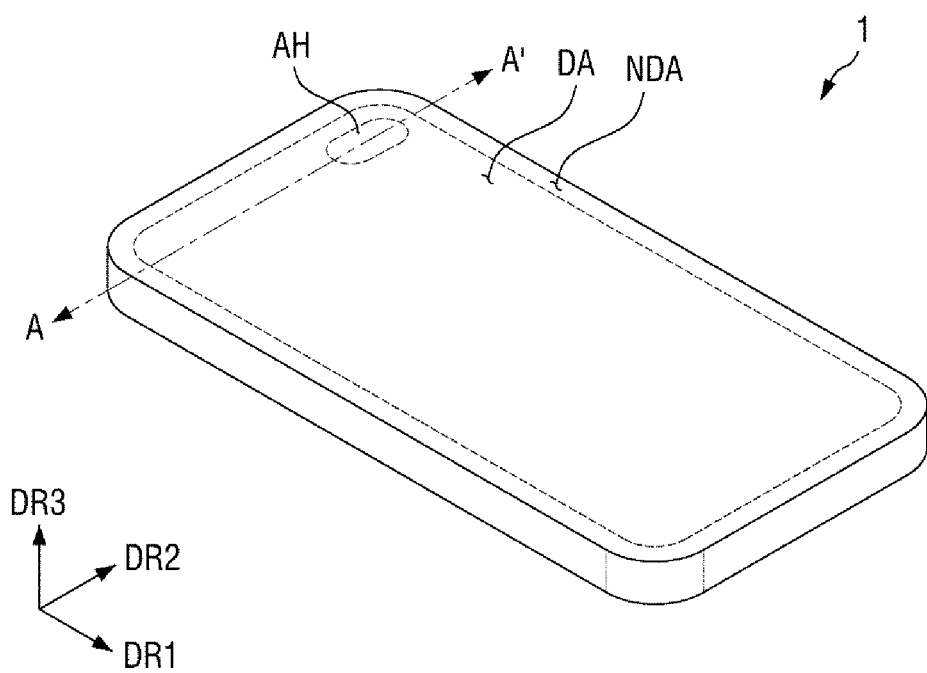
FIG. 1 is a perspective view of a display device according to an embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the x, y, and z-axes, and may be interpreted in a broader sense. For example, the DR1-axis, the DR2-axis, and the DR3-axis may be perpendicular to one another, or may represent different directions that are not perpendicular one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a perspective view of a display device according to an embodiment.

Referring to FIG. 1, a display device 1 may display an image on a display surface (or a front surface). The display surface may be parallel to a plane defined by a first directional axis (i.e., an axis extending in a first direction DR1) and a second directional axis (i.e., an axis extending in a second direction DR2). A normal direction of the display surface, that is, a thickness direction of the display device 1 may be defined as a third direction DR3.

The front surface (or upper surface) and back surface (or lower surface) of each member or unit to be described below may be distinguished along the third direction DR3. However, the first, second, and third directions DR1, DR2, and DR3 illustrated in the current embodiment are merely an example. The first, second, and third directions DR1, DR2, and DR3 are relative concepts and can be changed to other directions. The first, second, and third directions will hereinafter be indicated by the same reference numerals.

The display device 1 may include a flat display surface, but the present disclosure is not limited to this case. For example, the display device 1 may also include a curved display surface or a stereoscopic display surface. The stereoscopic display surface may include a plurality of display areas indicating different directions and include, e.g., a polygonal columnar display surface.

The display device 1 may be a rigid display device. However, the present disclosure is not limited to this case. For example, the display device 1 may be a flexible display device. In FIG. 1, the display device 1 applicable to a mobile phone terminal is illustrated as an example. Although not illustrated in FIG. 1, electronic modules, a camera module, a power module, etc. mounted on a mainboard may be placed in a bracket/case together with the display device 1 to form a mobile phone terminal. The display device 1 is applicable to large-sized electronic devices such as televisions and monitors as well as to small and medium-sized electronic devices such as tablet computers, car navigation systems, game machines and smart watches.

The display surface includes a display area DA where an image is displayed and a non-display area NDA adjacent to the display area DA. The non-display area NDA is an area where no image is displayed.

The display area DA may be quadrilateral in shape and have rounded corners. The non-display area NDA may surround the display area DA. However, the present disclosure is not limited to this case, and the shape of the display area DA and the shape of the non-display area NDA may be relatively designed.

In embodiments, the display device 1 may include a hole AH (or an internal groove) formed in the display area DA. As will be described later with reference to FIG. 2, the hole AH may penetrate a display panel and an input sensing unit (or an input sensing panel) included in the display device 1 along the third direction DR3. At a position corresponding to the hole AH, sensors such as a camera device and an infrared sensor may be disposed on a bottom side (e.g., on a lower surface opposite the display surface) of the display device 1.

In FIG. 1, the hole AH has a quadrilateral planar shape with rounded corners. However, this is merely an example, and the planar shape of the hole AH is not limited to this example. For example, the hole AH may have a circular, quadrilateral, or polygonal planar shape. The display device 1 may also include a plurality of holes formed in the display area DA.

As described with reference to FIG. 1, the display device 1 may include the hole AH formed in the display area DA. Thus, the display device 1 can have a minimized dead space as compared with a display device having sensors disposed on one side (e.g., in the non-display area NDA).

Figure 2A:
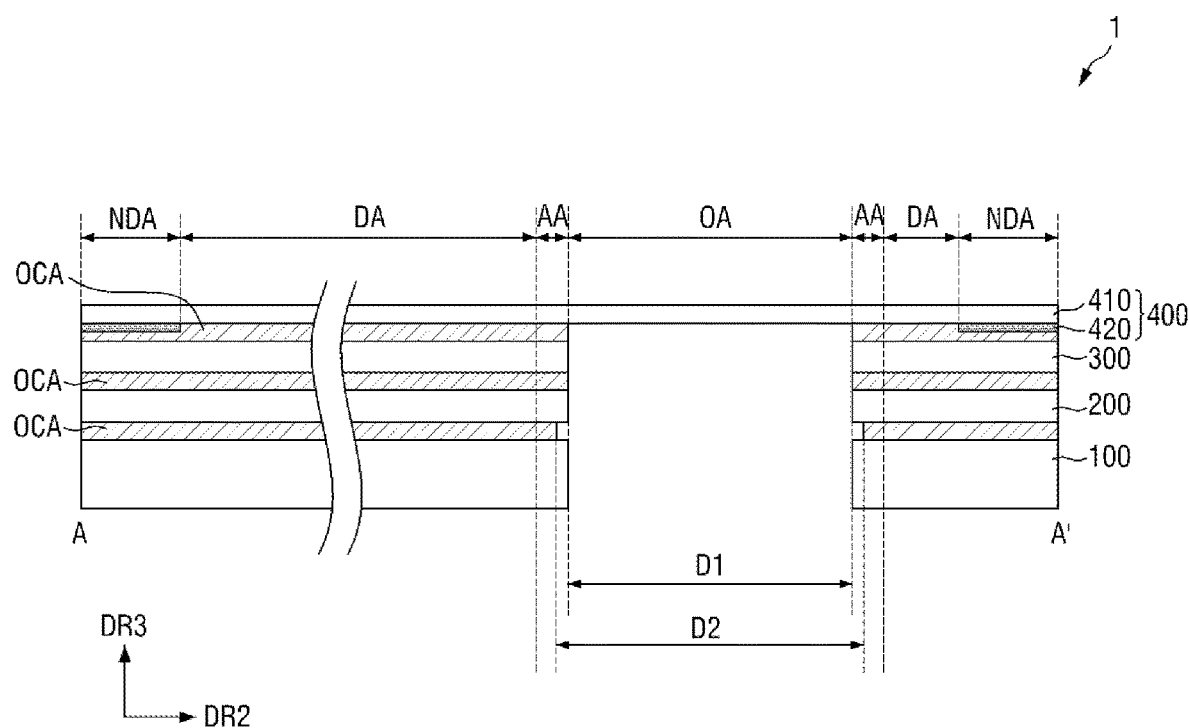
FIGS. 2A and 2B are cross-sectional views illustrating examples of the display device taken along line A-A' of FIG. 1.
Figure 2B:
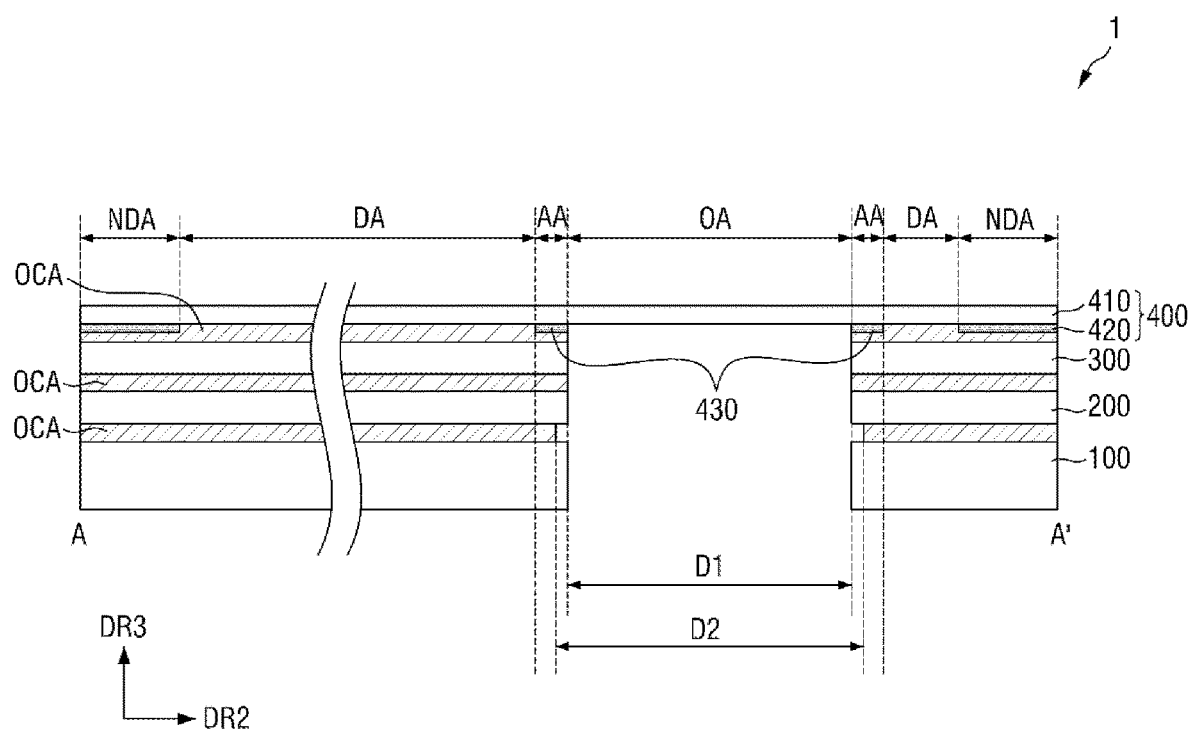

FIGS. 2A and 2B are cross-sectional views illustrating examples of the display device taken along line A-A' of FIG. 1.

Referring to FIG. 2A, FIG. 2A illustrates a cross section defined by the second directional axis DR2 and the third directional axis DR3, and FIG. 2A schematically illustrates the stacked relationship of functional panels and/or functional units constituting the display device 1.

The display device 1 may include a display panel, an input sensing unit, an antireflection unit, and a window unit. At least some of the display panel, the input sensing unit, the antireflection unit and the window unit may be formed by a continuous process or may be bonded to each other by an adhesive member. Although an optically clear adhesive member OCA is illustrated in FIG. 2A as an example of the adhesive member, this is merely an example. The adhesive member to be described below may include a conventional adhesive or gluing agent. In an embodiment of the present disclosure, the antireflection unit and the window unit may be replaced with other units or may be omitted.

Of the input sensing unit, the antireflection unit and the window unit, a unit formed with another unit through a continuous process is expressed as a "layer". Of the input sensing unit, the antireflection unit and the window unit, a unit bonded to another unit by an adhesive member is expressed as a "panel". The panel includes a base layer that provides a base surface, such as a synthetic resin film, a composite film, or a glass substrate. However, the "layer" may not include the base layer. That is, units expressed as "layers" may be disposed on a base surface provided by another unit.

The input sensing unit, the antireflection unit, and the window unit may be referred to as an input sensing panel 200, an antireflection panel 300 and a window panel 400 or as an input sensing layer, an antireflection layer and a window layer depending on the presence or absence of the base layer.

Referring to FIG. 2A, the display device 1 may include a display panel 100, the input sensing panel 200, the antireflection panel 300, and the window panel 400.

The input sensing panel 200 may be disposed on the display panel 100, and the optically clear adhesive member OCA may be disposed between the display panel 100 and the input sensing panel 200. Similarly, the antireflection panel 300 may be disposed on the input sensing panel 200, and the optically clear adhesive member OCA may be disposed between the input sensing panel 200 and the antireflection panel 300. The window panel 400 may be disposed on the antireflection panel 300, and the optically clear adhesive member OCA may be disposed between the antireflection panel 300 and the window panel 400. The order in which the input sensing panel 200 and the antireflection panel 300 are stacked can be changed.

The hole AH of the display device 1 may penetrate the display panel 100, the input sensing panel 200 and the antireflection panel 300. A camera device, an infrared sensor, etc. may be disposed on the lower surface of the display device 1 at a position corresponding to a hole area OA (i.e., an area where the hole AH is located).

Each of the display panel 100, the input sensing panel 200 and the antireflection panel 300 may include a hole (or a through hole or an opening) corresponding to the hole AH. Similarly, the optically clear adhesive member OCA disposed between the display panel 100 and the input sensing panel 200 may include a hole. The size of the hole of the optically clear adhesive member OCA disposed between the display panel 100 and the input sensing panel 200 may be larger than that of the hole AH. For example, a width D2 (or diameter) of the hole of the optically clear adhesive member OCA may be greater than a width D1 of the hole AH (or the hole area OA). Similarly, the optically clear adhesive member OCA disposed between the input sensing panel 200 and the antireflection panel 300 may also include a hole, and the size of the hole of the optically clear adhesive member OCA disposed between the input sensing panel 200 and the antireflection panel 300 may be equal to or larger than that of the hole AH.

The window panel 400 may not include a hole and may cover the hole area OA.

The display panel 100 may generate an image. The display panel 100 may be, but is not limited to, a light emitting display panel. For example, the display panel 100 may be an organic light emitting display panel or a quantum dot light emitting display panel. A light emitting layer of the organic light emitting display panel may include an organic light emitting material. A light emitting layer of the quantum dot light emitting display panel may include quantum dots, quantum rods, etc. The display panel 100 will hereinafter be described as the organic light emitting display panel.

The input sensing panel 200 may obtain coordinate information of an external input (e.g., a touch event). The input sensing panel 200 may be a touch sensing panel that senses a user's touch or a fingerprint sensing panel that senses fingerprint information of a user's finger. The pitch and width of detection electrodes to be described below (i.e., detection electrodes included in the input sensing panel 200) may be changed according to the use of the input sensing unit. Detection electrodes of the touch sensing panel may have a width of several mm to tens of mm, and detection electrodes of the fingerprint sensing panel may have a width of tens of μm to hundreds of μm. The input sensing panel 200 will hereinafter be described as the touch sensing panel.

The antireflection panel 300 may reduce reflectance of external light incident from above the window panel 400.

In an embodiment, the antireflection panel 300 may include a retarder and a polarizer. The retarder may be of a film type or a liquid crystal coating type and may include a λ/2 retarder and/or a λ/4 retarder. The polarizer may also be of a film type or a liquid crystal coating type. The film type may include a stretch-type synthetic resin film, and the liquid crystal coating type may include liquid crystals arranged in a predetermined arrangement. Each of the retarder and the polarizer may further include a protective film. The retarder and the polarizer themselves or the protective films may be defined as a base layer of the antireflection panel 300.

In an embodiment, the antireflection panel 300 may include color filters. The color filters may have a predetermined arrangement. The arrangement of the color filters may be determined in consideration of emission colors of pixels included in the display panel 100. The antireflection panel 300 may further include a black matric adjacent to the color filters.

The window panel 400 may include a base film 410 and a first light shielding pattern 420. The base film 410 may include a glass substrate and/or a synthetic resin film. The base film 410 may be a single layer. However, the present disclosure is not limited to this case, and the base film 410 may also include two or more films bonded to each other by an adhesive member.

The first light shielding pattern 420 may partially overlap the base film 410. As illustrated in FIG. 2A, the first light shielding pattern 420 may overlap edges of the base film 410 and may be disposed on a back surface of the base film 410 to define a bezel area (e.g., the non-display area NDA) of the display device 1. The first light shielding pattern 420 may be a colored organic layer and may be formed by, e.g., a coating method.

In an embodiment, the window panel 400 may further include a second light shielding pattern 430. Referring to FIG. 2B, the second light shielding pattern 430 may overlap an adjacent area AA of the display device 1 and may be disposed on the back surface of the base film 410. Here, the adjacent area AA may be defined as an area disposed along edges of the hole area OA within the display area DA. The adjacent area AA may have a generally uniform width along the edges of the hole area OA. As will be described later, no image is displayed and no input is sensed in the adjacent area AA. Accordingly, the adjacent area AA may be classified as the non-display area NDA. The second light shielding pattern 430 may be made of a colored organic layer, like the first light shielding pattern 420.

Although not illustrated separately, the window panel 400 may further include a functional coating layer disposed on a front surface of the base film 410. The functional coating layer may include an anti-fingerprint layer, antireflection layer, and a hard coating layer.

Although the input sensing panel 200 overlaps the whole of the display panel 100 in FIGS. 2A and 2B, the present disclosure is not limited to this case. For example, the input sensing panel 200 may overlap only a part of the display area DA of the display panel 100 or may overlap only the non-display area NDA.

Figure 3:
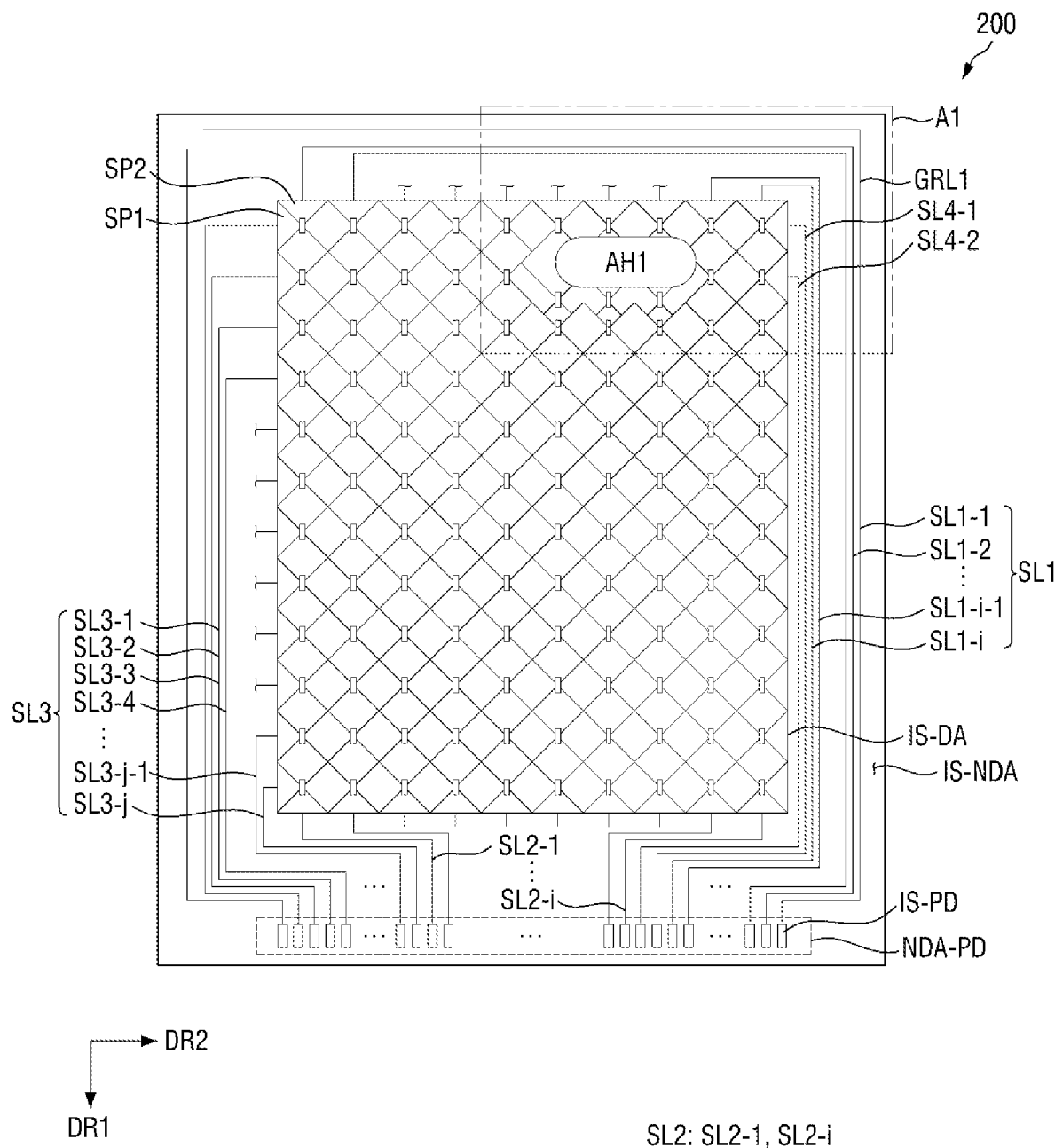
FIG. 3 is a plan view illustrating an example of an input sensing panel included in the display device of FIG. 2.
Figure 4A:
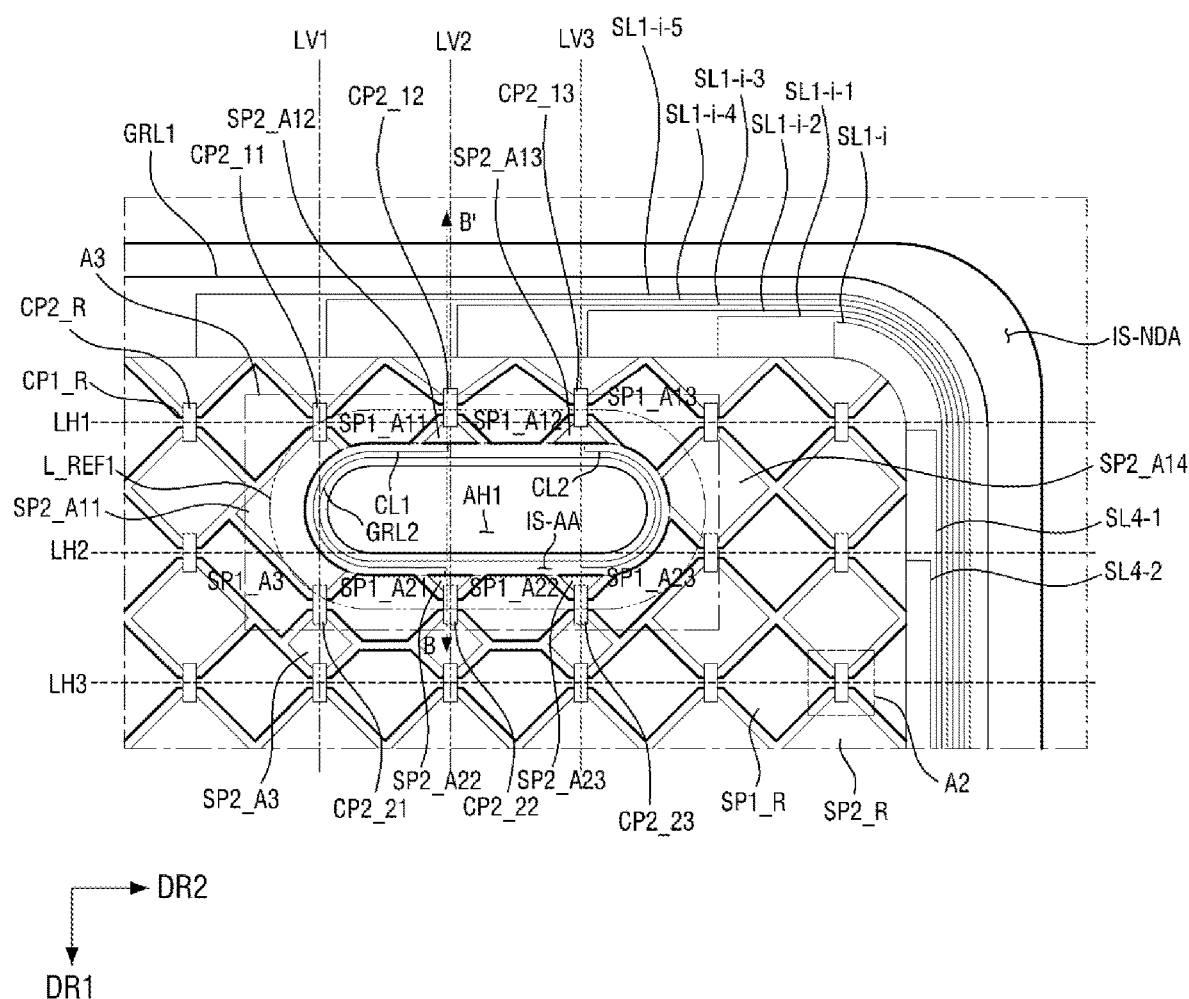
FIGS. 4A, 4B, and 4C are enlarged views illustrating an example of a first area of FIG. 3.
Figure 4B:
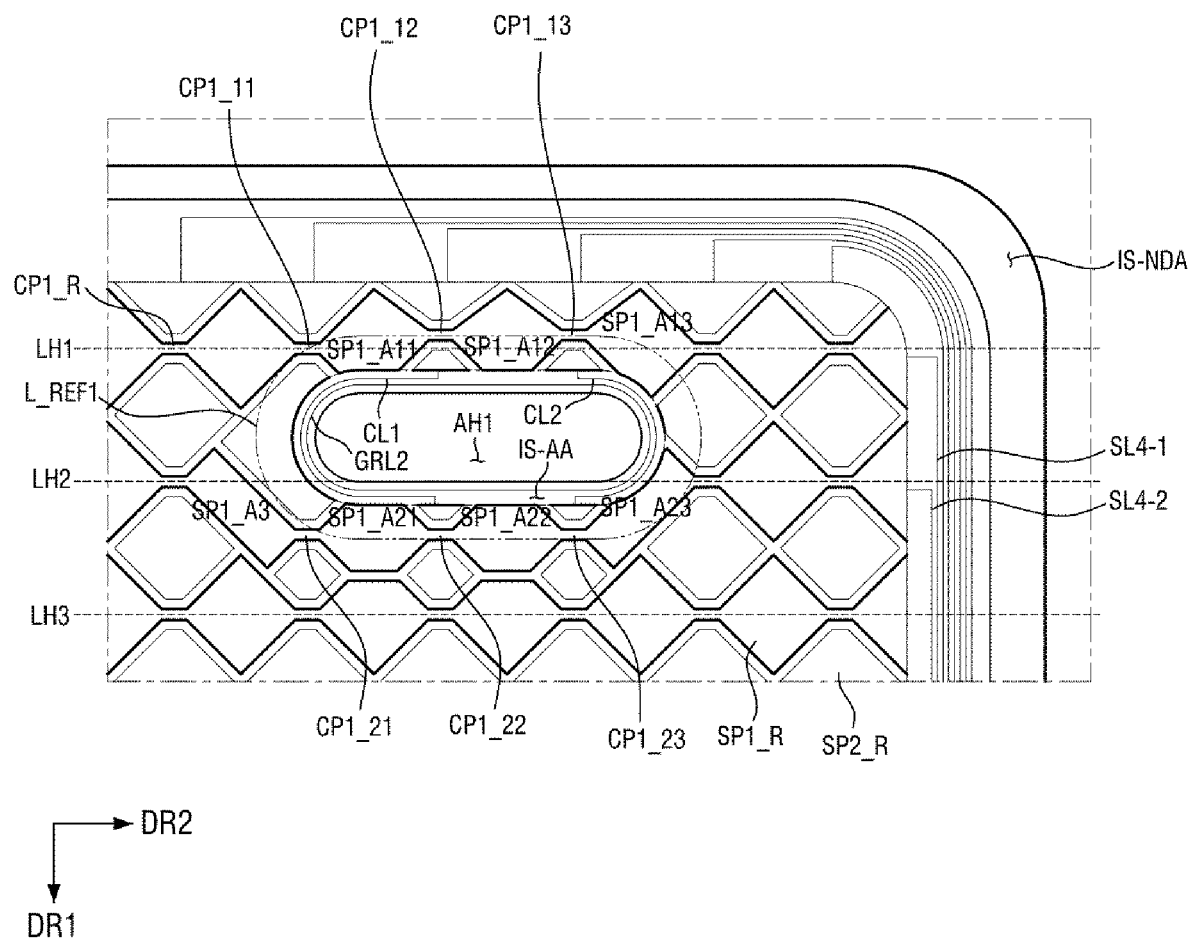
Figure 4C:
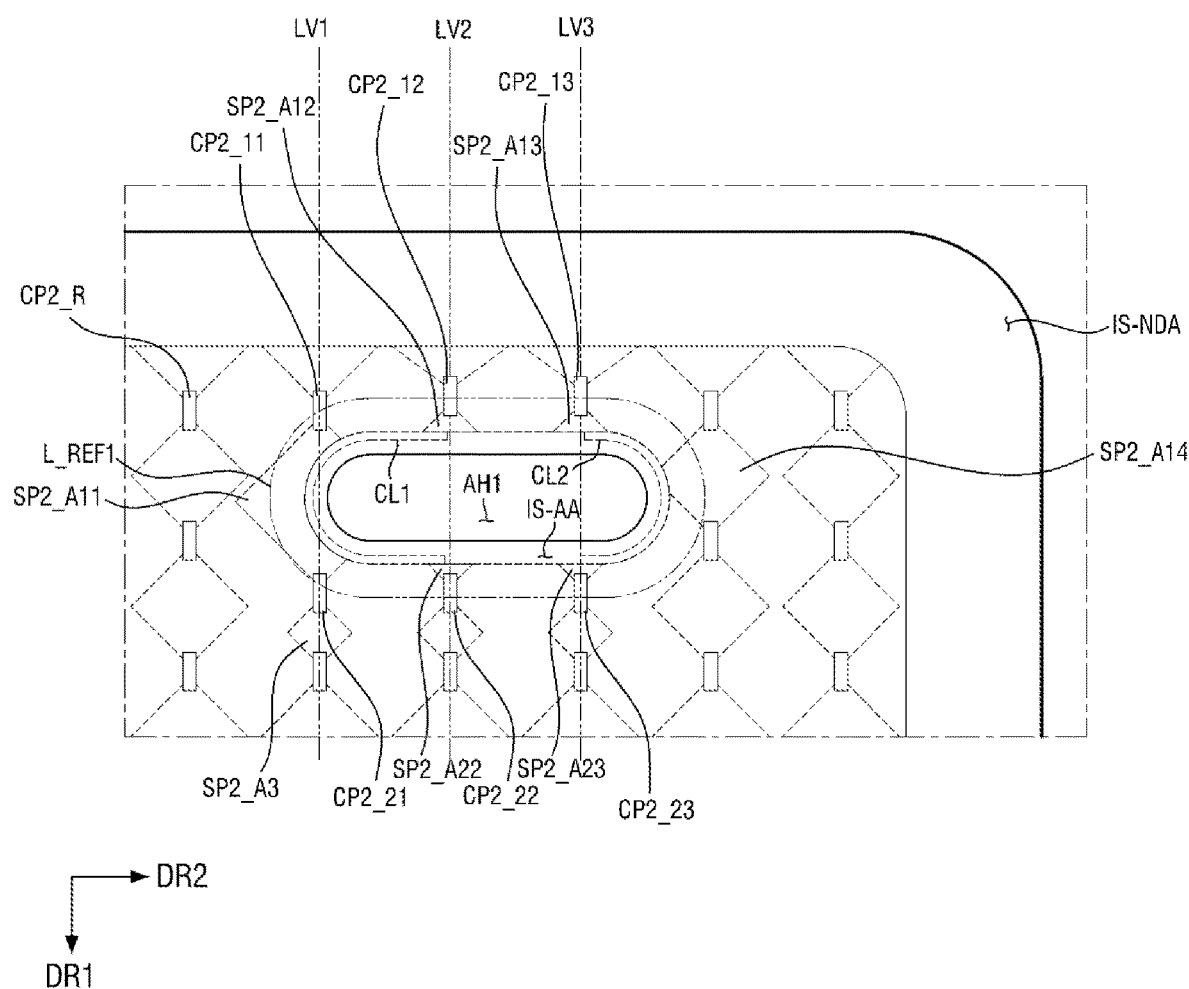
Figure 6:
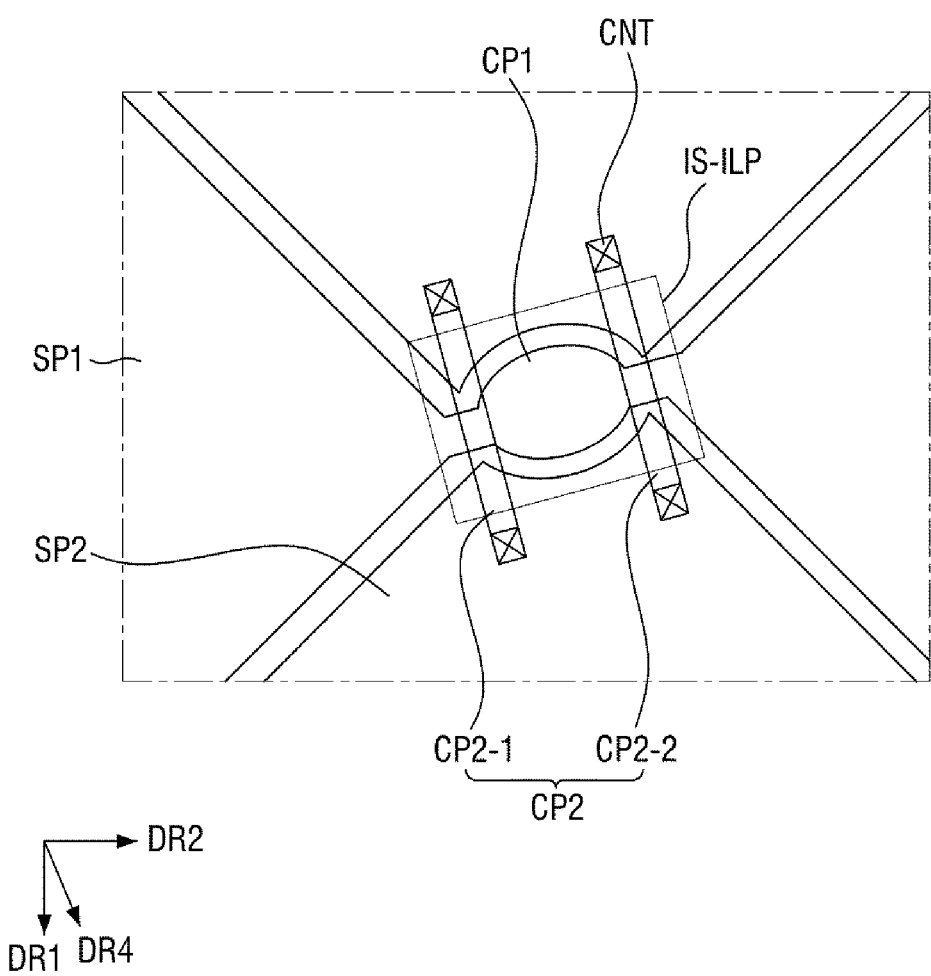
FIG. 6 is an enlarged view illustrating an example of area A2 of FIG. 4A.

FIG. 3 is a plan view illustrating an example of the input sensing panel included in the display device of FIG. 2. FIGS. 4A, 4B, and 4C are enlarged views illustrating an example of a first area of FIG. 3. FIG. 4B illustrates a first conductive layer included in the input sensing panel 200, and FIG. 4C illustrates a second conductive layer included in the input sensing panel 200. FIG. 5 is a cross-sectional view illustrating an example of the input sensing panel taken along line B-B' of FIG. 4A. FIG. 6 is an enlarged view illustrating an example of area A2 of FIG. 4A.

Referring to FIGS. 3, 4A, 4B, 4C, 5, and 6, the input sensing panel 200 may have a multilayer structure. The input sensing panel 200 includes detection electrodes, signal lines connected to the detection electrodes, and at least one insulating layer. The input sensing panel 200 may sense an external input using, e.g., a capacitive method. The operation method of the input sensing panel 200 is not particularly limited, and the input sensing panel 200 may also sense an external input using an electromagnetic induction method or a pressure sensing method.

Referring to FIG. 5, the input sensing panel 200 may include a base layer 210 (or a first base layer), a first conductive layer 220, a first insulating layer 230, a second conductive layer 240, and a second insulating layer 250.

Each of the first conductive layer 220 and the second conductive layer 240 may have a single layer structure or may have a multilayer structure stacked along the third direction DR3. A conductive layer having a single layer structure may include a transparent conductive layer. The transparent conductive layer may include a transparent conductive oxide such as indium tin oxide (ITO), indium zinc oxide (IZO), zinc oxide (ZnO), or indium tin zinc oxide (ITZO). Alternatively, the transparent conductive layer may include a conductive polymer such as PEDOT, metal nanowires, graphene, etc. However, the present disclosure is not limited to this case, and the conductive layer may also include a metal layer. The metal layer may include molybdenum, silver, titanium, copper, aluminum, and an alloy of the same. In addition, a conductive layer having a multilayer structure may include multiple metal layers. The metal layers may form, for example, a three-layer structure of titanium/aluminum/titanium. The conductive layer having the multilayer structure may also include at least one metal layer and at least one transparent conductive layer.

The stacked structure and material of the detection electrodes may be determined in consideration of sensing sensitivity. Detection electrodes including a transparent conductive layer are not visible to a user as compared with detection electrodes including a metal layer and increase an input area, thereby increasing capacitance. Resistive-capacitive (RC) delay can affect sensing sensitivity. Since the resistance of the detection electrodes including the metal layer is smaller than that of the detection electrodes including the transparent conductive layer, an RC value is reduced. Therefore, the charging time of a capacitor defined between the detection electrodes may be reduced.

As will be described later with reference to FIGS. 26, 27A, 27B, 28, 29, 30, 31, 32, and 33, the detection electrodes including the metal layer may have a mesh shape. In this case, the metal layer may not be visible to a user.

Each of the first insulting layer 230 and the second insulating layer 250 may have a single layer structure or a multilayer structure. Each of the first insulating layer 230 and the second insulating layer 250 may include an inorganic material, an organic material, or a composite material.

At least any one of the first insulating layer 230 and the second insulating layer 250 may include an inorganic layer. The inorganic layer may include at least one of aluminum oxide, titanium oxide, silicon oxide, silicon oxynitride, zirconium oxide, and hafnium oxide.

At least any one of the first insulating layer 230 and the second insulating layer 250 may include an organic layer. The organic layer may include at least any one of acrylic resin, methacrylic resin, polyisoprene, vinyl resin, epoxy resin, urethane resin, cellulose resin, siloxane resin, polyimide resin, polyamide resin, and perylene resin.

Referring to FIG. 3, the input sensing panel 200 may include first detection electrodes (or sensing electrodes), second detection electrodes (or driving electrodes), first signal lines SL1, second signal lines SL2, third signal lines SL3 and fourth signal lines SL4-1 and SL4-2. In addition, the input sensing panel 200 may include first pads IS-PD (or sensing pads) disposed in a first pad area NDA-PD.

The first detection electrodes and the second detection electrodes may be disposed in a sensing area IS-DA. Here, the sensing area IS-DA may correspond to the display area DA and overlap the display area DA.

The first detection electrodes may extend in the second direction DR2 and may be repeatedly arranged along the first direction DR1. The second detection electrodes may extend in the first direction DR1 and may be repeatedly arranged along the second direction DR2. The first detection electrodes may transmit a sensing signal, and the second detection electrodes may transmit a detection signal.

The first detection electrodes and the second detection electrodes intersect each other. In this case, the input sensing panel 200 may sense an external input using a mutual cap method and/or a self-cap method. The input sensing panel 200 may calculate coordinates of an external input using the mutual cap method during a first period and then recalculate the coordinates of the external input using the self-cap method during a second period.

Each of the first detection electrodes includes first sensor parts SP1 (or sensing electrodes) and first connection parts CP1 (see FIG. 4B). Similarly, each of the second detection electrodes includes second sensor parts SP2 (or driving electrodes) and second connection parts CP2 (see FIGS. 4A and 4C).

In one first detection electrode, the first sensor parts SP1 may be arranged along the second direction DR2 and may be connected to each other by the first connection parts CP1. In one second detection electrode, the second sensor parts SP2 may be arranged along the first direction DR1 and may be connected to each other by the second connection parts CP2.

The first signal lines SL1, the second signal lines SL2, the third signal lines SL3 and the fourth signal lines SL4-1 and SL4-2 may be disposed in a non-sensing area IS-NDA. Here, the non-sensing area IS-NDA may correspond to the non-display area NDA and overlap the non-display area NDA.

The first signal lines SL1 may extend from some of the first pads IS-PD of the first pad area NDA-PD along the non-sensing area IS-NDA located on a side (e.g., a right side) of the input sensing panel 200 and may be connected to ends of the second detection electrodes. The first signal lines SL1 may include first through $i^{th}$ driving signal lines SL1-1 through SL1-$i$ (where i is an integer equal to or greater than 2), and the first through $i^{th}$ driving signal lines SL1-1 through SL1-$i$ may be electrically connected to the ends of the second detection electrodes, respectively.

Similarly, the second signal lines SL2 may extend from some other ones of the first pads IS-PD of the first pad area NDA-PD to a side (e.g., a lower side) of the sensing area IS-DA and may be electrically connected to the other ends of the second detection electrodes. The second signal lines SL2 may include first through $i^{th}$ detection signal lines SL2-1 through SL2-$i$, and the first through $i^{th}$ detection signal lines SL2-1 through SL2-$i$ may be electrically connected to the other ends of the second detection electrodes, respectively.

The third signal lines SL3 may extend from some other ones of the first pads IS-PD of the first pad area NDA-PD along the non-sensing area IS-NDA located on the other side (e.g., a left side) of the input sensing panel 200 and may be electrically connected to ends of the first detection electrodes. The third signal lines SL3 may include first through $j^{th}$ sensing signal lines SL3-1 through SL3-$j$ (where j is an integer equal to or greater than 2), and the first through $j^{th}$ sensing signal lines SL3-1 through SL3-$j$ may be electrically connected to the ends of the first detection electrodes.

The fourth signal lines SL4-1 and SL4-2 may extend from some other ones of the first pads IS-PD of the first pad area NDA-PD along the non-sensing area IS-NDA located on a side (e.g., the left side) of the input sensing panel 200 and may be connected to the other ends of some of the first detection electrodes, respectively. Here, the some of the first detection electrodes may be detection electrodes including first adjacent sensor parts SP1_A11, SP1_A12, SP1_A13, SP1_A21, SP1_A22 and SP1_A23 (see FIG. 4A) disposed adjacent to a first hole AH1.

The input sensing panel 200 including the fourth signal lines SL4-1 and SL4-2 can have improved sensing sensitivity as compared with an input sensing panel including the third signal lines SL3-1 through SL3$j$. The first adjacent sensor parts SP1_A11, SP1_A12, SP1_A13, SP1_A21, SP1_A22 and SP1_A23 around the first hole AH1 are generally smaller than the first sensor parts spaced apart from the first hole AH1, and no sensor parts are disposed in an area corresponding to the first hole AH1. In this case, a sensing signal (or a reception signal) may be dropped or attenuated, leading to a reduction in sensing sensitivity. The input sensing panel 200 transmits a sensing signal not only through the third signal lines SL3-1 through SL3-*j* connected to the ends of the first detection electrodes but also through the fourth signal lines SL4-1 and SL4-2 connected to the other ends of the first detection electrodes adjacent to the first hole AH1 (that is, transmits a sensing signal through both ends of some detection electrodes where a sensing signal drop can occur), thereby preventing or reducing the drop of the sensing signal and the resultant reduction of the sensing sensitivity.

The arrangement and connection relationship of the first sensor parts SP1 and the arrangement and connection relationship of the second sensor parts SP2 will be described with reference to FIGS. 4A, 4B, and 4C.

Referring to FIG. 4A, the first sensor parts SP1 may include first reference sensor parts SP1_R and the first adjacent sensor parts SP1_A11, SP1_A12, SP1_A13, SP1_A21, SP1_A22 and SP1_A23. The first reference sensor parts SP1_R refer to sensor parts spaced apart from the first hole AH1 by a specific distance (e.g., the average size of the first sensor parts SP1) or more among the first sensor parts SP1. The first adjacent sensor parts SP1_A11, SP1_A12, SP1_A13, SP1_A21, SP1_A22 and SP1_A23 may be sensor parts adjacent to the first hole AH1 among the first sensor parts SP1.

The first adjacent sensor parts SP1_A11, SP1_A12, SP1_A13, SP1_A21, SP1_A22 and SP1_A23 may have a different planar shape from the first reference sensor part SP1_R. In addition, the first adjacent sensor parts SP1_A11, SP1_A12, SP1_A13, SP1_A21, SP1_A22 and SP1_A23 may have different shapes from each other and may be partially curved. Further, the first adjacent sensor parts SP1_A11, SP1_A12, SP1_A13, SP1_A21, SP1_A22 and SP_A23 may have a size (or area) different from the size (or area) of the first sensor parts SP1.

Referring to FIG. 4B, a (1,1) first adjacent sensor part SP1_A11 may be shaped as a rhombus having a corner (e.g., a corner adjacent to the first hole AH1) partially cut off so as to correspond to the shape of the first hole AH1. A side of the (1,1) first adjacent sensor part SP1_A11 may be spaced apart from an edge of the first hole AH1 by a uniform distance and may include a curved portion corresponding to the shape of the first hole AH1. In addition, the (1,1) first adjacent sensor part SP1_A11 may have a size (or area) smaller than the size (or area) of the first reference sensor parts SP1_R. a (1,2) first adjacent sensor part SP1_A12 may have a pentagonal planar shape, may not include a curved portion, and may have a relatively small size. (1,3), (2,1), (2,2), and (2,3) first adjacent sensor parts SP1_A13, SP1_A21, SP1_A22, and SP1_A23 may have different planar shapes, may or may not include a curved portion, and may have different sizes.

At least one corner of each of the first adjacent sensor parts SP1_A11, SP1_A12, SP1_A13, SP1_A21, SP1_A22 and SP1_A23 may be located on a first reference boundary line L_REF1. Here, the first reference boundary line L_REF1 may be a closed loop line spaced apart from the first hole AH1 by a specific distance (e.g., by 20% to 50% of the length of the first reference sensor parts SP1_R).

The first adjacent sensor parts SP1_A11, SP1_A12, SP1_A13, SP1_A21, SP1_A22 and SP1_A23 may be connected to adjacent first sensor parts by first adjacent connection parts CP1_11, CP1_12, CP1_13, CP1_21, CP1_22, and CP1_23, respectively. The first adjacent connection parts CP1_11, CP1_12, CP1_13, CP1_21, CP1_22, and CP1_23 may be spaced apart from the first hole AH1 by a specific distance and may be located on the first reference boundary line L_REF1 as illustrated in FIG. 4B.

For reference, the first sensor parts SP1 (or the first reference sensor parts SP1 having the same size and the same shape without being affected by the first hole AH1) may be repeatedly disposed along the first direction DR1 and the second direction DR2. Accordingly, the first connection parts CP1 (or first reference connection parts CP1_R) connecting the first sensor parts SP1 may be disposed in intersection areas of horizontal reference lines LH1, LH2, and LH3 and vertical reference lines LV1, LV2, and LV3.

However, when the intersection areas (or intersection points) of the horizontal reference lines LH1, LH2, and LH3 and the vertical reference lines LV1, LV2, and LV3 are located inside the first hole AH1 or adjacent to the first hole AH1, the first adjacent connection parts CP1_11, CP1_12, CP1_12, CP1_13, CP1_21, CP1_22, and CP1_23 may be formed in the intersection areas and connect the first adjacent sensor parts SP1_A11, SP1_A12, SP1_A13, SP1_A21, SP1_A22 and SP1_A23 to adjacent first sensor parts, respectively.

Therefore, as illustrated in FIG. 4B, a first detection electrode including the first adjacent sensor parts SP1_A11, SP1_A12, and SP1_A13 (i.e., a detection electrode corresponding to a first horizontal reference line LH1) may bypass the first hole AH1. Similarly, a second detection electrode including the second adjacent sensor parts SP1_A21 through SP1_A23 (i.e., a detection electrode corresponding to a second horizontal reference line LH2) may bypass the first hole AH1.

Referring again to FIG. 4A, the second sensor parts SP2 may include second reference sensor parts SP2_R and second adjacent sensor parts SP2_A11, SP2_A12, SP2_A13, SP2_A14, SP2_A22, and SP2_A23. Like the first reference sensor parts SP1_R, the second reference sensor parts SP2_R may refer to sensor parts spaced apart from the first hole AH1 by a specific distance (e.g., the average size of the second sensor parts SP2) or more among the second sensor parts SP2. The second adjacent sensor parts SP2_A11, SP2_A12, SP2_A13, SP2_A14, SP2_A22, and SP2_A23 may be sensor parts adjacent to the first hole AH1 among the second sensor parts SP2.

The second adjacent sensor parts SP2_A11, SP2_A12, SP2_A13, SP2_A14, SP2_A22, and SP2_A23 may have a different planar shape from the second reference sensor part SP2_R, may be partially curved, and may have a size (or area) different from the size (or area) of the second reference sensor parts SP2. The planar shape and size of the second adjacent sensor parts SP2_A11, SP2_A12, SP2_A13, SP2_A14, SP2_A22, and SP2_A23 are illustrated by way of example in FIG. 4A and have similar features to those of the first adjacent sensor parts SP1_A11, SP1_A12, SP1_A13, SP1_A21, SP1_A22 and SP1_A23. Thus, a redundant description will now be repeated.

At least one corner of each of the second adjacent sensor parts SP2_A11, SP2_A12, SP2_A13, SP2_A14, SP2_A22, and SP2_A23 may be located on the first reference boundary line L_REF1. The second adjacent sensor parts SP2_A11, SP2_A12, SP2_A13, SP2_A14, SP2_A22, and SP2_A23 may be connected to adjacent first sensor parts by second adjacent connection parts CP2_11, CP2_12, CP2_13 CP2_21, CP2_22, and CP2_23.

Referring to FIG. 4C, the second adjacent connection parts CP2_11, CP2_12, CP2_13 CP2_21, CP2_22, and CP2_23 may be spaced apart from the first hole AH1 by a specific distance and may be located on the first reference boundary line L_REF1. The second adjacent connection parts CP2_11, CP2_12, CP2_13 CP2_21, CP2_22, and CP2_23 may be located on a different plane (or different layer) from the first adjacent connection parts CP1_11, CP1_12, CP1_12, CP1_13, CP1_21, CP1_22, and CP1_23 and may overlap the first adjacent connection parts CP1_11, CP1_12, CP1_12, CP1_13, CP1_21, CP1_22, and CP1_23, respectively.

As illustrated in FIG. 4C, the second adjacent connection parts CP2_11, CP2_12, CP2_13 CP2_21, CP2_22, and CP2_23 may be disposed in intersection areas of the vertical reference lines LV1, LV2, and LV3 and the first reference boundary line L_REF1, but the present disclosure is not limited to this case.

Although the first sensor parts SP1 and the second sensor parts SP2 have a generally rhombic planar shape in FIG. 3, the present disclosure is not limited to this case. For example, the first sensor parts SP1 and the second sensor parts SP2 may also have a circular or other polygonal shape. In addition, the first detection electrodes and the second detection electrodes including the first sensor parts SP1 and the second sensor parts SP2 may have a shape (e.g., a bar shape) in which there is no distinction between sensor parts and connection parts.

In embodiments, the input sensing panel 200 may further include first and second connection wirings CL1 and CL2 (see FIG. 4A) (or first and second connection patterns) connecting the second sensor parts SP2 adjacent to the first hole AH1, that is, the second adjacent sensor parts SP2_A12, SP2_A13, SP2_A22, and SP2_A23.

The first hole AH1 may have a quadrilateral planar shape with rounded corners. The length of the first hole AH1 in the second direction DR2 may be greater than the length of the first hole AH1 in the first direction DR1. For example, the length of the first hole AH1 in the first direction DR1 may be similar to the length of the first reference sensor parts SP1_R (or the second reference sensor parts SP2_R), and the length of the first hole AH1 in the second direction DR1 may be about twice the length of the first hole AH1 in the first direction DR1.

In this case, at least one second detection electrode disposed adjacent to the first hole AH1 or intersecting the first hole AH1 may be separated by the first hole AH1. That is, some of the second sensor parts SP2 constituting the second detection electrode may be spaced apart from each other by the first hole AH1. The connection wirings CL1 and CL2 may electrically connect the second sensor parts SP2 spaced apart from each other by the first hole AH1.

The connection wirings CL1 and CL2 may be formed in the same plane (or layer) as the first sensor parts SP1, the second sensor parts SP2, etc. and may be disposed in an adjacent area IS-AA located adjacent to the first hole AH1. The width of the adjacent area IS-AA may be determined by the size of the first hole AH1. For example, the width of the adjacent area IS-AA may increase as the size of the first hole AH1 increases and decrease as the size of the first hole AH1 decreases, but may be saturated at a specific value.

The first connection wiring CL1 may extend along a side (e.g., the left side) of the adjacent area IS-AA and may electrically connect a (1,2) second adjacent driving sensor part SP2_A12 (or a twelfth driving sensor part) and a (2,2) second adjacent driving sensor part SP2_A22 (or a twenty-second driving sensor part). Similarly, the second connection wiring CL2 may extend along the other side (e.g., the right side) of the adjacent area IS-AA and electrically connect a (1,3) second adjacent driving sensor part SP2_A13 (or a thirteenth driving sensor part) and a (2,3) second adjacent driving sensor part SP2_A23 (or a twenty-third driving sensor part).

Therefore, as illustrated in FIG. 4C, a second detection electrode including the (1,2) second adjacent driving sensor part SP2_A12 and the (2, 3) second adjacent driving sensor part SP2_A22 (i.e., a detection electrode corresponding to a second vertical reference line LV2) may bypass the first hole AH1. Similarly, a second detection electrode including the (1,3) second adjacent driving sensor part SP2_A13 and the (2,3) second adjacent driving sensor part SP2_A23 (i.e., a detection electrode corresponding to a third vertical reference line LV3) may bypass the first hole AH1.

In embodiments, the first and second connection wirings CL1 and CL2 may have a specific line width. For example, the line width of the first and second connection wirings CL1 and CL2 may be greater than the line width (e.g., several μm) of the signal wirings SL1 through SL4 illustrated in FIG. 4A. The line width of the first and second connection wirings CL1 and CL2 will be described later with reference to FIGS. 8A and 8B.

The first and second connection wirings CL1 and CL2 may be arranged along relatively short paths and may not overlap each other. However, the present disclosure is not limited to this case. For example, the first and second connection wirings CL1 and CL2 may be disposed along the same side with respect to the center of the area of the first hole AH1 and may overlap each other or may be adjacent to each other. This will be described later with reference to FIG. 8B.

The input sensing panel 200 may further include a second guard wiring GRL2. The second guard wiring GRL2 may be disposed closer to the first hole AH1 than the connection wirings CL1 and CL2 in the adjacent area IS-AA, that is, may be disposed closest to the first hole AH1 among the wirings disposed in the adjacent area AA. The second guard wiring GRL2 may protect other wirings (e.g., the connection wirings CL1 and CL2) and the sensor parts SP1 and SP2 from the shock transmitted from the first hole AH1, the static electricity flowing from the first hole AH1, etc.

As described above with reference to FIGS. 4A, 4B, and 4C, the first adjacent sensor parts SP1_A11, SP1_A12, SP1_A13, SP1_A21, SP1_A22 and SP1_A23 disposed adjacent to the first hole AH1 may be electrically connected to each other by the first adjacent connection parts CP1_11, CP1_12, CP1_12, CP1_13, CP1_21, CP1_22, and CP1_23 disposed on the first reference boundary line L_REF1 (i.e., a closed loop line spaced apart from an edge of the first hole AH1 by a specific distance). In addition, the second adjacent sensor parts SP2_A11, SP2_A12, SP2_A13, SP2_A14, SP2_A22, and SP2_A23 disposed adjacent to or contacting the first hole AH1 may be electrically connected to each other by the connection wirings CL1 and CL2 disposed in the adjacent area IS-AA.

As described above, a drop of a sensing signal (or a reception signal) due to a change (e.g., a reduction) in the shape, size, or area of the first adjacent sensor parts SP1_A11, SP1_A12, SP1_A13, SP1_A21, SP1_A22 and SP1_A23 may be compensated by the fourth signal lines SL4-1 and SL4-2.

The stacked structure of the input sensing panel 200 will now be described in more detail.

Referring to FIG. 5, the first conductive layer 220 includes the first sensor parts SP1, the second sensor parts SP2, and the first connection parts CP1. The second sensor parts SP2 may be spaced apart from the first connection parts CP1 (or the first sensor parts SP1).

The first conductive layer 220 may further include the first signal lines SL1, the first connection wiring CL1 (and the second connection wiring CL2), and the second guard wiring GRL2. In addition, the first conductive layer 220 may include the second signal lines SL2 (see FIG. 3), the third signal lines SL3 (see FIG. 3) and the fourth signal lines SL4-1 and SL4-2 (see FIG. 3) formed by the same process as the first signal lines SL1 and may include the first pads IS-PD (see FIG. 3).

The first sensor parts SP1, the second sensor parts SP2 and the first connection parts CP1 may be formed by the same process. The first sensor parts SP1, the second sensor parts SP2 and the first connection parts CP1 may include the same material and may have the same stacked structure.

The first insulating layer 230 covers at least a portion of each of the first sensor parts SP1, the second sensor parts SP2 and the first connection parts CP1. In addition, the first insulating layer 230 may cover the first signal lines SL1, the first connection wiring CL1 (and the second connection wiring CL2), and the second guard wiring GRL2. The first insulating layer 230 may overlap at least a portion of each of the sensing area IS-DA and the non-sensing area IS-NDA.

The first insulating layer 230 may include first insulating patterns IS-ILP, and the first insulating patterns IS-ILP may overlap the first sensor parts SP1 and the second sensor parts SP2 and may cover the first connection parts CP1. Referring to FIG. 6, a first insulating pattern IS-ILP may have an area center corresponding to an area center of a first connection part CP1, may be large enough to cover the first connection part CP1, and may cover adjacent corners of first sensor parts SP1 and second sensor parts SP2. The first insulating pattern IS-ILP (and the second insulating layer 250 to be described later) may fill a gap between the first sensor parts SP1 and the second sensor parts SP2 spaced apart from each other. Accordingly, the first sensor parts SP1 and the second sensor parts SP2 may be insulated from each other. Similarly, sensor parts included in different detection electrodes may be insulated by the second insulating layer 250 to be described later.

Referring again to FIG. 5, the second conductive layer 240 includes the second connection parts CP2. The second connection parts CP2 are electrically connected to the second sensor parts SP2 through contact holes CNT. The second connection parts CP2 may include a material having a resistance lower than that of the second sensor parts SP2. For example, the second connection parts CP2 may include the same metal material as the first signal lines SL1.

In embodiments, each of the second connection parts CP2 may include a plurality of sub-connection parts.

Referring to FIG. 6, each of the second connection parts CP2 may include sub-connection parts CP2-1 and CP2-2.

A second connection part CP2 may intersect a first connection part CP1. The width of the second connection part CP2 (i.e., the width in plan view) should be minimized in order to reduce the influence of parasitic capacitance. In this case, a signal (e.g., a transmission signal) may be greatly dropped according to a reduction in the width of the second connection part CP2. Therefore, the second connection part CP2 may include a plurality of sub-connection parts CP2-1 and CP2-2 connected in parallel to each other, thereby preventing or reducing the drop of a signal (e.g., a transmission signal). The sub-connection parts CP2-1 and CP2-2 may extend in a fourth direction DR4 different from the first direction DR1 and the second direction DR2 and may connect adjacent second sensor parts SP2.

Depending on the placement of the second connection part CP2, corners (or most adjacent portions) of the second sensor parts SP2 (and the first sensor parts SP1) may be misaligned with the same horizontal reference line (i.e., a line extending in the second direction DR2) (or a vertical reference line extending in the first direction DR1).

Like the second connection part CP2, the width of the first connection part CP1 overlapping the second connection part CP2 may be minimized. As illustrated in FIG. 6, the width of an overlap portion of the first connection part CP1 (i.e., a portion overlapping the second connection part CP2) may be smaller than the average width of the first connection part CP1.

Referring again to FIG. 5, the second insulating layer 250 may be disposed on the second conductive layer 240 and cover elements disposed under the second insulating layer 250. At least a portion of the second insulating layer 250 may contact the base layer 210, for example, may directly contact the base layer 210 at a boundary with the first hole AH1 to insulate sensor parts (e.g., the second sensor parts SP2) included in different detection electrodes adjacent to each other. In addition, the second insulating layer 2500 may directly contact the base layer 210 at an outermost boundary of the non-display area IS-NDA.

The first insulating layer 230 may be a polymer layer, for example, an acrylic polymer layer. The second insulating layer 250 may also be a polymer layer, for example, an acrylic polymer layer. The polymer layer can improve the flexibility of the display device 1 even when the input sensing panel 200 is disposed on the display panel 100. In order to improve flexibility, the first sensor parts SP1 and the second sensor parts SP2 may have a mesh shape and include a metal. The first sensor parts SP1 and the second sensor parts SP2 may be referred to as metal mesh patterns.

Although not illustrated in FIG. 5, the connection wirings CL1 may be disposed not only in the first conductive layer 220 but also in the second conductive layer 240, like a connection wiring to be described later with reference to FIG. 27A. In this case, a signal drop due to the connection wirings CL1 can be reduced, and a reduction in sensing sensitivity can be reduced.

As described with reference to FIGS. 3, 4A, 4B, 5, and 6, the input sensing panel 200 may include the first hole AH1 (i.e., the first hole AH1 formed to correspond to the hole AH of the display device 1 in which a sensor such as a camera device is disposed), and the first adjacent sensor parts SP1_A11, SP1_A12, SP1_A13, SP1_A21, SP1_A22 and SP1_A23 which interfere with the first hole AH1 may be connected to each other along the first reference boundary line L_REF1 (i.e., a closed loop line spaced apart from an edge of the first hole AH1 by a specific distance). In addition, the second adjacent sensor parts SP2_A12, SP2_A13, SP2_A22, and SP2_A23 which interfere with the first hole AH1 and are spaced apart from each other may be electrically connected to each other by the connection wirings CL1 and CL2 disposed in the adjacent area AA.

Therefore, while the display device 1 includes the hole AH in the display area DA, it can sense an external input (e.g., a user's touch input) through the entire display area DA surrounding the hole AH.

In addition, since the input sensing device 200 provides double routing (or multipathing) for first detection electrodes including first sensor parts adjacent to the first hole AH1 (i.e., first detection electrodes interfering with the first hole AH1) through the fourth signal lines SL4-1 and SL4-2, the drop of a sensing signal and the reduction of sensing sensitivity can be reduced or prevented.

Further, since the connection wirings CP1 and CP2 and the fourth signal lines SL4-1 and SL4-2 electrically connecting the second adjacent sensor parts SP2_A12, SP2_A13, SP2_A22, and SP2_A23 are formed using the same material and the same process as the first through third signal wirings SL1 through SL3, the display device 1 can be manufactured without an additional manufacturing process or an additional manufacturing cost.

Figure 7A:
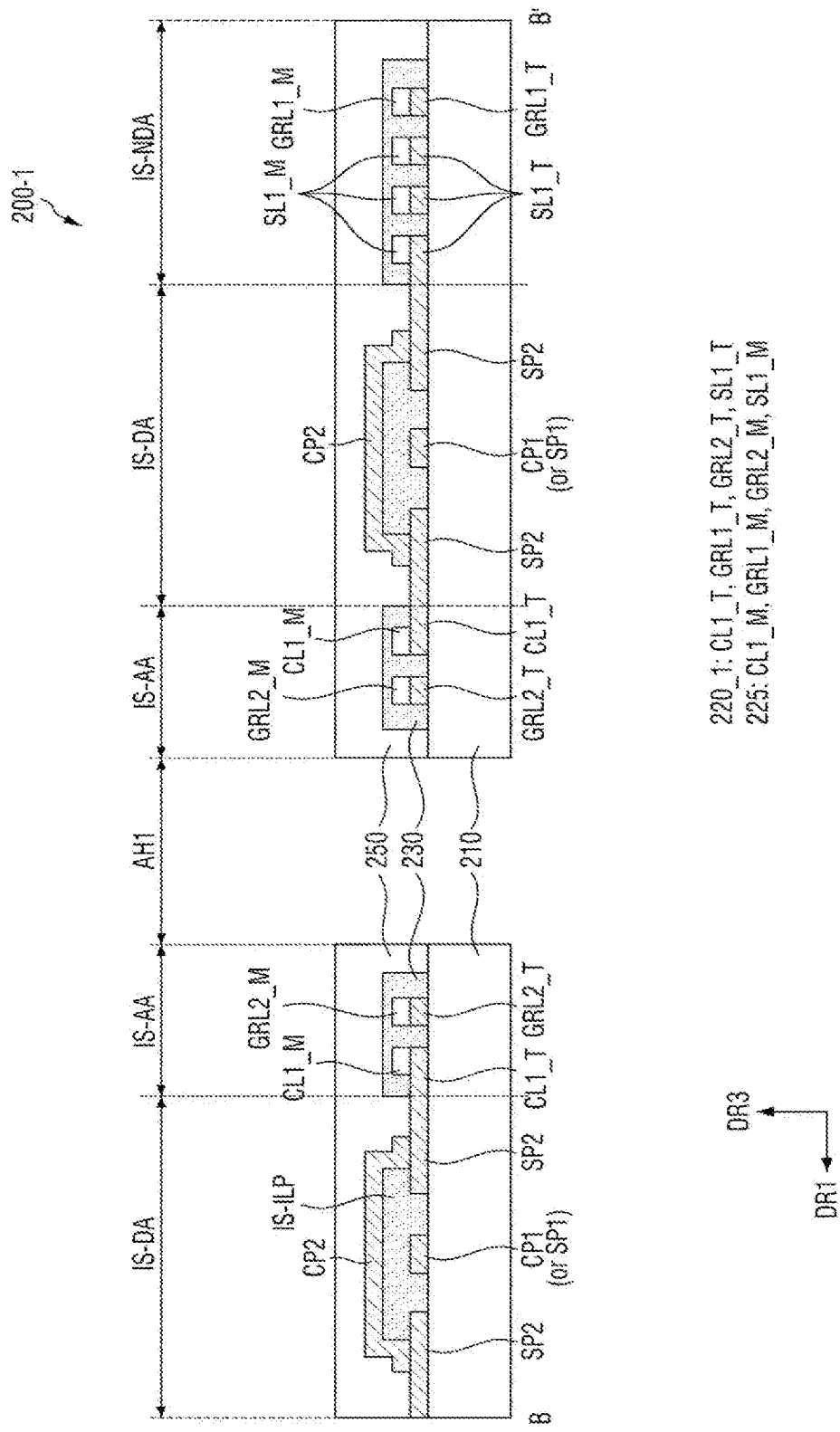
FIGS. 7A and 7B are cross-sectional views illustrating other examples of the input sensing panel taken along the line B-B' of FIG. 4A.
Figure 7B:
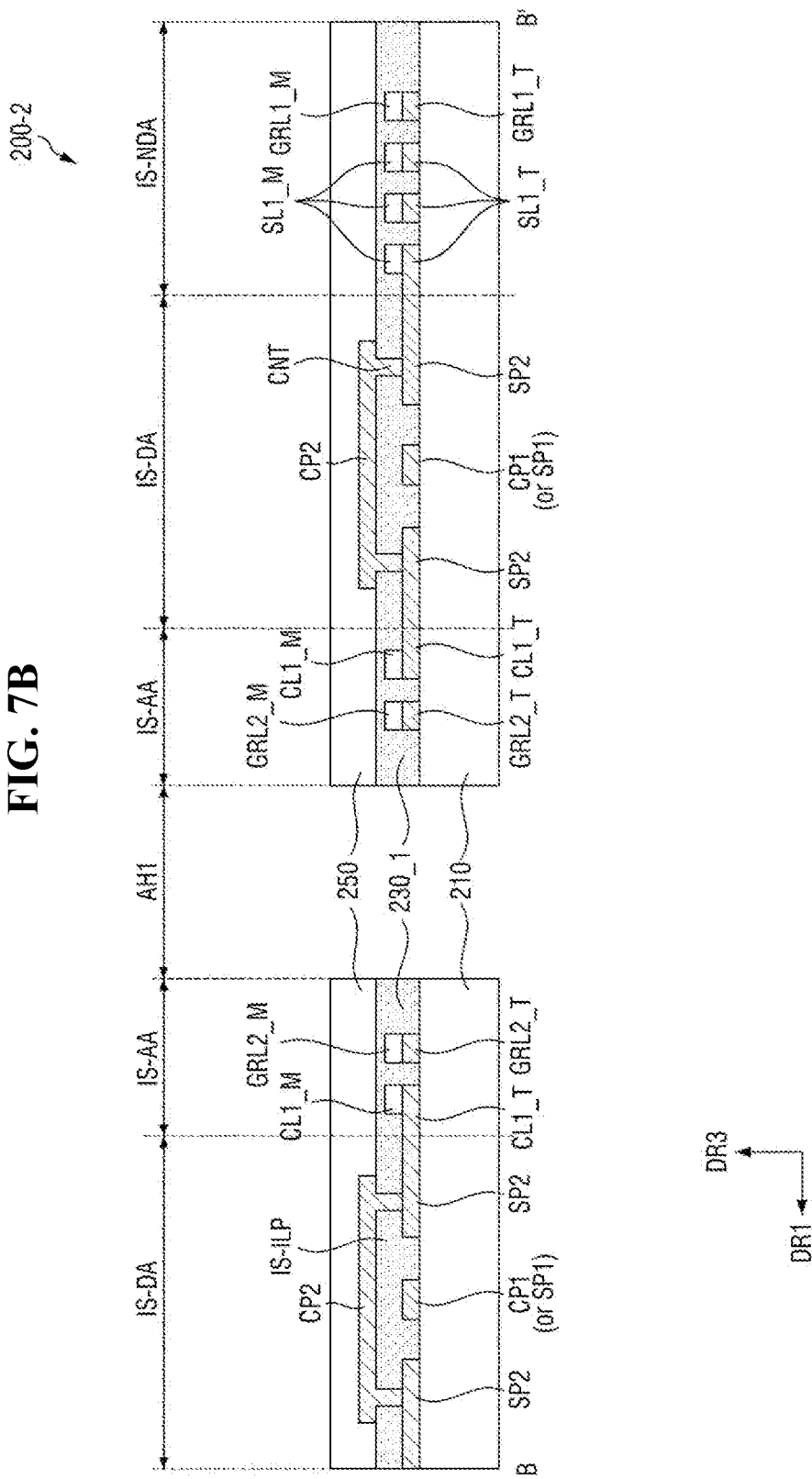

FIGS. 7A and 7B are cross-sectional views illustrating other examples of the input sensing panel taken along the line B-B' of FIG. 4A. In FIGS. 7A and 7B, cross sections of the input sensing panel 200 corresponding to FIG. 6 are illustrated.

Referring to FIGS. 3, 4A, 4B, 5, 6, and 7A, an input sensing panel 200_1 is substantially the same or similar to the input sensing panel 200 described with reference to FIGS. 3, 4A, 4B, 5, and through 6 except for a metal layer 225, and thus a redundant description will not be repeated.

The metal layer 225 may include first metal patterns SL1_M, a second metal pattern CL1_M, a third metal pattern GRL1_M, and a fourth metal pattern GRL_M. The metal layer 225 may include molybdenum, silver, titanium, copper, aluminum, and an alloy of the same.

Signal lines SL1 may include a first transparent conductive layer SL1_T and the first metal patterns M disposed directly on the first transparent conductive patterns SL1_T.

Similarly, a first connection wiring CL1 may include a second transparent conductive pattern CL1_T and the second metal pattern CL1_M, and first and second guard wirings GRL1 and GRL2 may include third and fourth transparent conductive patterns GRL1_T and GRL2_T and the third and fourth metal patterns GRL1_M and GRL2_M.

Second sensor parts SP2 and first connection parts CP1 (and first sensor parts SP1) may include transparent conductive patterns, but may not include metal patterns.

The transparent conductive patterns and the metal patterns may be formed by sequentially forming a preliminary transparent conductive layer and a preliminary metal layer which cover a first conductive layer 220_1 and sequentially patterning the preliminary metal layer and the preliminary conductive layer.

In this case, the electrical conductivity of the signal lines SL1 and the first connection wiring CL1 can be improved, the drop of a sensing signal can be prevented or reduced, and the sensing sensitivity can be improved.

Referring to FIGS. 7A and 7B, an input sensing panel 200_2 is substantially the same or similar to the input sensing panel 200_1 described with reference to FIG. 7A except for a first insulating layer 230_1, and thus a redundant description will not be repeated.

The first insulating layer 230_1 may overlap at least a portion of each of a sensing area IS-DA and a non-sensing area IS-NDA. The first insulating layer 230_1 may generally cover a base layer 210, and a boundary portion of the base layer 210 may be exposed by the first insulating layer 230. For example, the first insulating layer 230_1 may not overlap an outermost boundary of the base layer 210 in the non-display area IS-NDA and may not overlap an inner boundary of the base layer 210, which is closest to a first hole AH1, in an adjacent area IS-AA.

Contact holes CNT that partially expose second sensor parts SP2 may be formed in the first insulating layer 230_1. In this case, a second conductive layer 240 (or second connection parts CP2) may be connected to the second sensor parts SP2 through the contact holes CNT and may electrically connect the second sensor parts SP2 to each other.

Figure 8A:
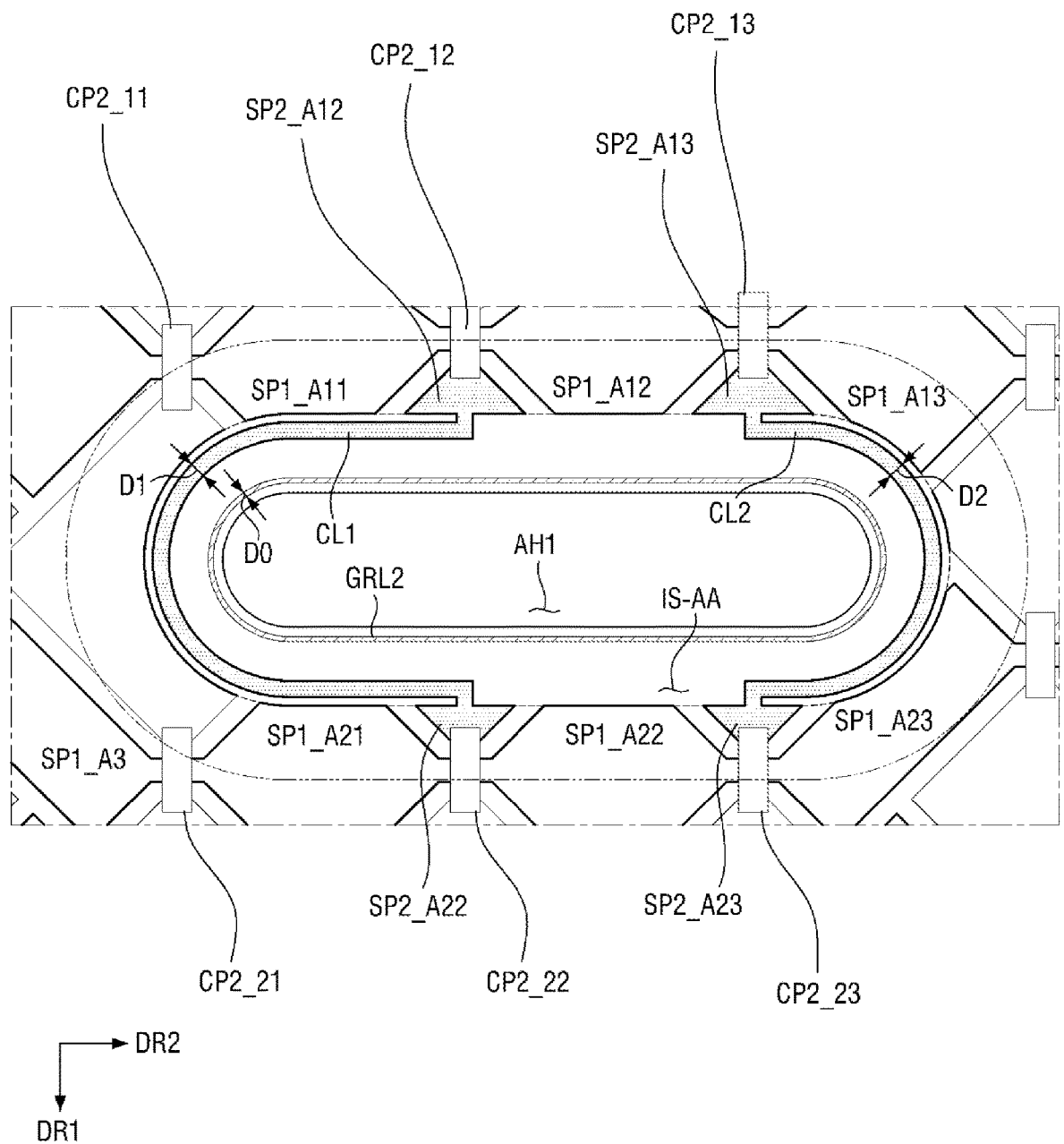
FIGS. 8A and 8B are enlarged views of area A3 of FIG. 4A.
Figure 8B:
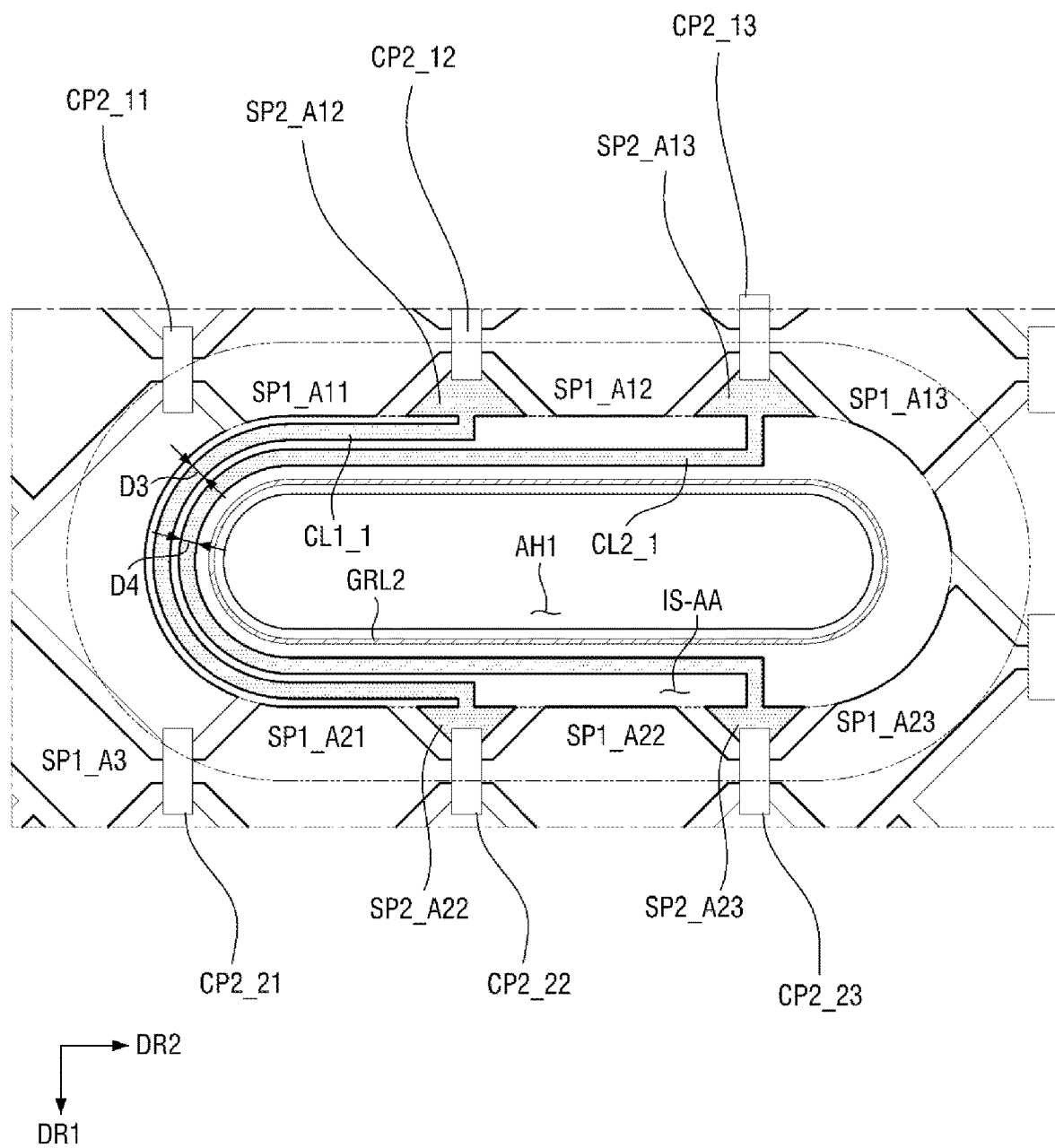

FIGS. 8A and 8B are enlarged views of area A3 of FIG. 4A. That is, enlarged views of the adjacent area IS-AA around the first hole AH1 are illustrated in FIGS. 8A and 8B.

Referring to FIG. 8A, the first connection wiring CL1 may be connected to the (1,2) second adjacent driving sensor part SP2_A12 and the (2,2) second adjacent driving sensor part SP2_A22. For example, the first connection wiring CL1 may be formed integrally with the (1,2) second adjacent driving sensor part SP2_A12 and the (2,2) second adjacent driving sensor part SP2_A22. For another example, when the first connection wiring CL1 includes the second transparent conductive pattern CL1_T and the second metal pattern CL1_M as described above with reference to FIG. 7A, the second transparent conductive pattern CL1_T may be formed integrally with the (1,2) second adjacent driving sensor part SP2_A12 and the (2,2) second adjacent driving sensor part SP2_A22, and the second metal pattern CL1_M may be formed on the second transparent conductive pattern CL_T in the adjacent area IS-AA.

A first line width D1 of the first connection wiring CL1 may be greater than a reference line width D0 of the second guard wiring GRL2. Here, the reference line width D0 of the second guard wiring GRL2 may be similar to the line width of the signal wirings SL1 through SL4 illustrated in FIG. 4A, for example, may be several μm.

As the first line width D1 of the first connection wiring 1 increases, the resistance of a second detection electrode including the first connection wiring CL1 decreases. This prevents or limits reduction of sensing sensitivity but increases the width of the adjacent area IS-NDA. Therefore, the first line width D1 of the first connection wiring CL1 may be 4 to 10 times the reference line width D0, for example, may be tens of μm.

Like the first connection wiring CL1, the second connection wiring CL2 may be connected to the (1,3) second adjacent driving sensor part SP2_A13 and the (2,3) second adjacent driving sensor part SP2_A23.

A second line width D2 of the second connection wiring CL2 may be greater than the reference line width D0 of the second guard wiring GRL2. Like the first connection wiring CL1, the second line width D2 of the second connection wiring CL2 may be 4 to 10 times the reference line width D0, for example, may be tens of μm.

In an embodiment, the second line width D2 of the second connection wiring CL2 may be different from the first line width D1 of the first connection wiring CL1.

For example, as illustrated in FIG. 8A, when the length of the second connection wiring CL2 in the adjacent area IS-AA is smaller than the length of the first connection wiring CL1, the second line width D2 of the second connection wiring CL2 may be smaller than the first line width D1 of the first connection wiring CL1. That is, the second line width D2 of the second connection wiring CL2 may be proportional to the length of the second connection wiring CL2. Similarly, the first line width D1 of the first connection wiring CL1 may be proportional to the length of the first connection wiring CL1.

Referring to FIG. 8B, a second connection wiring CL2_1 may pass through a portion of an adjacent area IS-AA in which a first connection wiring CL1_1 is disposed. In this case, the length of the second connection wiring CL2_1 may be greater than that of the first connection wiring CL1_1, and a fourth line width D4 of the second connection wiring CL2_1 may be greater than a third line width D3 of the first connection wiring CL1.

In FIG. 8B, a gap between the first connection wiring CL1_1 and the second connection wiring CL2_1 is smaller than the third line width D3 of the first connection wiring CL1_1 (or the fourth line width D4 of the second connection wiring CL2_1). However, this is merely an example of the third line width D3 of the first connection wiring CL1_1 and the line width D4 of the second connection wiring CL2_1, and the present disclosure is not limited to this example.

Figure 9:
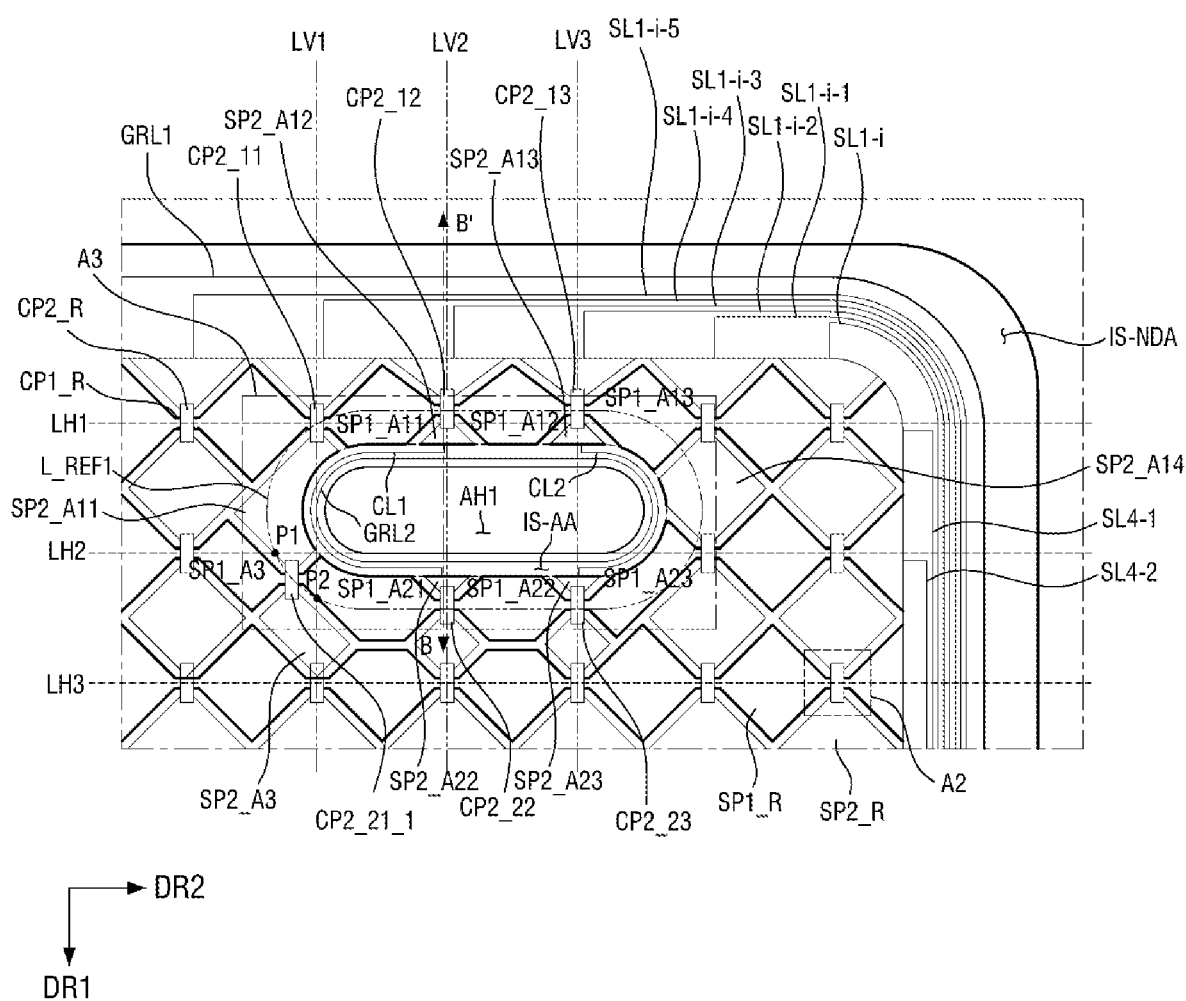
FIG. 9 is an enlarged view of another example of the area A1 of FIG. 3.

FIG. 9 is an enlarged view of another example of the area A1 of FIG. 3.

Referring to FIGS. 3, 4A, and 9, an input sensing panel 200 of FIG. 9 may be substantially the same as the input sensing panel 200 of FIG. 4A except for a (2,1) second adjacent connection part CP2_21_1.

The (2,1) second adjacent connection part CP2_21_1 may be located on a first reference boundary line L_REF1 and located between a first point P1 and a second point P2. Here, the first point P1 may be a point at which a second horizontal reference line LH2 corresponding to the (2,1) second adjacent connection part CP2_21_1 intersects the first reference boundary line L_REF1, and the second point P2 may be a point at which a first vertical reference line LV1 corresponding to the (2,1) second adjacent connection part CP2_21_1 intersects the first reference boundary line L_REF1. The shapes and sizes of adjacent first sensor parts (e.g., a (1,3) first sensor part SP1_A13 and a (2,1) first sensor part SP1_A21) may be determined or varied according to the position of the (2,1) second adjacent connection part CP2_21_1.

Figure 10:
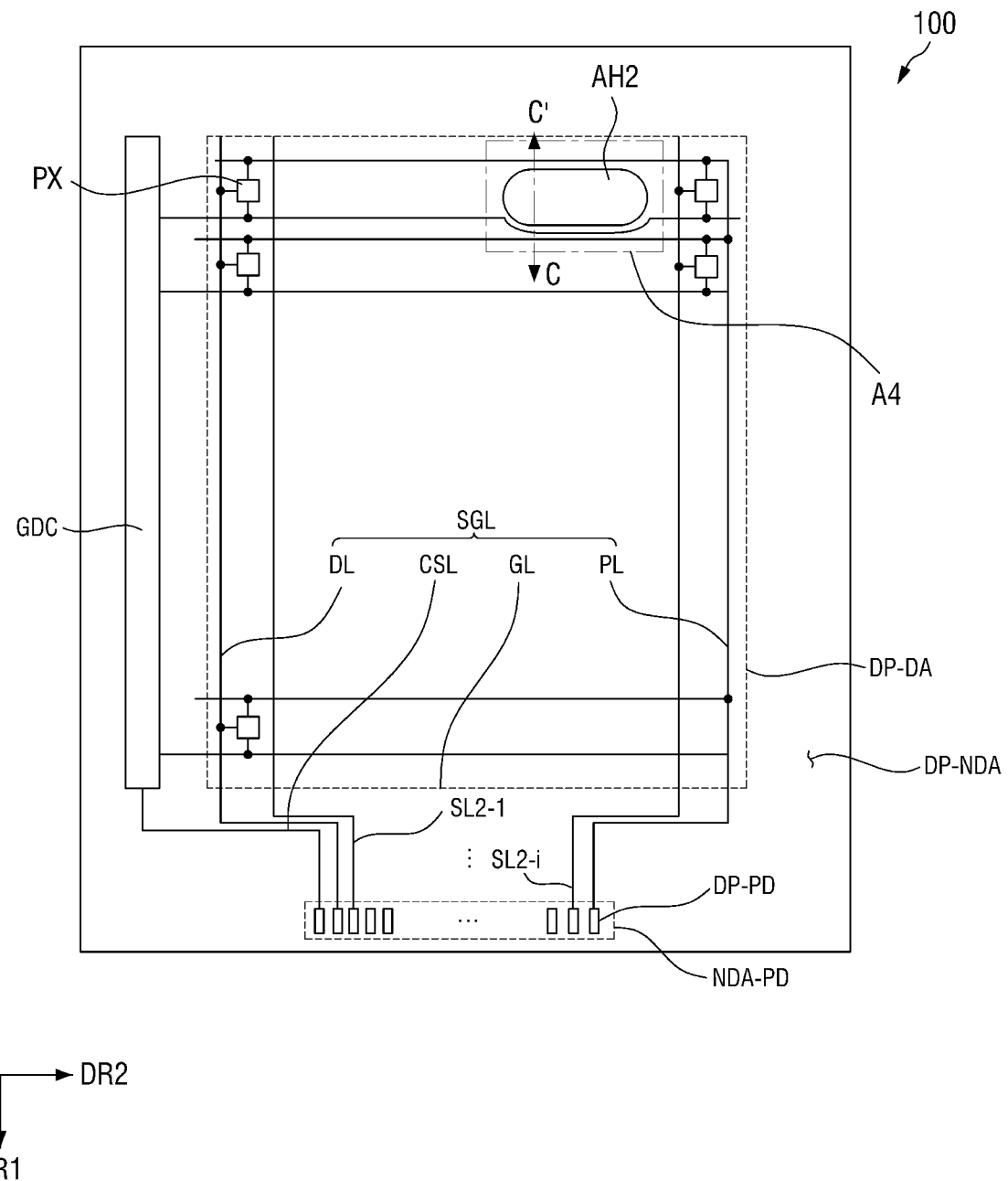
FIG. 10 is a plan view illustrating an example of a display panel included in the display device of FIG. 2.
Figure 11:
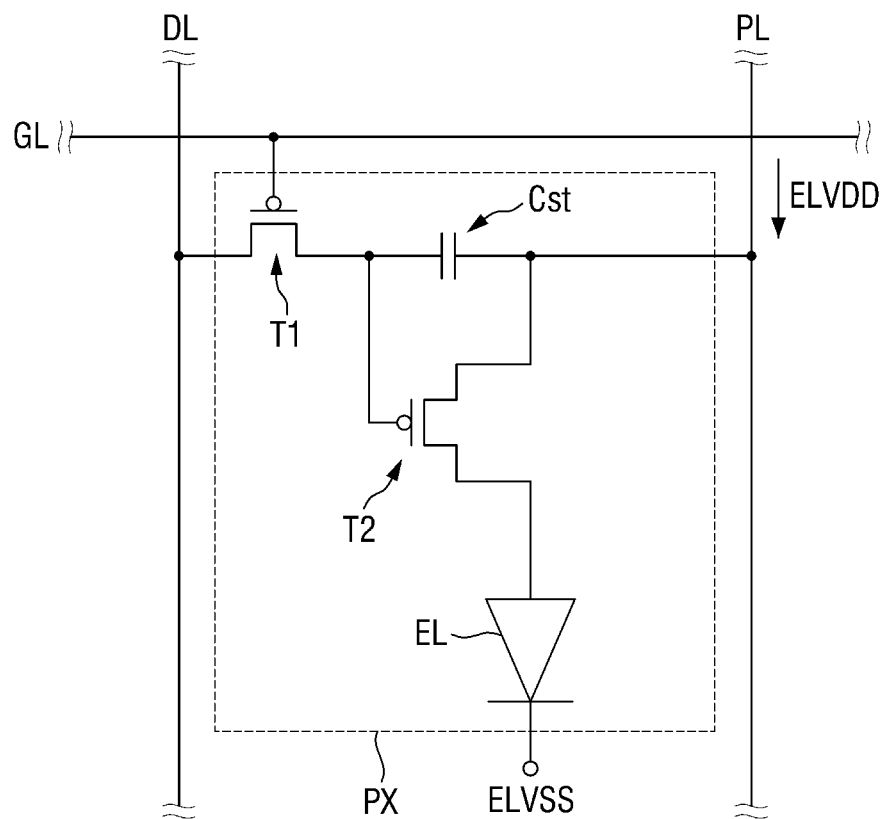
FIG. 11 is a circuit diagram illustrating an example of a pixel included in the display panel of FIG. 10.
Figure 12:
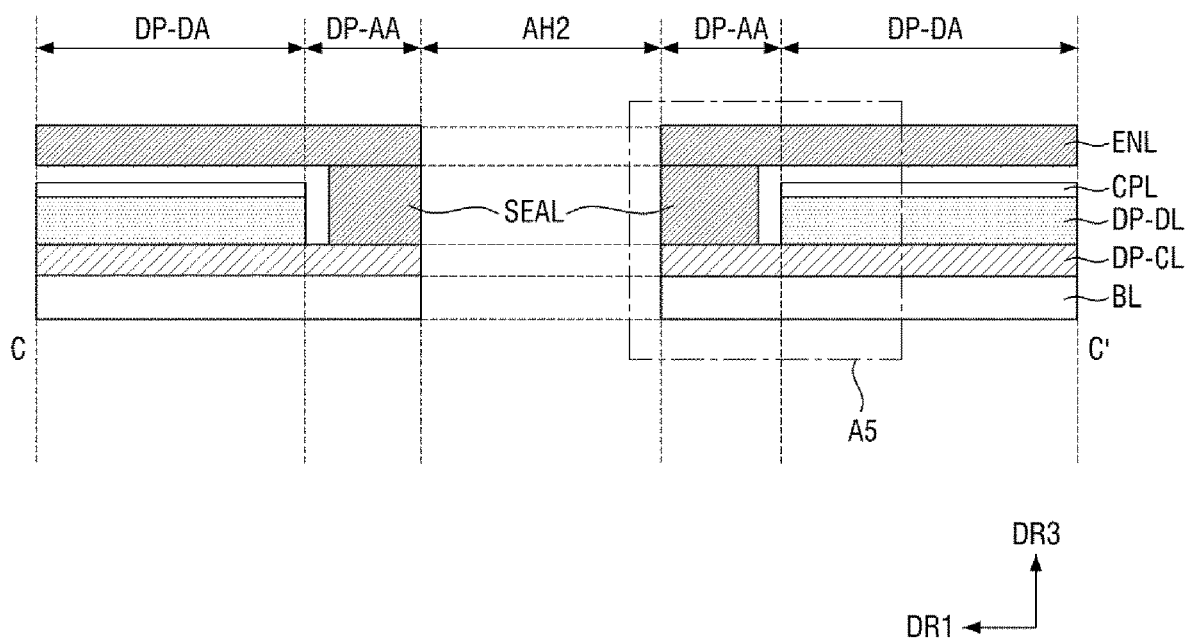
FIG. 12 is a cross-sectional view illustrating an example of the display panel taken along line C-C' of FIG. 10.
Figure 13:
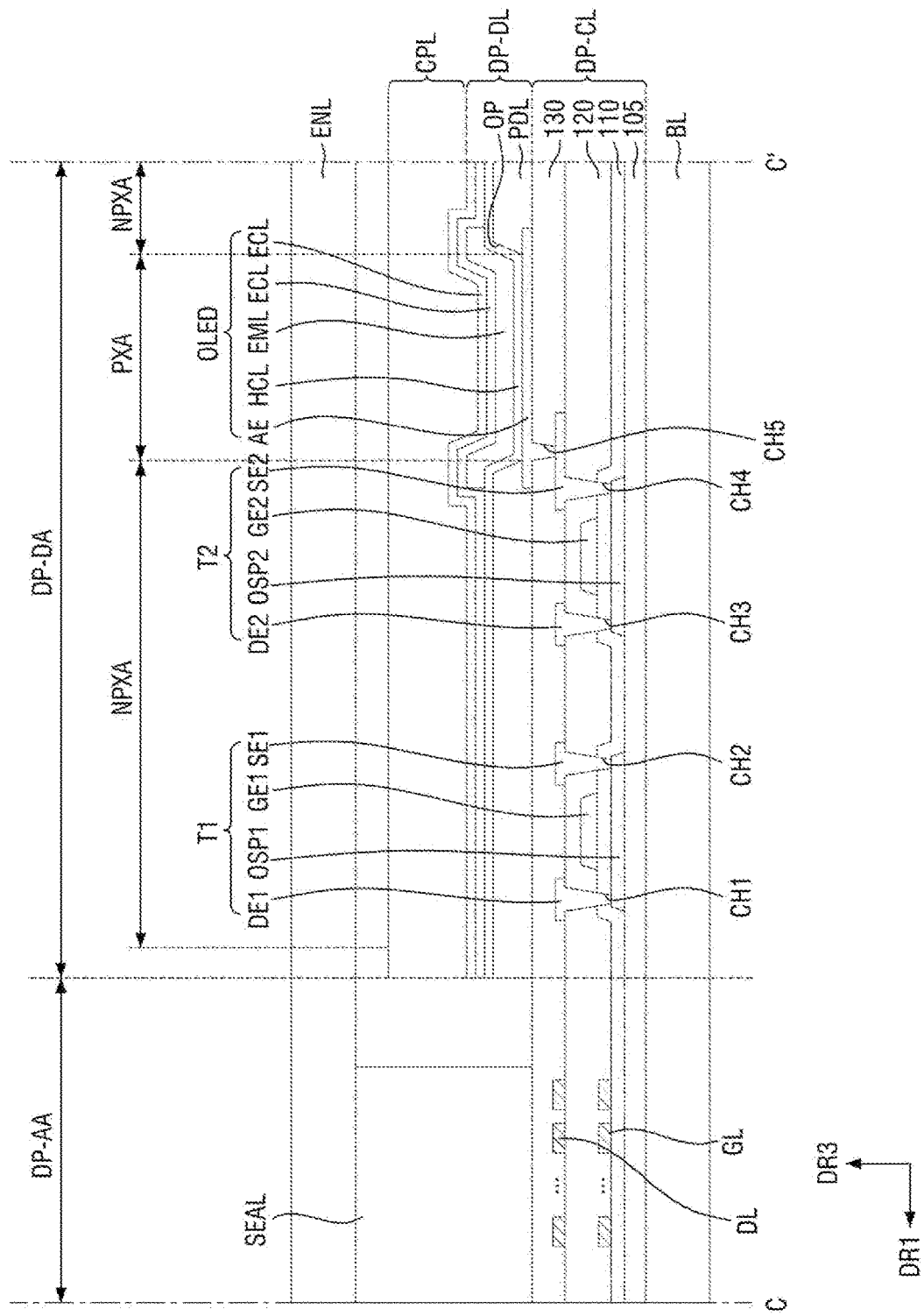
FIG. 13 is an enlarged cross-sectional view of area A5 of FIG. 12.
Figure 14:
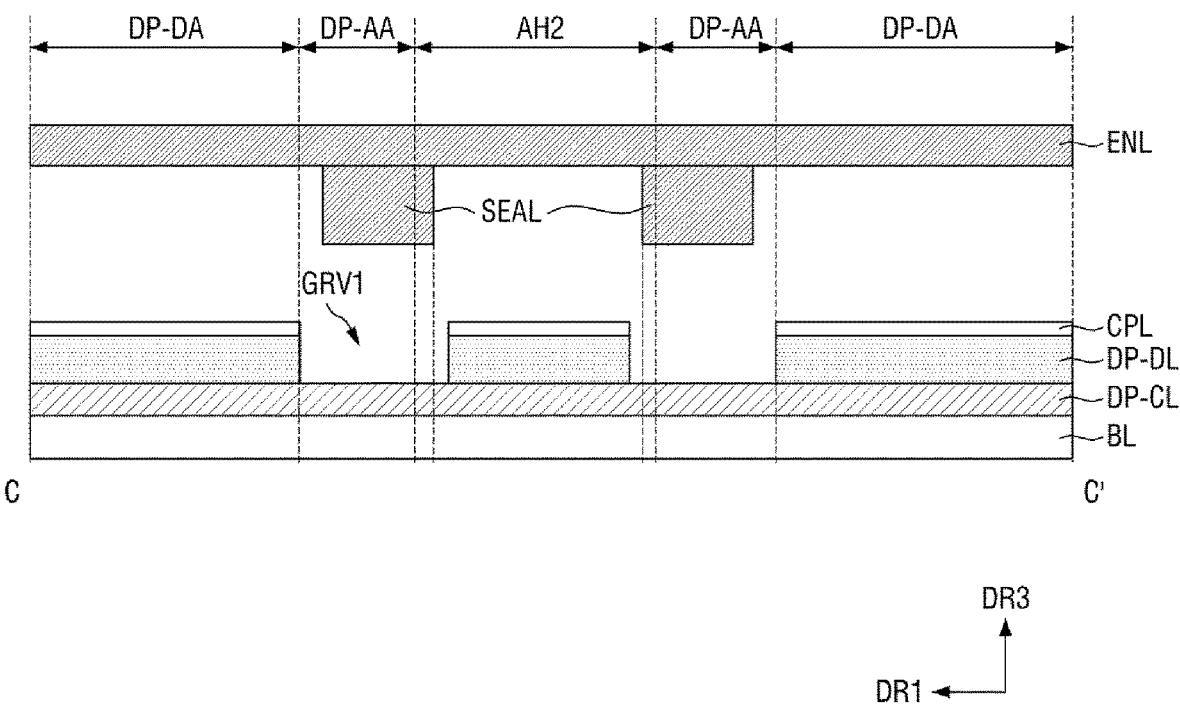
FIG. 14 illustrates a process of manufacturing the display panel of FIG. 12.

FIG. 10 is a plan view illustrating an example of the display panel included in the display device of FIG. 2. FIG. 11 is a circuit diagram illustrating an example of a pixel included in the display panel of FIG. 10. FIG. 12 is a cross-sectional view illustrating an example of the display panel taken along line C-C' of FIG. 10. FIG. 13 is an enlarged cross-sectional view of area A5 of FIG. 12. FIG. 14 illustrates a process of manufacturing the display panel of FIG. 12.

Referring first to FIG. 12, a display panel 100 includes a first substrate BL and a second substrate ENL disposed opposite the first substrate BL. In addition, the display panel 100 includes a circuit element layer DP-CL, a display element layer DP-DL and a capping layer CPL disposed on the first substrate BL. The display panel 100 may further include a first sealing member SEAL (or sealant) and a second sealing member (not illustrated) which seal the first substrate BL and the second substrate ENL.

Each of the first substrate BL and the second substrate ENL may include a glass substrate, a metal substrate, or an organic/inorganic composite substrate. However, the base layer BL is not limited to this example, and each of the first substrate BL and the second substrate ENL may also include a synthetic resin film.

The element circuit layer DP-CL includes at least one insulating layer and circuit elements. The insulating layer included in the circuit element layer DP-CL will hereinafter be referred to as an intermediate insulating layer. The intermediate insulating layer includes at least one intermediate inorganic layer and at least one intermediate organic layer. The circuit elements include signal lines, driving circuits of pixels, etc. The circuit element layer DP-CL may be formed by forming an insulating layer, a semiconductor layer and a conductive layer through coating, deposition or the like and patterning the insulating layer, the semiconductor layer and the conductive layer through a photolithography process.

The display element layer DP-DL includes light emitting elements. The display element layer DP-DL may include organic light emitting diodes. The display element layer DP-DL may further include an organic layer such as a pixel defining layer.

The capping layer CPL may output light emitted from the display element layer DP-DL to the outside of the display panel 100. The capping layer CPL may have a refractive index of 1.6 to 2.4.

The first sealing member SEAL may be made of a transparent frit, may overlap an adjacent area DP-AA of the display panel 100, and may block moisture and oxygen introduced from a second hole AH2. Here, the adjacent area DP-AA of the display panel 100 may correspond to the adjacent area IS-AA of the input sensing panel 200 described with reference to FIG. 3. The first sealing member SEAL may form a closed loop to surround the second hole AH2.

Like the first sealing member SEAL, the second sealing member (not illustrated) may be made of a transparent frit, may overlap a non-display area DP NDA of the display panel 100, and may block moisture and oxygen introduced from the outside. The second sealing member may form a rectangular closed loop to surround a display area DP-DA.

In embodiments, an inner side surface of the first substrate BL, an inner side surface of the second substrate ENL and an inner side surface of the first sealing member SEAL which contact the second hole AH2 may coincide or be aligned with each other. That is, the size (or cross-sectional area) of the second hole AH2 may be uniform along the third direction DR3.

For example, the second hole AH2 may be formed by a hole edge forming process, a sealing process, and a hole processing process. The formation process of the second hole AH2 will be described with reference to FIG. 14.

Referring to FIG. 14, after the circuit element layer DP-CL, the display element layer DP-DL and the capping layer CPL are formed on the first substrate BL, the display element layer DP-DL (or an organic layer and an inorganic layer included in the display element layer DP-DL) may be removed by laser etching to form a groove GRV1. The width of the groove GRV1 may be greater than that of the first sealing member SEAL. The first sealing member SEAL bonded to the second substrate ENL may be inserted into the groove GRV1 and then bonded to the first substrate BL. Then, the second hole AH2 may be formed by laser cutting, CNC drilling, or the like. Since the second hole AH2 is formed at a time after the sealing process using the first sealing member SEAL, it may have a uniform size (or cross-sectional area) along the third direction DR3.

Referring to FIG. 10, the display panel 100 includes the display area DP-DA and the non-display area DP-NDA in plan view. The non-display area DP-NDA may be defined along edges of the display area DP-DA. The display area DP-DA and the non-display area DP-NDA of the display panel 100 respectively correspond to the display area DA and the non-display area NDA of the display device 1 illustrated in FIGS. 1 and 2.

The display panel 100 may include a driving circuit GDC, signal lines SGL, signal pads DP-PD (or second pads), and pixels PX. The pixels PX are disposed in the display area DA. Here, each of the pixels PX is a minimum unit that displays an image and includes an organic light emitting diode and a pixel driving circuit connected to the organic light emitting diode. The driving circuit GDC, the signal lines SGL, the signal pads DP-PD and the pixel driving circuits may be included in the element circuit layer DP-CL illustrated in FIG. 10.

The driving circuit GDC may include a scan driving circuit. The scan driving circuit generates scan signals and sequentially outputs the scan signals to scan lines GL to be described later. The scan driving circuit may further output another control signal to the driving circuits of the pixels PX.

The scan driving circuit may include a plurality of thin-film transistors formed by the same process as the driving circuits of the pixels PX, for example, a low-temperature polycrystalline silicon (LTPS) process or a low-temperature polycrystalline oxide (LTPO) process.

The signal lines SGL include the scan lines GL, data lines DL, a power supply line PL, and a control signal line CSL. The scan lines GL are connected to corresponding pixels PX, respectively, and the data lines DL are connected to corresponding pixels PX, respectively. The power supply line PL is connected to the pixels PX. The control signal line CSL may provide control signals to the scan driving circuit.

The signal lines SGL overlap the display area DP-DA and the non-display area DP-NDA. The signal lines SGL may be connected to a pad area NDA-PD (i.e., an area where the signal pads DP-PA are disposed) disposed in the non-display area DP-NDA and may also be connected to the pixels PX.

Each of the signal lines SGL is connected to transistors T1 and T2 of a pixel PX. The signal lines SGL may have a single layer or multilayer structure and may be formed as a single body or may include two or more parts. The two or more parts may be disposed on different layers and may be connected to each other through a contact hole penetrating an insulating layer disposed between the two or more parts.

The display panel 100 may include the second hole AH2 corresponding to the hole AH of the display device 1 (or the first hole AH1 of the input sensing panel 200).

Like the input sensing panel 200 described with reference to FIG. 4A, the adjacent area DP-AA (see FIG. 12) may be defined adjacent to the second hole AH2, the pixels PX may not be disposed in the adjacent area DP-AA, and the signal lines SGL connected to adjacent rows and columns (i.e., pixel rows and pixel columns interfering with the second hole AH2) may bypass the second hole AH2 in the adjacent area. Since the signal lines SGL bypass the second hole AH2 in substantially the same or similar manner to the connection wirings CL1 and CL2 described with reference to FIG. 4A, a redundant description will not be repeated.

A circuit board (not illustrated) may be electrically connected to the pad area NDA-PD. The circuit board may be a rigid circuit board or a flexible circuit board. The circuit board may be directly coupled to the pad area NDA-PD or may be connected to the pad area NDA-PD by another circuit board.

Referring to FIG. 11, an organic light emitting diode OLED may be a top emission diode or a bottom emission diode. A pixel PX includes a first transistor T1 (or a switching transistor), a second transistor T2 (or a driving transistor), and a capacitor Cst as a pixel driving circuit for driving the organic light emitting diode OLED.

A first power supply voltage ELVDD is provided to the second transistor T2, and a second power supply voltage ELVSS is provided to the organic light emitting diode OLED. The second power supply voltage ELVSS may be lower than the first power supply voltage ELVDD.

The first transistor T1 outputs a data signal transmitted to a data line DL in response to a scan signal transmitted to a scan line GL. The capacitor Cst is charged with a voltage corresponding to the data signal received from the first transistor T1. The second transistor T2 is connected to the organic light emitting diode OLED. The second transistor T2 controls a driving current flowing through the organic light emitting diode OLED according to the amount of charge stored in the capacitor Cst.

This equivalent circuit is merely an embodiment, and the pixel PX is not limited to this embodiment. For example, the pixel PX may include more transistors and more capacitors. The organic light emitting diode OLED can also be connected between the power supply line PL and the second transistor T2.

Referring to FIG. 13, the circuit element layer DP-CL, the display element layer DP-DL, and the capping layer CPL are sequentially disposed on the first substrate BL.

The element circuit layer DP-CL may include a buffer layer 105 which is an inorganic layer, a first intermediate inorganic layer 110 and a second intermediate inorganic layer 120 and may include an intermediate organic layer 130 which is an organic layer. The materials of the inorganic and organic layers are not particularly limited, and the buffer layer 105 can be optionally placed or omitted.

A semiconductor pattern OSP1 (hereinafter, referred to as a first semiconductor pattern) of the first transistor T1 and a semiconductor pattern OSP2 (hereinafter, referred to as a second semiconductor pattern) of the second transistor T2 are disposed on the buffer layer 105. The first semiconductor pattern OSP1 and the second semiconductor pattern OSP2 may be selected from amorphous silicon, polysilicon, and a metal oxide semiconductor.

The first intermediate inorganic layer 110 is disposed on the first semiconductor pattern OSP1 and the second semiconductor pattern OSP2. A control electrode GE1 (hereinafter, referred to as a first control electrode) of the first transistor T1 and a control electrode GE2 (hereinafter, referred to as a second control electrode) of the second transistor T2 are disposed on the first intermediate inorganic layer 110. The first control electrode GE1 and the second control electrode GE2 may be manufactured by the same photolithography process as the scan lines GL.

In addition, the scan lines GL bypassing the second hole AH2 (or a hole area DP-OA corresponding to the second hole AH2) may be disposed on the first intermediate inorganic layer 100 in the adjacent area DP-AA of the display panel 100.

The second intermediate inorganic layer 120 covering the first control electrode GE1 and the second control electrode GE2 is disposed on the first intermediate inorganic layer 110. An input electrode DE1 (hereinafter, referred to as a first input electrode) and an output electrode SE1 (hereinafter, referred to as a first output electrode) of the first transistor T1 and an input electrode DE2 (hereinafter, referred to as a second input electrode) and an output electrode SE2 (hereinafter, referred to as a second output electrode) of the second transistor T2 are disposed on the second intermediate inorganic layer 120.

The first input electrode DE1 and the first output electrode SE1 are connected to the first semiconductor pattern OSP1 respectively through a first through hole CH1 and a second through hole CH2 penetrating the first intermediate inorganic layer 110 and the second intermediate inorganic layer 120. The second input electrode DE2 and the second output electrode SE2 are connected to the second semiconductor pattern OSP2 respectively through a third through hole CH3 and a fourth through hole CH4 penetrating the first intermediate inorganic layer 110 and the second intermediate inorganic layer 120. One of the first transistor T1 and the second transistor T2 can be modified to a bottom gate structure.

In addition, the data lines DL bypassing the second hole AH2 may be disposed on the second intermediate inorganic layer 120 in the adjacent area DP-AA of the display panel 100.

The intermediate organic layer 130 covering the first input electrode DE1, the second input electrode DE2, the first output electrode SE1 and the second output electrode SE2 is disposed on the intermediate organic layer 130. The intermediate organic layer may provide a flat surface.

The display element layer DP-DL is disposed on the intermediate organic layer 130. The display element layer DP-DL may include a pixel defining layer PDL and the organic light emitting diode OLED. The pixel defining layer PDL may include an organic material. A first electrode AE is disposed on the intermediate organic layer 130. The first electrode AE is connected to the second output electrode SE2 through a fifth through hole CH5 penetrating the intermediate organic layer 130. An opening OP is defined in the pixel defining layer PDL. The opening OP of the pixel defining layer PDL exposes at least a portion of the first electrode AE. In an embodiment of the present disclosure, the pixel defining layer PDL may be omitted.

The pixels PX may be disposed in the display area DP-DA. The display area DP-DA may include a light emitting region PXA and a non-light emitting region NPXA adjacent to the light emitting region PXA. The non-light emitting region NPXA may surround the light emitting region PXA. The light emitting region PXA is defined to correspond to a portion of the first electrode AE exposed through the opening OP.

The light emitting region PXA may overlap at least one of the first and second transistors T1 and T2. The opening OP can become wider, and the first electrode AE and a light emitting layer EML to be described later can also become wider.

A hole control layer HCL may be disposed common to the light emitting region PXA and the non-light emitting region NPXA. Although not illustrated separately, a common layer such as the hole control layer HCL may be formed common to the pixels PX.

The light emitting layer EML is disposed on the hole control layer HCL. The light emitting layer EML may be disposed in an area corresponding to the opening OP. That is, the light emitting layer EML may be formed separately in each of the pixels PX. The light emitting layer EML may include an organic material and/or an inorganic material. The light emitting layer EML may generate light of a predetermined color.

In FIG. 13, the patterned light emitting layer EML is illustrated as an example. However, the light emitting layer EML may also be disposed common to the pixels PX. Here, the light emitting layer EML may generate white light. In addition, the light emitting layer EML may also have a multilayer structure called a tandem.

An electron control layer ECL is disposed on the light emitting layer EML. Although not illustrated separately, the electron control layer ECL may be formed common to the pixels PX. A second electrode CE is disposed on the electron control layer ECL. The second electrode CE is disposed common to the pixels PX.

A capping layer may be disposed on the second electrode CE.

As described with reference to FIGS. 10, 11, 12, 13, and 14, the display panel 100 may include the second hole AH2 corresponding to the hole AH of the display device 1, the pixels PX may not be disposed in the adjacent area DP-AA adjacent to the second hole AH2, and the signal lines SGL (e.g., the scan lines GL and the data lines DL) interfering with the second hole AH2 may bypass the second hole AH2 in the adjacent area DP-AA.

Figure 15:
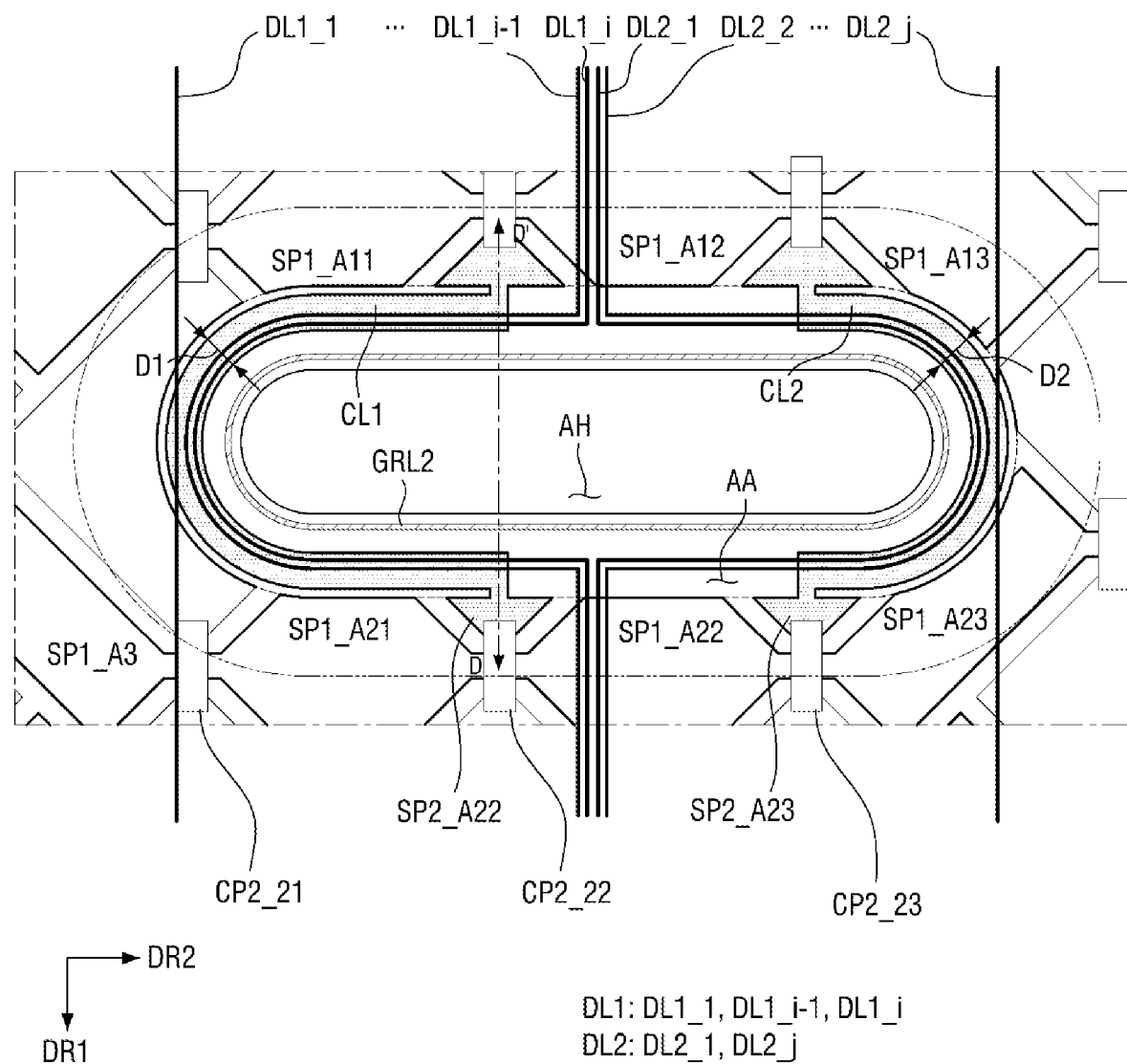
FIG. 15 is an enlarged plan view of area A4 of FIG. 10.
Figure 16:
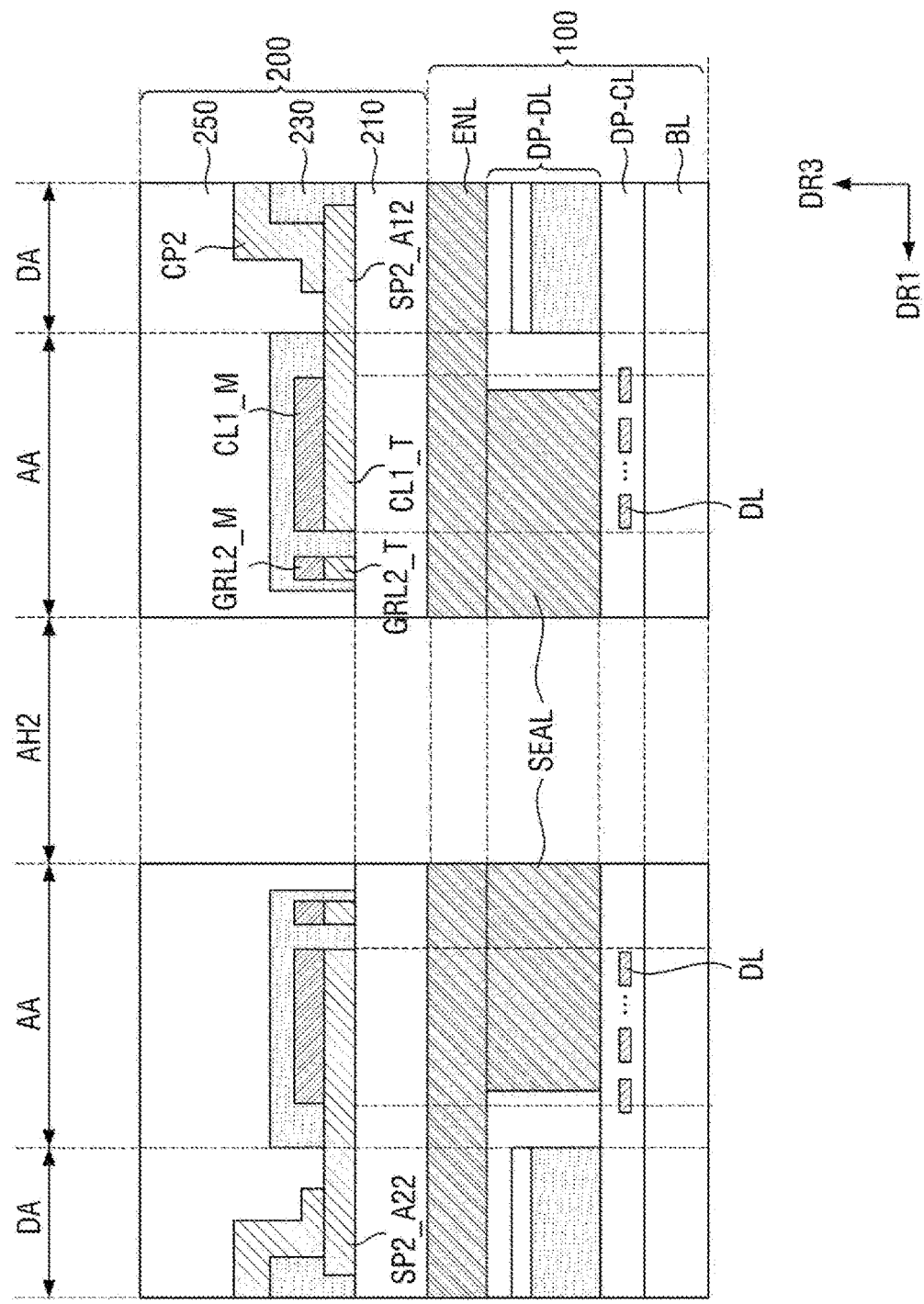
FIG. 16 is a cross-sectional view illustrating an example of the display device taken along line D-D' of FIG. 15.

FIG. 15 is an enlarged plan view of area A4 of FIG. 10. In FIG. 15, the connection wirings CP1 and CP2 included in the input sensing panel 200 of FIG. 3 overlap the data lines DL included in the display panel 100 of FIG. 10. FIG. 16 is a cross-sectional view illustrating an example of the display device taken along line D-D' of FIG. 15.

Referring first to FIGS. 15 and 16, the input sensing panel 200 is disposed on the display panel 100. The input sensing panel 200 may be substantially the same as the input sensing panel 200 described with reference to FIG. 7A, and the display panel 100 may be substantially the same as the display panel 100 described with reference to FIGS. 12 and 13. Thus, a redundant description will not be repeated.

The data lines DL may include first data lines DL1 and second data lines DL2. The first data lines DL1 may bypass the hole AH (or the second hole AH2) in the direction of one side of the center of the area of the hole AH or may pass through the adjacent area AA. The first data lines DL1 may include first through $i^{th}$ first data lines DL1_1 through DL1_$i$ (where i is a positive integer).

Similarly, the second data lines DL2 may bypass the hole AH (or the second hole AH2) in the direction of the other side of the center of the area of the hole AH or may pass through the adjacent area AA. The second data lines DL2 may include first through $(j)^{th}$ second data lines DL2_1 through DL2 (where j is a positive integer).

In this case, the first connection wiring CL1 may overlap at least one of the first data lines DL1, and the second connection wiring CL2 may overlap at least one of the second data lines DL2. As described above, each of the first line width D1 of the first connection wiring CL1 and the second line width D2 of the second connection wiring CL2 is greater than the line width of the first data lines DL1 (and/or the line width of the second data lines DL2). Therefore, each of the first connection wiring CL1 and the second connection wiring CL2 may overlap a plurality of data lines.

Referring to FIG. 16, the first connection wiring CL1 and the second connection wiring CL2 may overlap the sealing member SEAL. Each of the first connection wiring CL1 and the second connection wiring CL2 may also partially overlap the sealing member SEAL.

Referring to FIG. 16, the data lines DL may not overlap the second guard wiring GRL2. Here, the data lines DL may include the first data lines DL1 and the second data lines DL2. If the second guard wiring GRL2 is in a floating state or overlaps the data lines DL, parasitic capacitance may be formed between the second guard wiring GRL2 and the data lines DL, and signal transmission through the data lines DL may be delayed. Therefore, the second guard wiring GRL2 and the data lines DL may not overlap each other in order to prevent or reduce a delay in signal transmission through the data lines DL.

Figure 17:
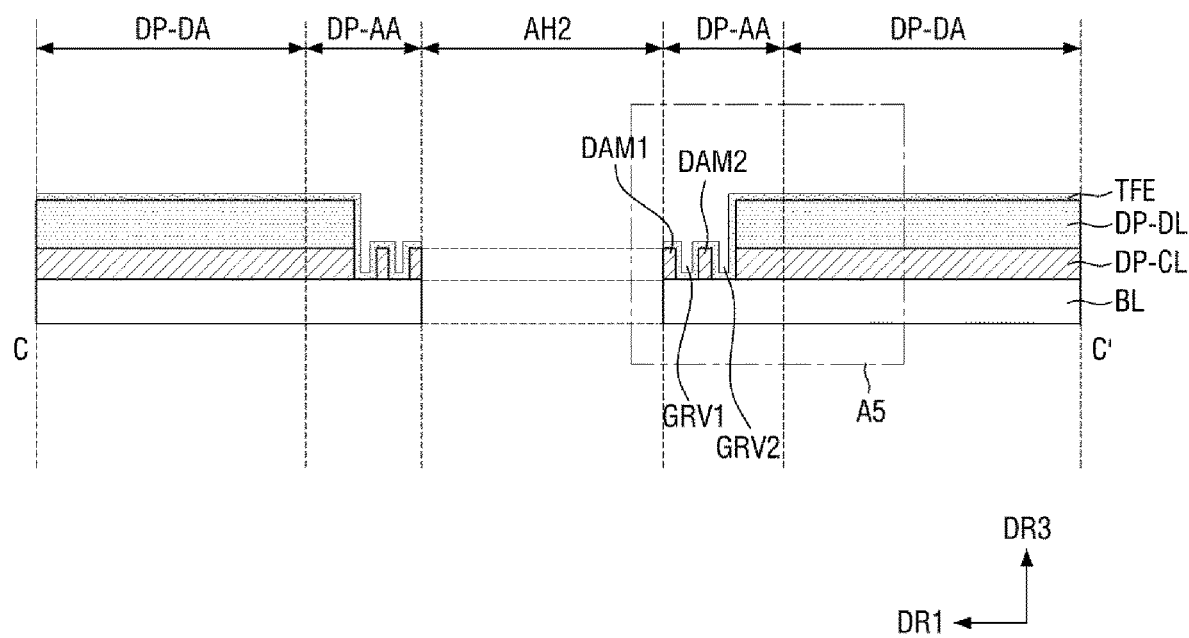
FIG. 17 is a cross-sectional view illustrating another example of the display panel taken along the line C-C' of FIG. 10.
Figure 18A:
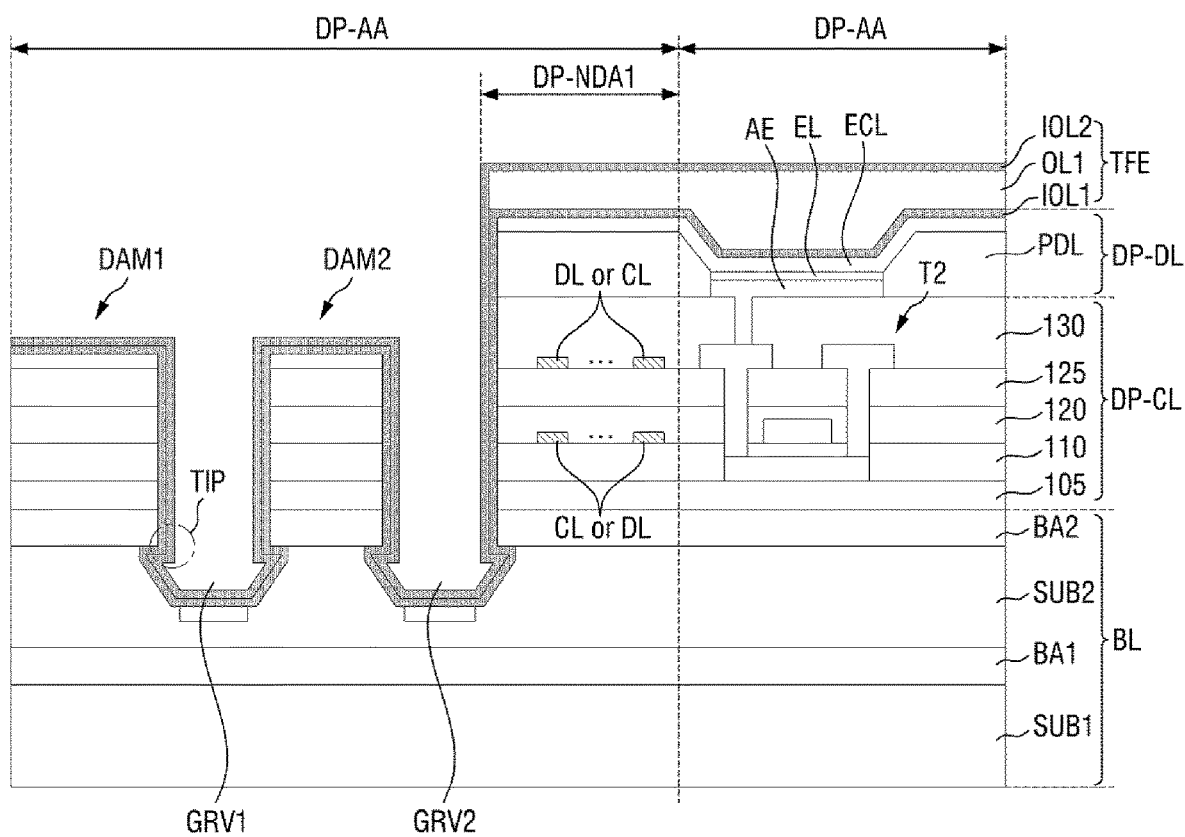
FIGS. 18A, 18B, and 18C are enlarged cross-sectional views of area A5 of FIG. 17.
Figure 18B:
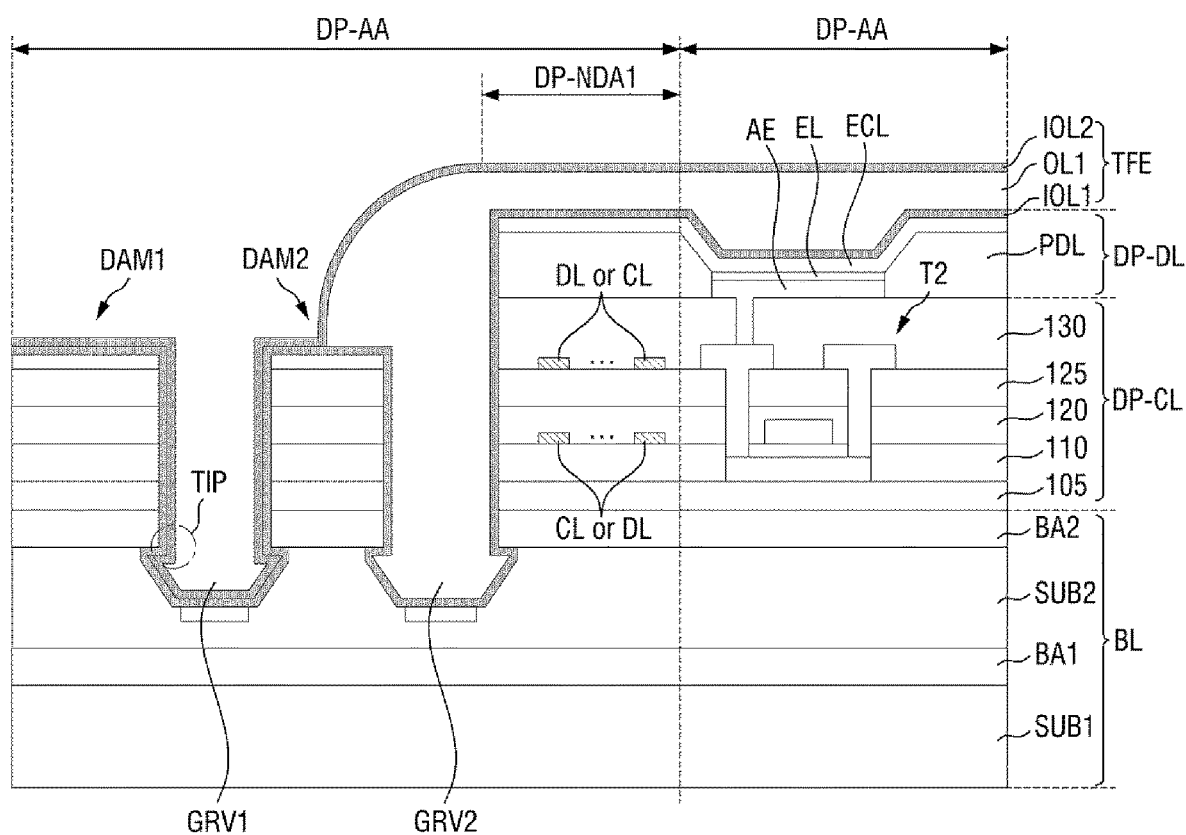
Figure 18C:
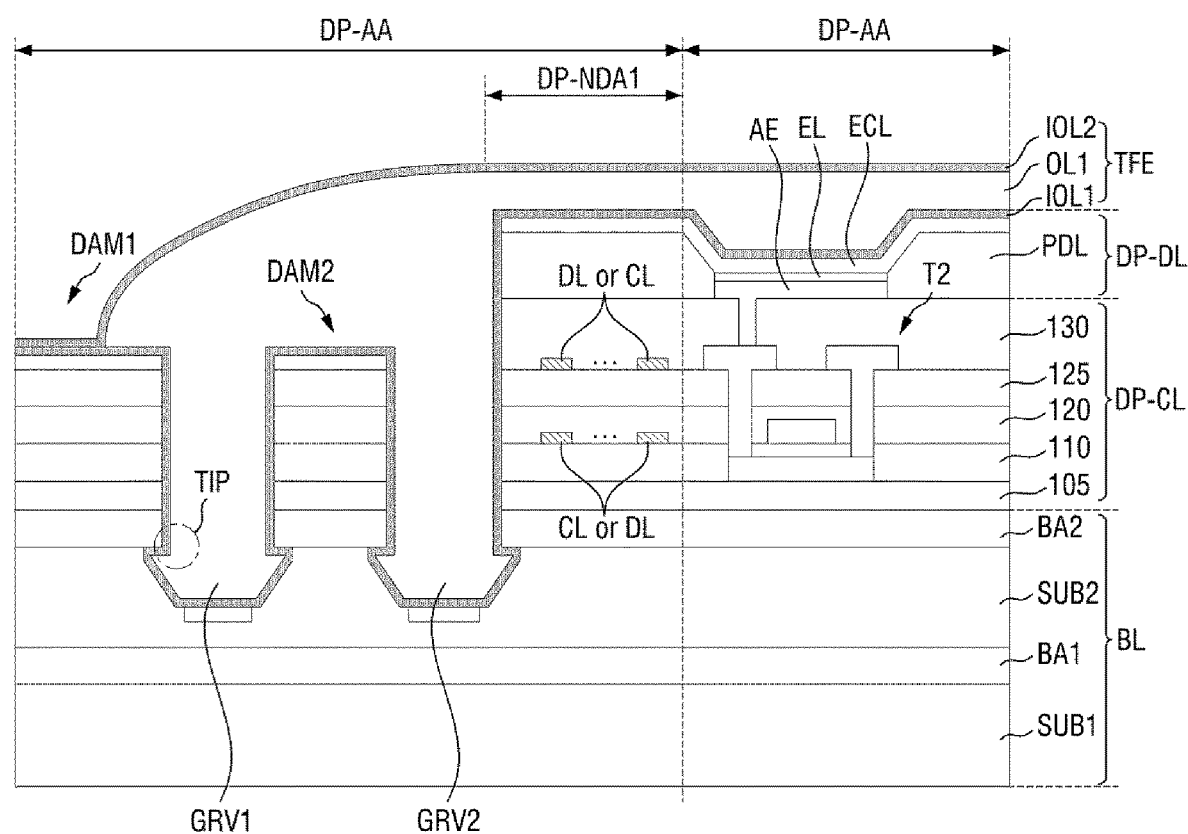

FIG. 17 is a cross-sectional view illustrating another example of the display panel taken along the line C-C' of FIG. 10. FIGS. 18A, 18B, and 18C are enlarged cross-sectional views of area A5 of FIG. 17.

Referring to FIGS. 10, 12, 13, and 17, a display panel 100 is different from the display panel 100 described with reference to FIGS. 12 and 13 in that it includes a thin-film encapsulation layer TFE instead of a second substrate ENL, a sealing member SEAL and a capping layer CPL.

The display panel 100 includes a base layer BL (or a second base layer) and a circuit element layer DL-CP, a display element layer DP-DL and the thin-film encapsulation layer TFE disposed on the base layer BL.

The base layer BL may include a synthetic resin film. A synthetic resin layer is formed on a working substrate used to manufacture the display panel 100. Then, a conductive layer and an insulating layer are formed on the synthetic resin layer. If the working substrate is removed, the synthetic resin layer corresponds to the base layer BL. The synthetic resin layer may be a polyimide resin layer, and its material is not particularly limited. The base layer BL may include a glass substrate, a metal substrate, or an organic/inorganic composite substrate.

The circuit element layer DP-CL and the display element layer DP-DL may respectively be substantially the same or similar to the circuit element layer DP-CL and the display element layer DP-DL described above with reference to FIG. 12. Thus, a redundant description will not be repeated.

The thin-film encapsulation layer TFE seals the display element layer DP-DL. The thin-film encapsulation layer TFE includes at least one insulating layer. The thin-film encapsulation layer TFE may include at least one inorganic layer (hereinafter, referred to as an encapsulating inorganic layer). The thin-film encapsulation layer TFE according to an embodiment of the present disclosure may include at least one organic layer (hereinafter, referred to as an encapsulating organic layer) and at least one encapsulating inorganic layer. The encapsulating inorganic layer may protect the display element layer DP-DL from moisture/oxygen.

The display panel 100 may include dams DAM1 and DAM2 formed in an adjacent area DP-AA.

The dams DAM1 and DAM2 may be formed on the base layer BL along the periphery of a second hole AH2. The dams DAM1 and DAM2 may include a first dam DAM1 and a second dam DAM2. The first dam DAM1 may be formed adjacent to the second hole AH2. That is, a side surface of the first dam DAM1 may coincide or be aligned with an inner side surface of the display panel 100 (i.e., a side surface formed by the second hole AH2). The second dam DAM2 may be spaced apart from the first dam DAM1. The dams DAM1 and DAM2 may block introduction of oxygen and moisture from the second hole AH2 and propagation of fine cracks.

Referring to FIG. 18A, the base layer BL may include a first sub-base layer SUB1 (or a support substrate), a first barrier layer BA1, a second sub-base layer SUB2 (or a flexible substrate), and a second barrier layer BA2. The first barrier layer BA1 may be disposed on the first sub-base layer SUB1, the second sub-base layer SUB2 may be disposed on the first barrier layer BA1, and the second barrier layer BA2 may be disposed on the second sub-base layer SUB2. Each of the first and second sub-base layers SUB1 and SUB2 may include a polymer material (e.g., PI) having flexibility. The first and second barrier layers BA1 and BA2 may prevent or suppress oxygen and moisture from being introduced from the outside to the first and second sub-base layers SUB1 and SUB2.

The second sub-base layer SUB2 may include negative PI. In this case, inversely tapered grooves GRV1 and GRV2 may be formed in the second sub-base layer SUB2 through patterning. That is, protruding tips TIP may be formed in the grooves GRV1 and GRV2. The inversely tapered grooves GRV1 and GRV2 (and the tips TIP) may cause an organic layer (or an organic light emitting layer) to be discontinuously formed in a stacking process of the display panel 100.

The circuit element layer DP-CL is different from the circuit element layer DP-CL described with reference to FIG. 13 in that it further includes a third intermediate inorganic layer 125. Although the circuit element layer DP-CL includes only a second transistor T2 in FIG. 18A, this is only a schematic illustration of the circuit element layer DP-CL for ease of description, and the circuit element layer DP-CL may further include the first transistor T1, etc. illustrated in FIG. 13.

The third intermediate inorganic layer 125 may be disposed between a second intermediate inorganic layer 120 and an intermediate organic layer 130. The third intermediate inorganic layer 125 may be substantially the same or similar to the second intermediate inorganic layer 120. Data lines DL (or scan lines GL) may be formed on the third intermediate inorganic layer 125, but the present disclosure is not limited to this case. At least some of the data lines DL (or the scan lines GL) can also be formed on the second intermediate inorganic layer 120. When the data lines DL (or the scan lines GL) are disposed on a first intermediate inorganic layer 110, the second intermediate inorganic layer 120 and the third intermediate inorganic layer 130 in a distributed manner, the width of a first non-display area DP-NDA1 may be reduced. Here, the first non-display area DP-NDA1 may be a portion of an adjacent area D-AA excluding the first and second dams DAM1 and DAM2 and the first and second grooves GRV1 and GRV2.

The dams DAM1 and DAM2 may include the circuit element layer DP-CL. However, the intermediate organic layer 130 may not be formed in the dams DAM1 and DAM2.

The thin-film encapsulation layer TFE may overlap the whole of the base layer BL. The thin-film encapsulation layer TFE may extend from a display area DP-DA to the second hole AH2 and may be disposed along the first and second grooves GRV1 and GRV2 and sidewalls formed by the first and second dams DAM1 and DAM2. In this case, the inflow path of moisture and oxygen and/or propagation path of cracks through the thin-film encapsulation layer TFE are increased, and the reliability and stability of the display device 1 can be improved.

The thin-film encapsulation layer TFE may include a first encapsulating inorganic layer IOL1, a first encapsulating organic layer OL1, and a second encapsulating inorganic layer IOL2 stacked sequentially. Each of the first encapsulating inorganic layer IOL1 and the second encapsulating inorganic layer IOL2 may be a single layer including a material or may have multiple layers including different materials. At least one of the first encapsulating inorganic layer IOL1 and the second encapsulating inorganic layer IOL2 may include a silicon nitride layer, a silicon oxynitride layer, a silicon oxide layer, a titanium oxide layer, or an aluminum oxide layer.

The encapsulating organic layer OL1 may be formed by depositing organic monomers. Here, the organic monomers may include, but are not limited to, acrylic monomers.

For example, the thin-film encapsulation layer TFE may include a silicon oxynitride layer/an organic monomer layer/a silicon nitride layer stacked sequentially on a second electrode CE. Another inorganic layer may be disposed on the silicon nitride layer, and the silicon nitride layer may have multiple layers (e.g., two layers) deposited under different conditions.

In embodiments, the encapsulating organic layer OL1 may overlap the display area DP-DA and the first non-display area DP-NDA1 and may not overlap the first and second grooves GRV1 and GRV2 and the first and second dams DAM1 and DAM2. In this case, the first and second encapsulating inorganic layers IOL1 and IOL2 may overlap the first and second grooves GRV1 and GRV2 and the first and second dams DAM1 and DAM2. In this case, the inflow path of moisture and oxygen may be relatively long.

However, the above is merely an example, and the thin-film encapsulation layer TFE is not limited to this example.

The encapsulating organic layer OL1 may also overlap the second groove GRV2 and partially overlap the second dam DAM2 as illustrated in FIG. 18B. In addition, the encapsulating organic layer OL1 may also overlap the first and second grooves GRV3 and the second dam DAM1 and partially overlap the first dam DAM1 as illustrated in FIG. 18C. In this case, an upper surface of the thin-film encapsulation layer TFE may be relatively flat, and an input sensing layer to be described later (i.e., an input sensing layer formed through a continuous process after the process of forming the thin-film encapsulation layer TFE) can be formed more easily on the thin-film encapsulation layer TFE.

In FIGS. 17, 18A, 18B, and 18C, the display panel 100 includes two dams DAM1 and DAM2. However, this is merely an example, and the present disclosure is not limited to this example. For example, the display panel 100 may include three or more dams.

FIGS. 19A, 19B, 19C, and 19D are plan views illustrating examples of the display panel of FIG. 17. In FIGS. 19A, 19B, 19C, and 19D, a display panel 100 (or dams DAM1 and DAM2 of the display panel 100) overlaps an input sensing panel 200 (or first and second connection wirings CL1 and CL2 of the input sensing panel 200) in the area A4 of FIG. 10.

Figure 19A:
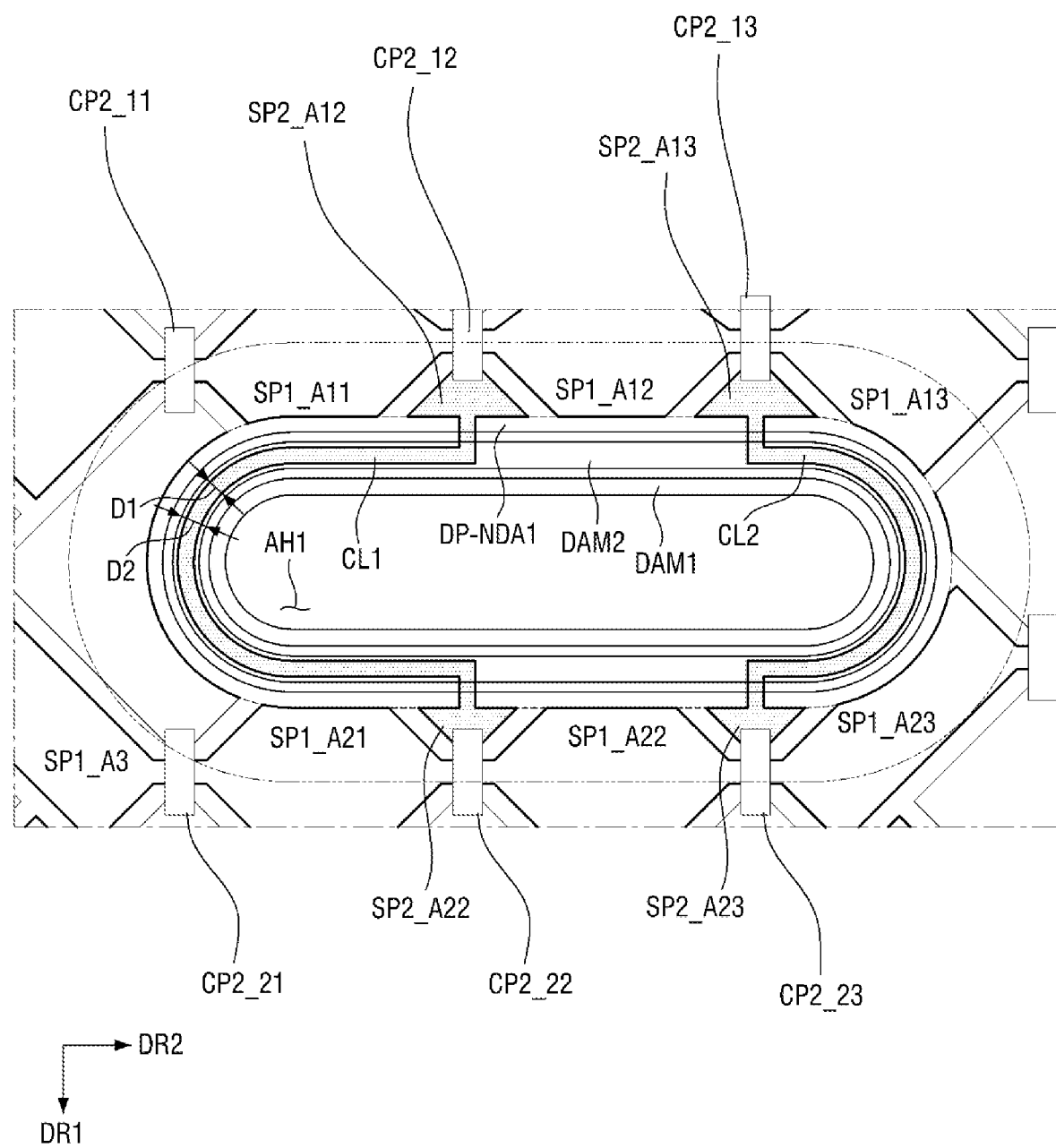
FIGS. 19A, 19B, 19C, and 19D are plan views illustrating examples of the display panel of FIG. 17.

Referring to FIG. 19A, a first connection wiring CL1 may overlap a second dam DAM2. A first line width D1 of the first connection wiring CL1 may be smaller than a second width D2 of the second dam DAM2 (i.e., a gap between first and second grooves GRV1 and GRV2). For example, if the display panel 100 has the cross-sectional structure illustrated in FIG. 18A and the second width D2 of the second dam DAM2 is sufficiently large, the first connection wiring CL1 may overlap the second dam DAM2. The first connection wiring CL1 may overlap a first non-display area DP-NDA1 as illustrated in FIG. 19D. In this case, the first connection wiring CL1 may overlap a data wiring DL and/or a scan signal line GL of the display panel 100. In addition, although not illustrated, the first connection wiring CL1 may overlap a first dam DAM1.

Figure 19B:
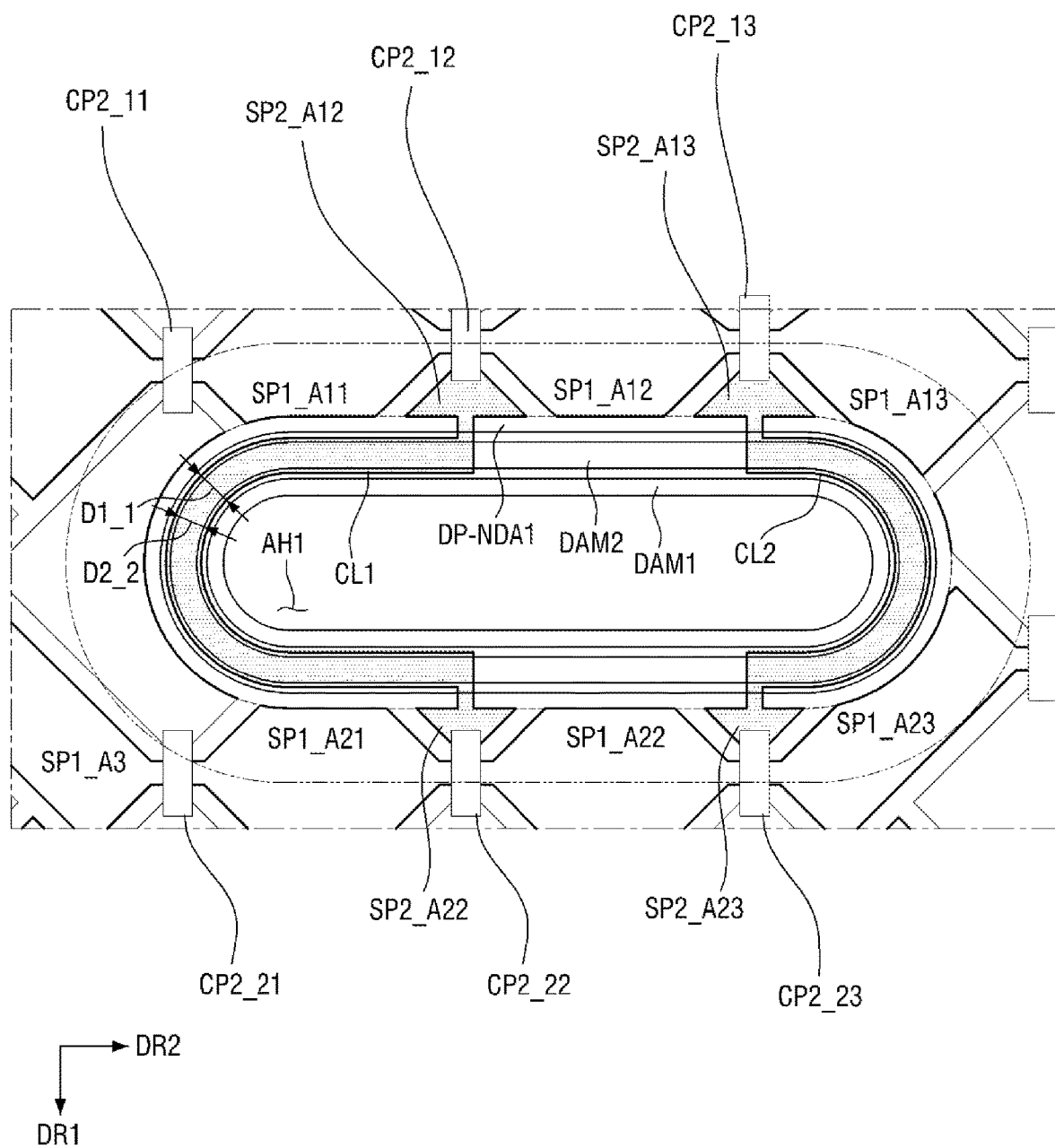

Referring to FIG. 19B, a first connection wiring CL1 may cover a second dam DAM2. A first line width D1_1 of the first connection wiring CL1 may be greater than a second width D2_2 of the second dam DAM2 (i.e., a gap between first and second grooves GRV1 and GRV2). For example, if the display panel 100 has the structure illustrated in FIG. 18B or the cross-sectional structure illustrated in FIG. 18C and the second width D2 of the second dam DAM2 is relatively small, the first connection wiring CL1 may cover the second dam DAM2.

Figure 19C:
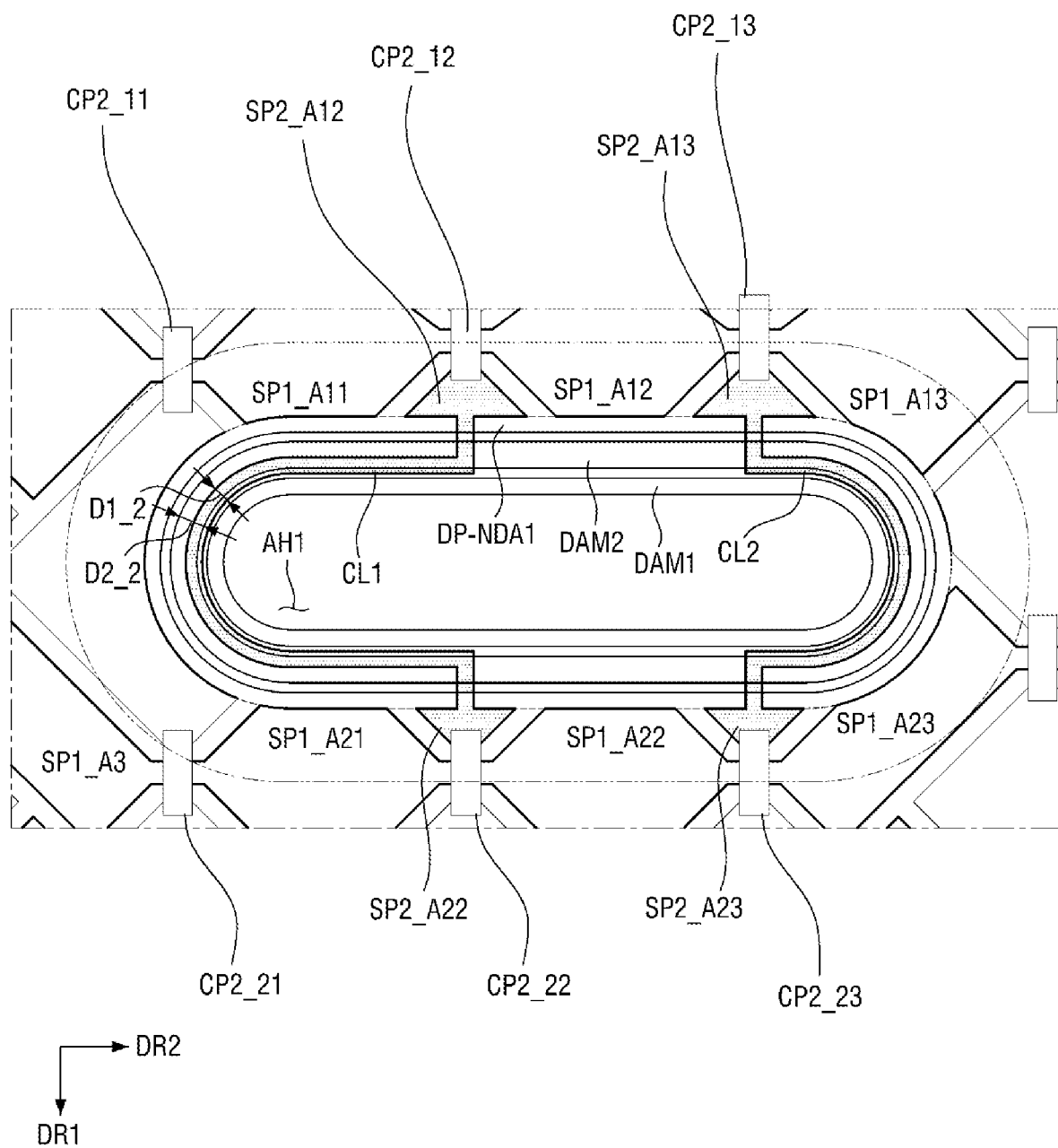
Figure 19D:
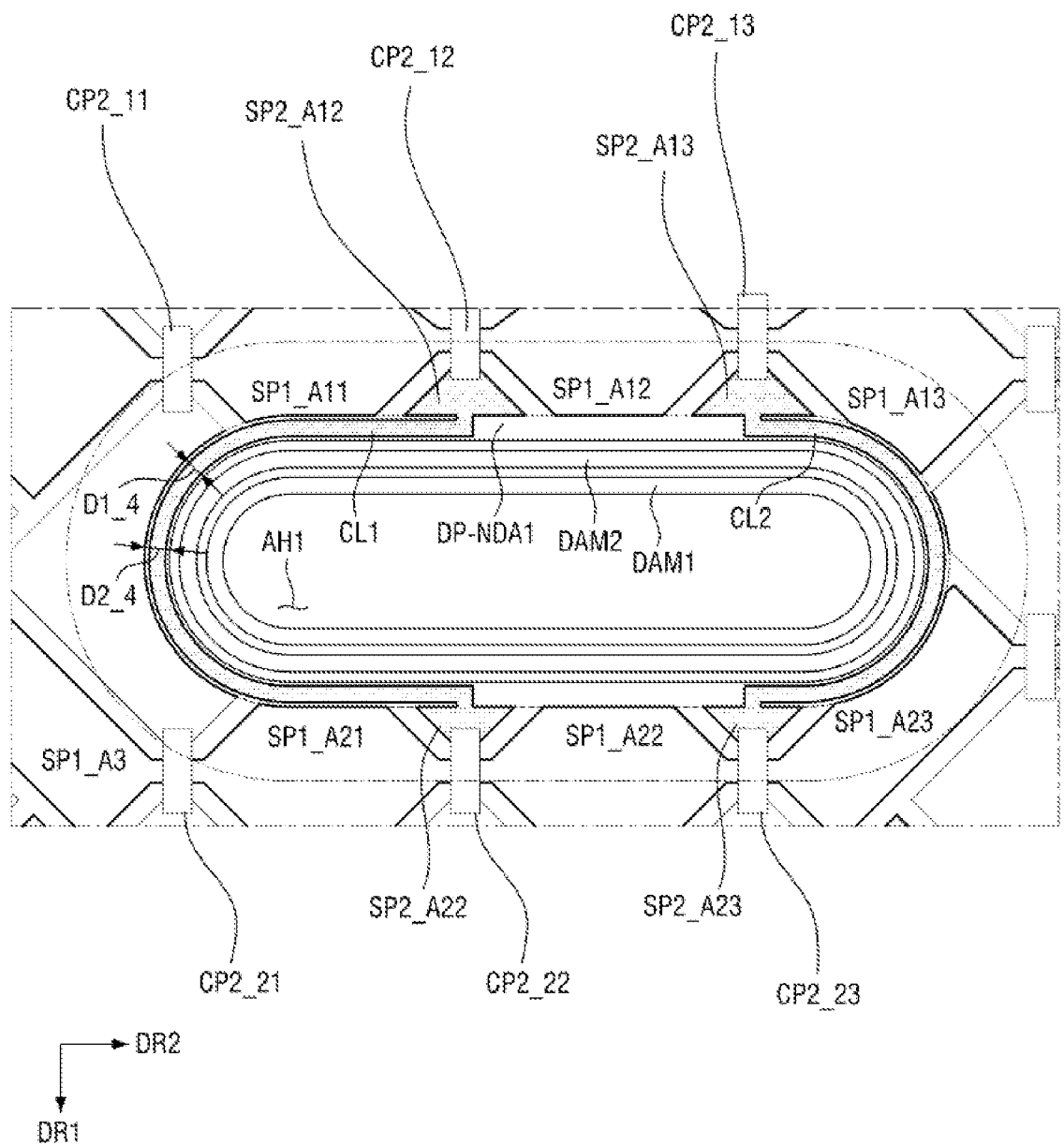

Referring to FIG. 19C, a first connection wiring CL1 may partially overlap a second dam DAM2.

Figure 20:
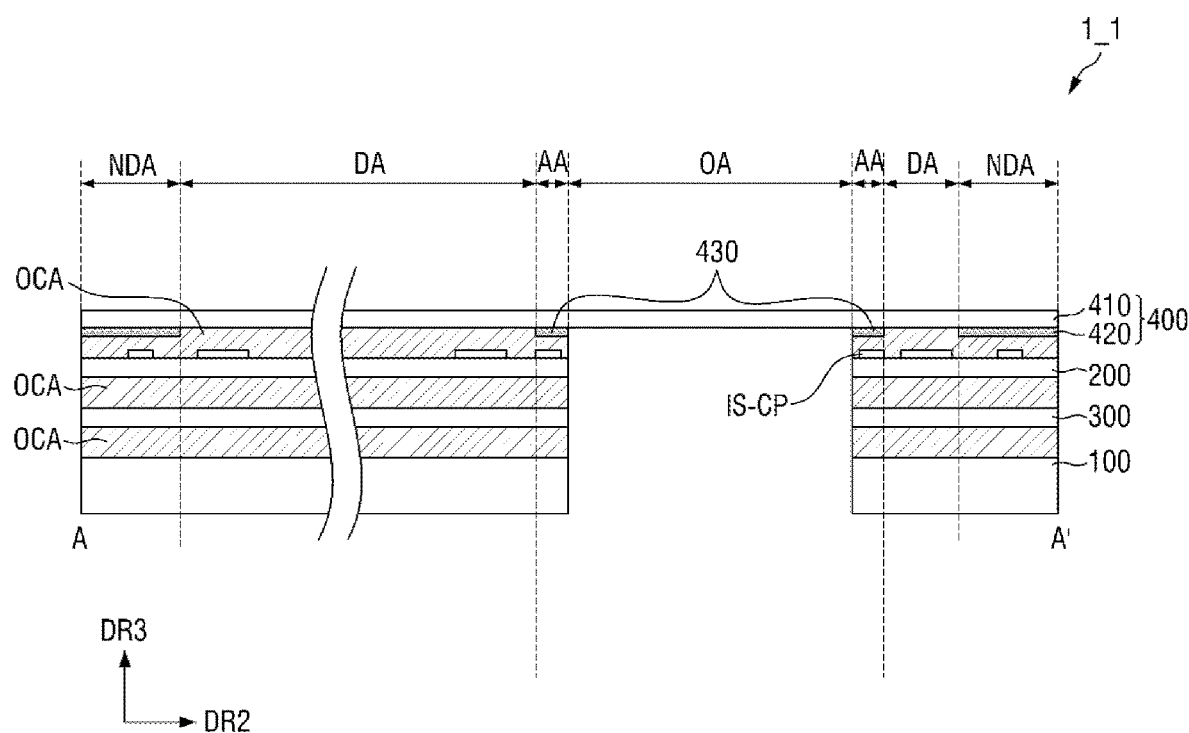
FIG. 20 is a cross-sectional view illustrating another example of the display device taken along the line A-A' of FIG. 1.
Figure 21:
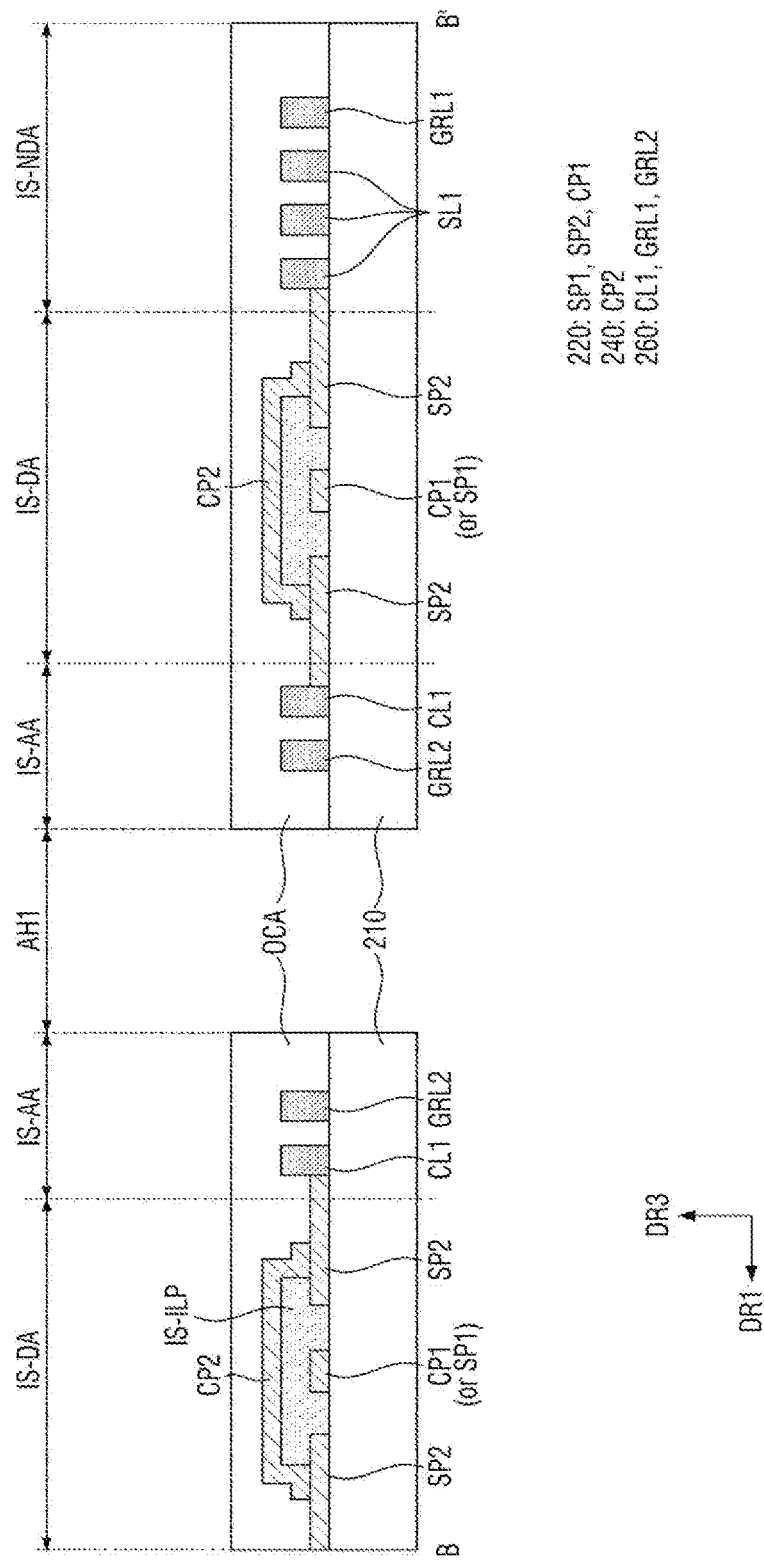
FIG. 21 is a cross-sectional view illustrating an example of an input sensing panel included in the display device of FIG. 20.
Figure 22:
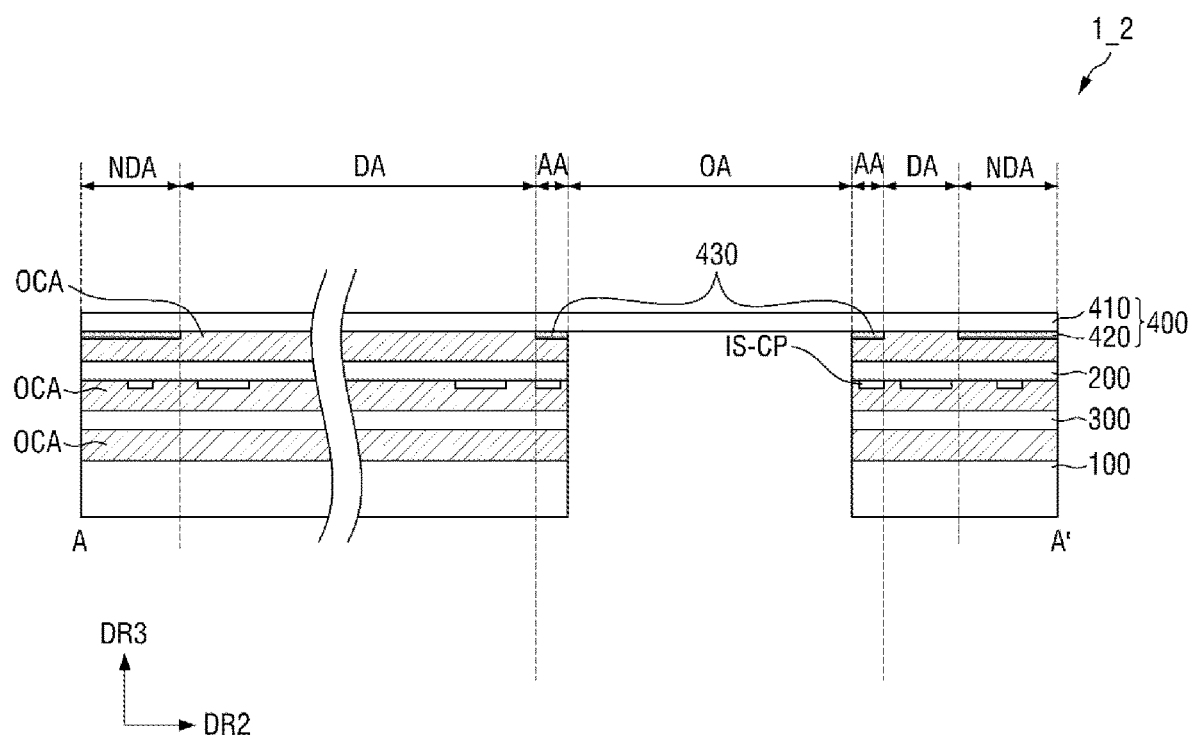
FIG. 22 illustrates another example of the display device taken along the line A-A' of FIG. 1.

FIG. 20 is a cross-sectional view illustrating another example of the display device taken along the line A-A' of FIG. 1. FIG. 21 is a cross-sectional view illustrating an example of an input sensing panel included in the display device of FIG. 20. FIG. 22 illustrates another example of the display device taken along the line A-A' of FIG. 1.

Referring to FIGS. 2 and 20, a display device 1_1 is different from the display device 1 of FIG. 2 in that it includes an antireflection panel 300 disposed on a display panel 100 and an input sensing panel 200 disposed on the antireflection panel 300. That is, the stacking order of the input sensing panel 200 and the antireflection panel 300 included in the display device 1_1 is different from that of the input sensing panel 200 and the antireflection panel 300 included in the display device 1 of FIG. 2.

The display panel 100 may be substantially the same as the display panel 100 described with reference to FIGS. 2, 10, 11, 12, 13, 14, and 17. Therefore, a redundant description will not be repeated. The antireflection panel 300 and a window panel 400 may be substantially the same or similar to the antireflection panel 300 and the window panel 400 described with reference to FIGS. 2A and 2B.

The input sensing panel 200 is different from the input sensing panel 200 described with reference to FIGS. 3 through 6 in that it includes a conductive layer IS-CP (or a first connection wiring CL1), first signal lines SL1, and first and second guard wirings GRL1 and GRL2. The plan view of the input sensing panel 200 may be substantially the same as the plan view illustrated FIG. 3. In FIG. 21, a cross section of the input sensing panel 200 taken along the line B-B' of FIG. 3 is illustrated.

Referring to FIG. 21, the input sensing panel 200 is different from the input sensing panel 200 of FIG. 5 in that it does not include a second insulating layer 250 and includes a third conductive layer 260. A first insulating layer 230 included in the input sensing panel 200 may include only insulating patterns IS-ILP, and the insulating patterns IS-ILP may be disposed on a first conductive layer 220 and may be disposed only in overlap areas between first connection parts CP1 and second connection parts CP2.

The third conductive layer 260 may be disposed on a base layer 210 in a non-sensing area IS-NDA and an adjacent area IS-AA and may include the first connection wiring CP1, the first signal lines SL1 and the first and second guard wirings GRL1 and GRL2.

The third conductive layer 260 may include a metal layer, and the metal layer may include may include molybdenum, silver, titanium, copper, aluminum, and an alloy of the same. Since the third conductive layer 260 includes only the metal layer, it has lower resistance than a transparent conductive layer of the same thickness as the third conductive layer 260 and can reduce the delay and attenuation of a signal transmitted through the first connection wiring CP1, the first signal lines SL1 and the first and second guard wirings GRL1 and GRL2.

Referring again to FIG. 20, the third conductive layer 260 may be disposed on an upper surface of the base layer 210 and may face the window panel 400. However, the input sensing panel 200 is not limited to this example.

Referring to FIG. 22, a conductive layer IS-CP (or a third conductive layer 260) may be disposed on a lower surface of a base layer 210 and may face an antireflection panel 300. The stress due to the bending of a display device 1 may be alleviated depending on the position of the third conductive layer IS-CP (or the third conductive layer 260).

The overlapping relationship between the first connection wiring CL1 included in the input sensing panel 200 of FIGS. 20, 21, and 22 and signal wirings (e.g., data wirings) and/or data wirings included in the display panel 100 may be substantially the same or similar to the overlapping relationship described with reference to FIGS. 15, 16, and 19A through 19D.

Figure 23:
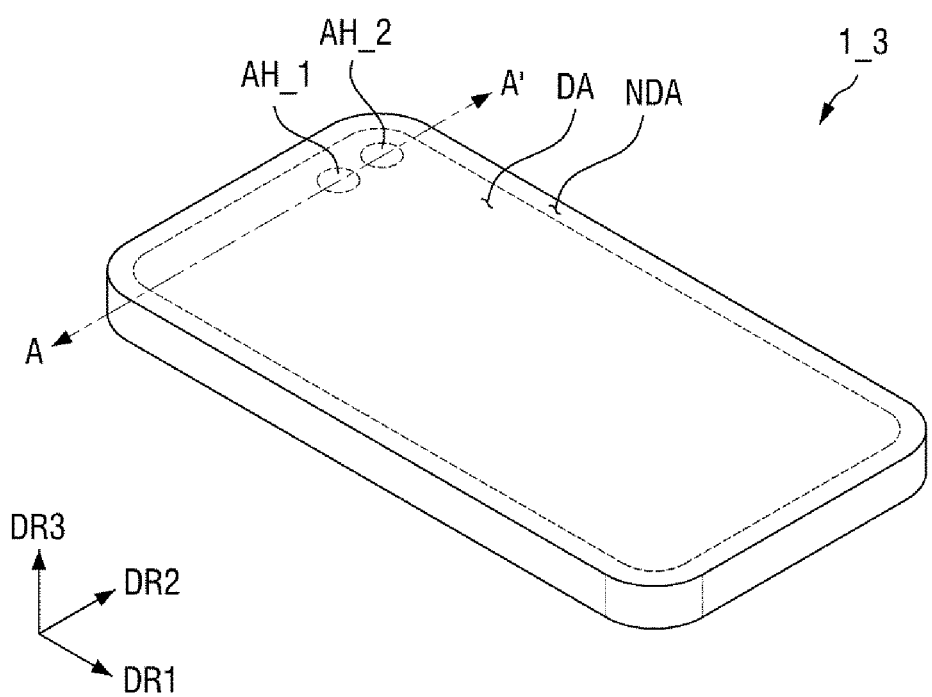
FIG. 23 is a perspective view of a display device according to another embodiment.
Figure 24:
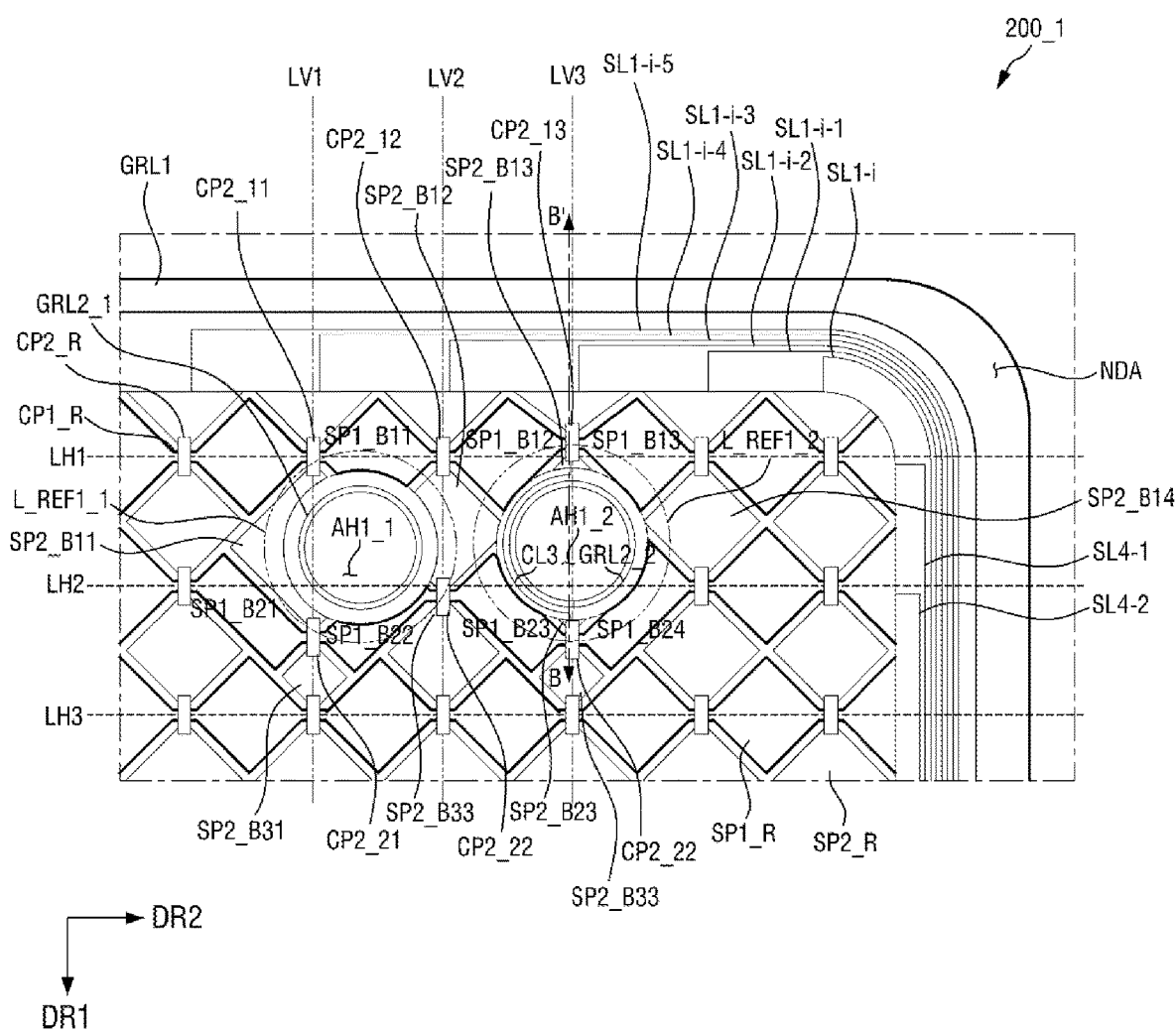
FIG. 24 illustrates another example of an input sensing panel included in the display device of FIG. 23.

FIG. 23 is a perspective view of a display device according to another embodiment. FIG. 24 illustrates another example of an input sensing panel included in the display device of FIG. 23. In FIG. 24, an enlarged view of a portion of the input sensing panel 200 corresponding to FIG. 4A (i.e., a portion corresponding to the area A1 of FIG. 4A) is illustrated.

Referring to FIGS. 1, 3, 4A, 23, and 24, an input sensing panel 200_1 is different from the input sensing panel 200 of FIG. 4A (or the input sensing panel 200 of FIG. 3) in that it includes two active holes AH1_1 and AH1_2.

First and second active holes AH1_1 and AH1_2 may be formed at a position corresponding to the first hole AH1 described with reference to FIG. 4A.

Each of the first and second active holes AH1_1 and AH1_2 may have a circular planar shape and may have a size similar to the size of sensor parts SP1 and SP2. However, this is merely an example, and the first and second active holes AH1_1 and AH1_2 are not limited to this example. For example, the first and second active holes AH1_1 and AH1_2 may have a polygonal shape such as a square or a rectangle or may have a size equal to or larger than the size of the first hole AH1.

First, the first active hole AH1_1 may overlap a first vertical reference line LV1 (i.e., one of the imaginary lines extending in the first direction DR1, on which second connection parts CP2 or first connection parts CP1 are located or which connect the second connection parts CP2 or the first connection parts CP1) and a second horizontal reference line LH2 (i.e., one of the imaginary lines extending in the second direction DR2, on which the second connection parts CP2 or the first connection parts CP1 are located). That is, a first intersection point of the first vertical reference line LV1 and the second horizontal reference line LH2 may be disposed within the first active hole AH1_1 or adjacent to the first active hole AH1_1.

Accordingly, a $221^{st}$ adjacent connection part CP2_21 corresponding to the first intersection point (or a first connection part CP1 overlapping the $221^{st}$ adjacent connection part CP2_21, although not illustrated) may be disposed at an intersection point of the first vertical reference line LV1 and a first sub-boundary line L_REF1_1. Here, the first sub-boundary line L_REF1_1 may be a closed loop line spaced apart from an edge of the first active hole AH1_1 by a specific distance, like the first reference boundary line L_REF1 described with reference to FIG. 4A.

Adjacent sensor parts (e.g., a $121^{st}$ sensor part SP1_B21, a $122^{nd}$ sensor part SP1_B22, a $211^{th}$ sensor part SP2_B11 and a $231^{st}$ sensor part SP2_B31) may have different shapes and/or sizes from first reference sensor parts CP1_R (and/or second reference sensor parts CP2_R) depending on the position of the $221^{st}$ adjacent connection part CP2_21.

The $121^{st}$ sensor part SP1_B21 and the $122^{nd}$ sensor part SP1_B22 may be directly connected to each other depending on the position of the $221^{st}$ adjacent connection part CP2_21.

Since adjacent second sensor parts (e.g., the $211^{th}$ sensor part SP2_B11 and a $212^{th}$ sensor part SP2_B12) are not separated by the first active hole AH1_1, no connection wiring may be disposed in a first adjacent area (i.e., an adjacent area surrounding the first active hole AH1_1). A second sub-guard wiring GRL2_1 may be disposed in the first adjacent area in order to prevent or reduce inflow of physical shock, static electricity, etc. from the first active hole AH1_1.

Like the first active hole AH1_1, the second active hole AH1_2 may overlap a third vertical reference line LV3, a first horizontal reference line LH1 and the second horizontal reference line LH2. That is, a second intersection point of the third vertical reference line LV3 and the first horizontal reference line LH1 may be disposed within the second active hole AH1_2 or adjacent to the second active hole AH1_2, and a third intersection point of the third vertical reference line LV3 and the second horizontal reference line LH2 may be disposed within the second active hole AH1_2 or adjacent to the second active hole AH1_2.

Accordingly, a $213^{th}$ adjacent connection part CP2_13 corresponding to the second intersection point may be disposed at one of the intersection points of the third vertical reference line LV3 and a second sub-boundary line L_REF1_2. Similarly, a $222^{nd}$ adjacent connection part CP2_22 corresponding to the third intersection point may be disposed at another one of the intersection points of the third vertical reference line LV3 and the second sub-boundary line L_REF1_2.

Therefore, a $112^{th}$ sensor part SP1_B12 and a $113^{th}$ sensor part SP1_B13 may be directly connected to each other by the $213^{th}$ adjacent connection part CP2_13, and a $123^{rd}$ sensor part SP1_B23 and a $124^{th}$ sensor part SP1_B24 may be directly connected to each other by the $222^{nd}$ adjacent connection part CP2_22.

Adjacent second sensor parts (e.g., a $213^{th}$ sensor part SP2_B13 and a $223^{rd}$ sensor part SP2_B23) may be separated by the second active hole AH1_2. Therefore, a third connection wiring CL3 may be disposed in an adjacent area surrounding the second active hole AH1_2 and may electrically connect the $213^{th}$ sensor part SP2_B13 and the $223^{rd}$ sensor part SP2_B23.

The third connection wiring CL3 is substantially the same or similar to one of the first and second connection wirings CL1 and CL2 described with reference to FIG. 4A, and thus a redundant description will not be repeated.

As described with reference to FIGS. 23 and 24, even if the shape, size and number (or quantity) of the hole AH of the display device 1 is changed, connection parts interfering with the hole AH (i.e., the first and second connection parts CP1 and CP2) may be disposed on the sub-boundary lines L_REFR1_1 and L_REF1_2 set based on the hole AH, and the sensor parts SP1 and SP2 may be disposed accordingly. In addition, a connection wiring (e.g., the third connection wiring CL3) electrically connecting separated second sensor parts SP2 may be disposed in an adjacent area IS-AA adjacent to the hole AH (e.g., the second active hole AH1_2). Therefore, while the display device 1 includes the hole AH in a display area DA, it can sense an external input (e.g., a user's touch input) through the entire display area DA surrounding the hole AH.

Figure 25:
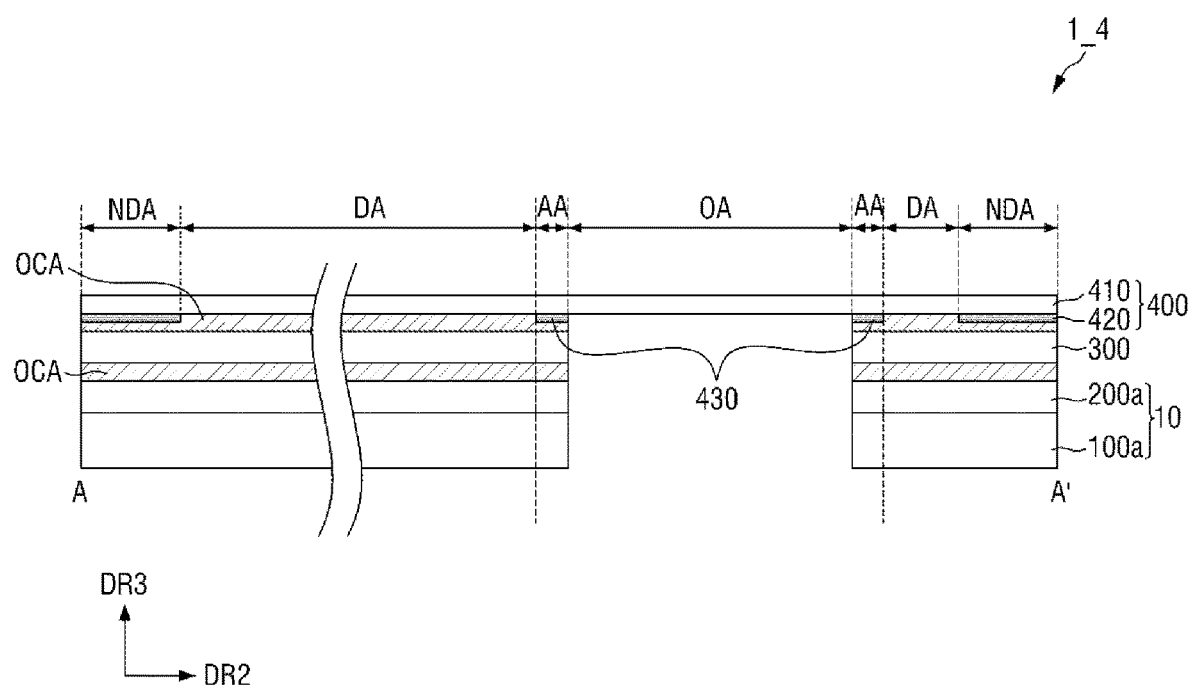
FIG. 25 is a cross-sectional view illustrating another example of the display device taken along the line A-A' of FIG. 1.
Figure 26:
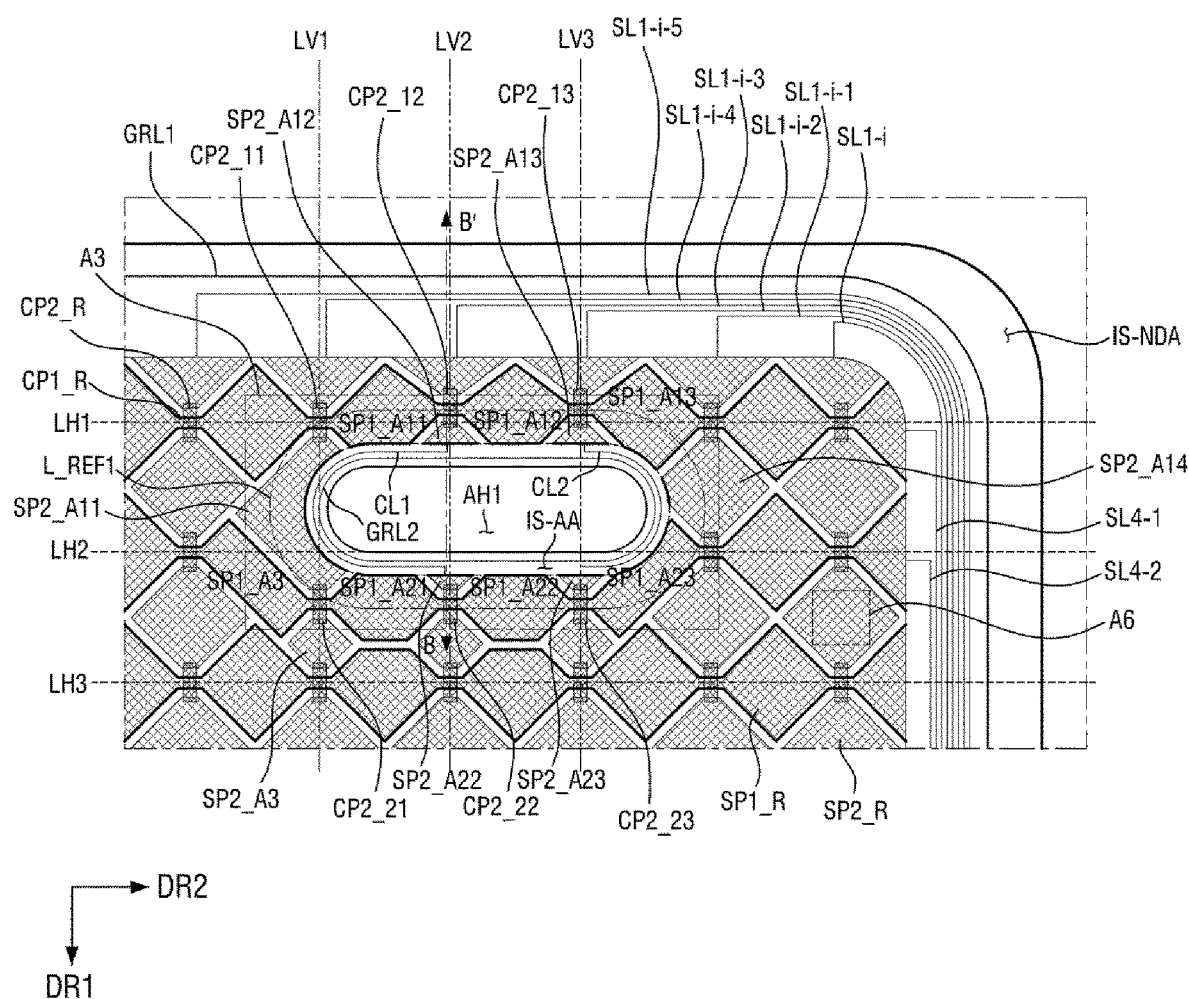
FIG. 26 is a plan view of a portion of an input sensing layer included in the display device of FIG. 25.
Figure 32:
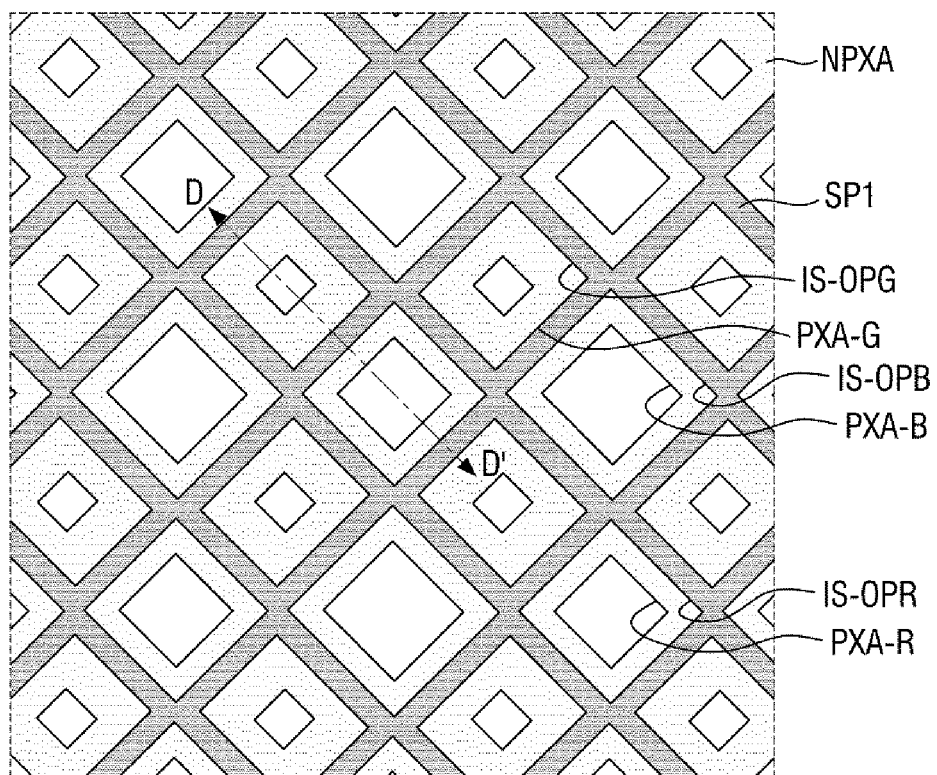
FIG. 32 is an enlarged view of area A6 of FIG. 26.
Figure 33:
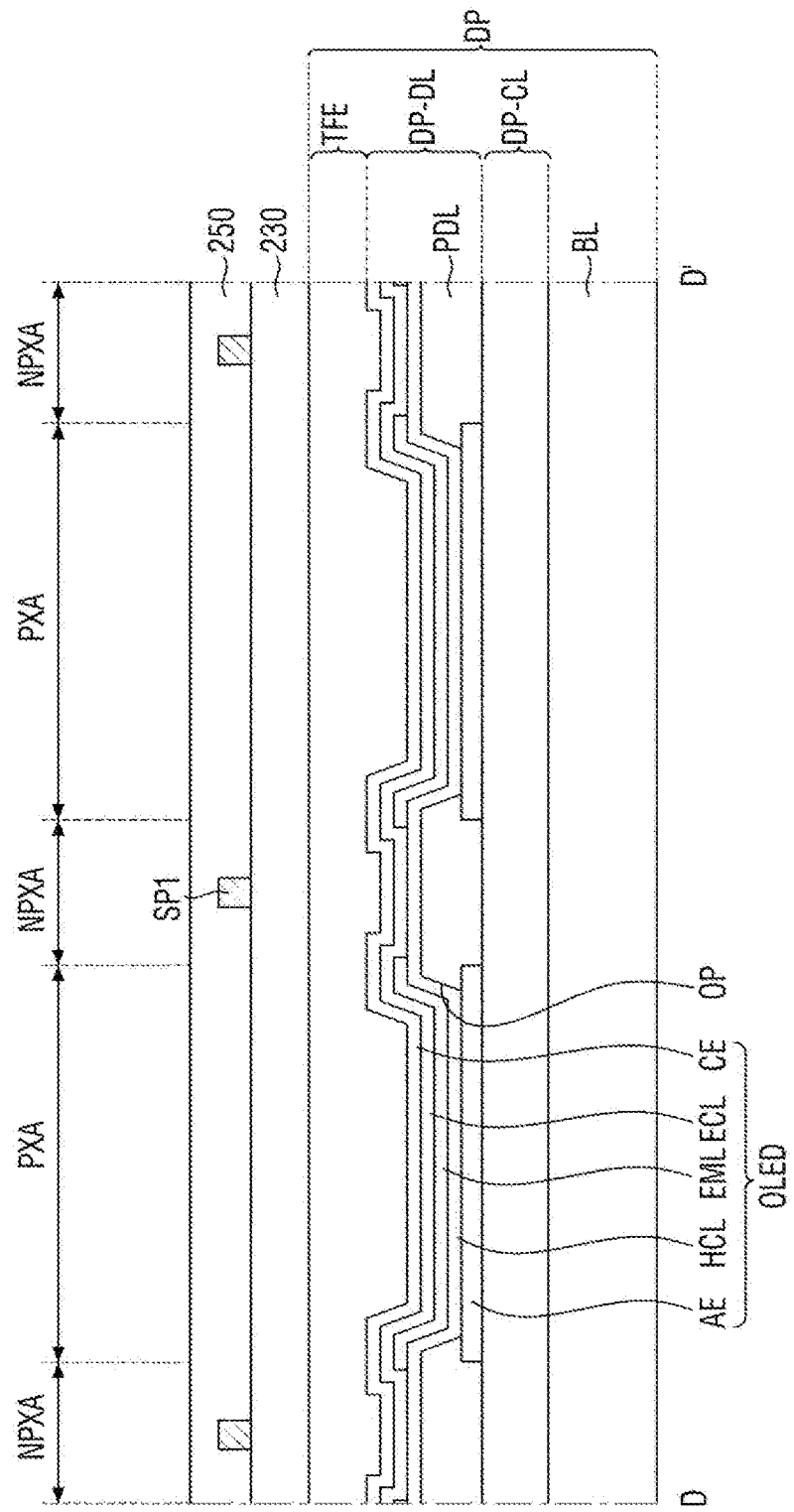
FIG. 33 is a cross-sectional view illustrating an example of the input sensing layer taken along line D-D' of FIG. 31.

FIG. 25 is a cross-sectional view illustrating another example of the display device taken along the line A-A' of FIG. 1. FIG. 26 is a plan view of a portion of an input sensing layer included in the display device of FIG. 25. FIGS. 27A and 27B are cross-sectional views illustrating examples of the input sensing layer included in the display device of FIG. 25. FIG. 28 is a plan view of a portion of a first conductive layer included in FIG. 27A. FIG. 29 is an enlarged view of area A7 of FIG. 28. FIG. 30 is a plan view of a portion of a second conductive layer included in FIG. 27A. FIG. 31 is an enlarged view of area A7 of FIG. 30. FIG. 32 is an enlarged view of area A6 of FIG. 26. FIG. 33 is a cross-sectional view illustrating an example of the input sensing layer taken along line D-D' of FIG. 31.

First, referring to FIGS. 1, 2, and 25, a display device 1_4 is different from the display device 1 of FIG. 2 in that it includes a display module 10 (or a display panel) and that the display module 10 includes a display panel 100a and an input sensing layer 200a. The display device 1_4 is substantially the same or similar to the display device 1 of FIG. 2 except for the input sensing layer 200a, and thus a redundant description will not be repeated. Elements corresponding to reference numerals identical or similar to the above-described reference numerals are substantially the same as the above-described elements, and thus a redundant description will not be repeated.

The input sensing layer 200a may be directly disposed on the display panel 100a. As described above, when the input sensing layer 200a is directly disposed on the display panel 100a, it means that no adhesive layer/adhesive member is disposed between the input sensing layer 200a and the display panel 100a. That is, after the formation of the display panel 100a, the input sensing layer 200a may be formed on the display panel 100a (e.g., a thin-film encapsulation layer TFE of the display panel 100a) through a continuous process.

An antireflection panel 300 may be attached onto the display module 10 by an optically clear adhesive member OCA.

Figure 27A:
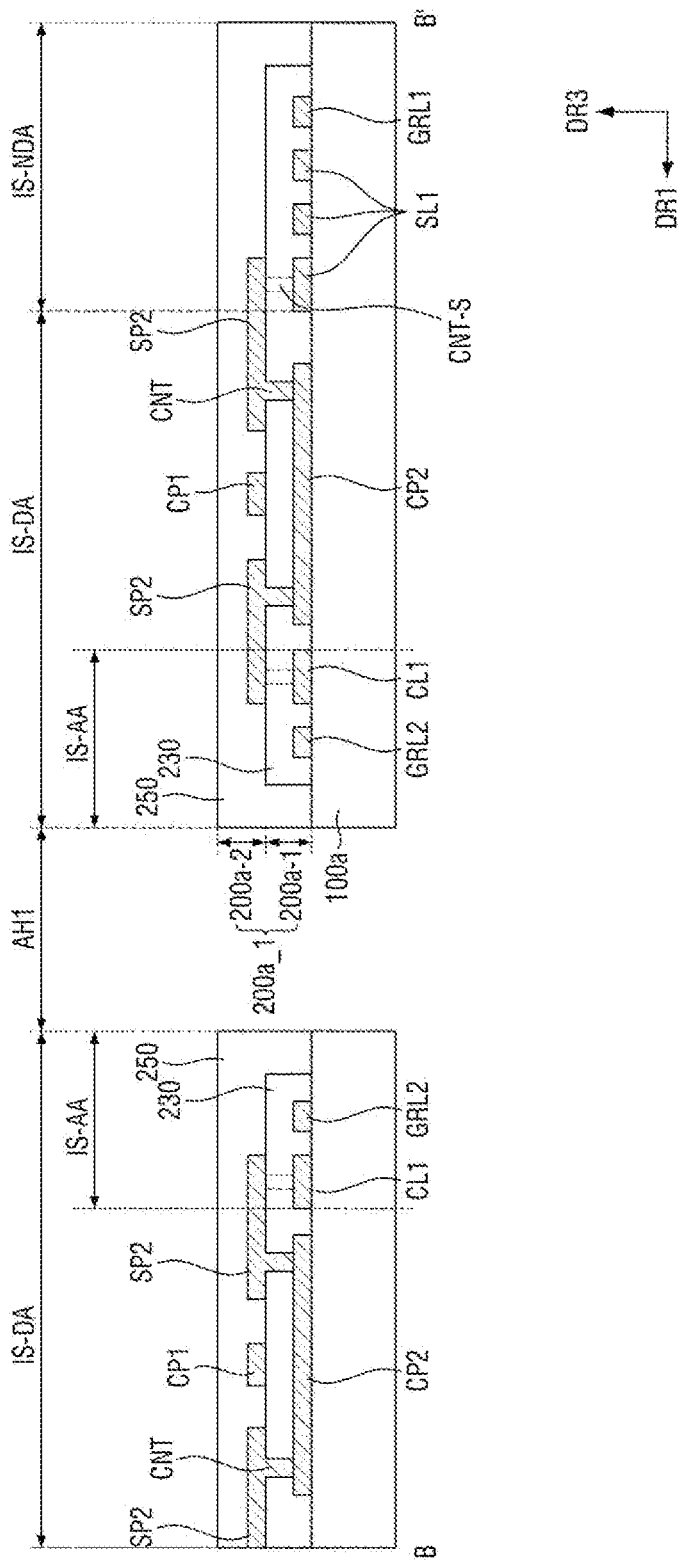
FIGS. 27A and 27B are cross-sectional views illustrating examples of the input sensing layer included in the display device of FIG. 25.
Figure 27B:
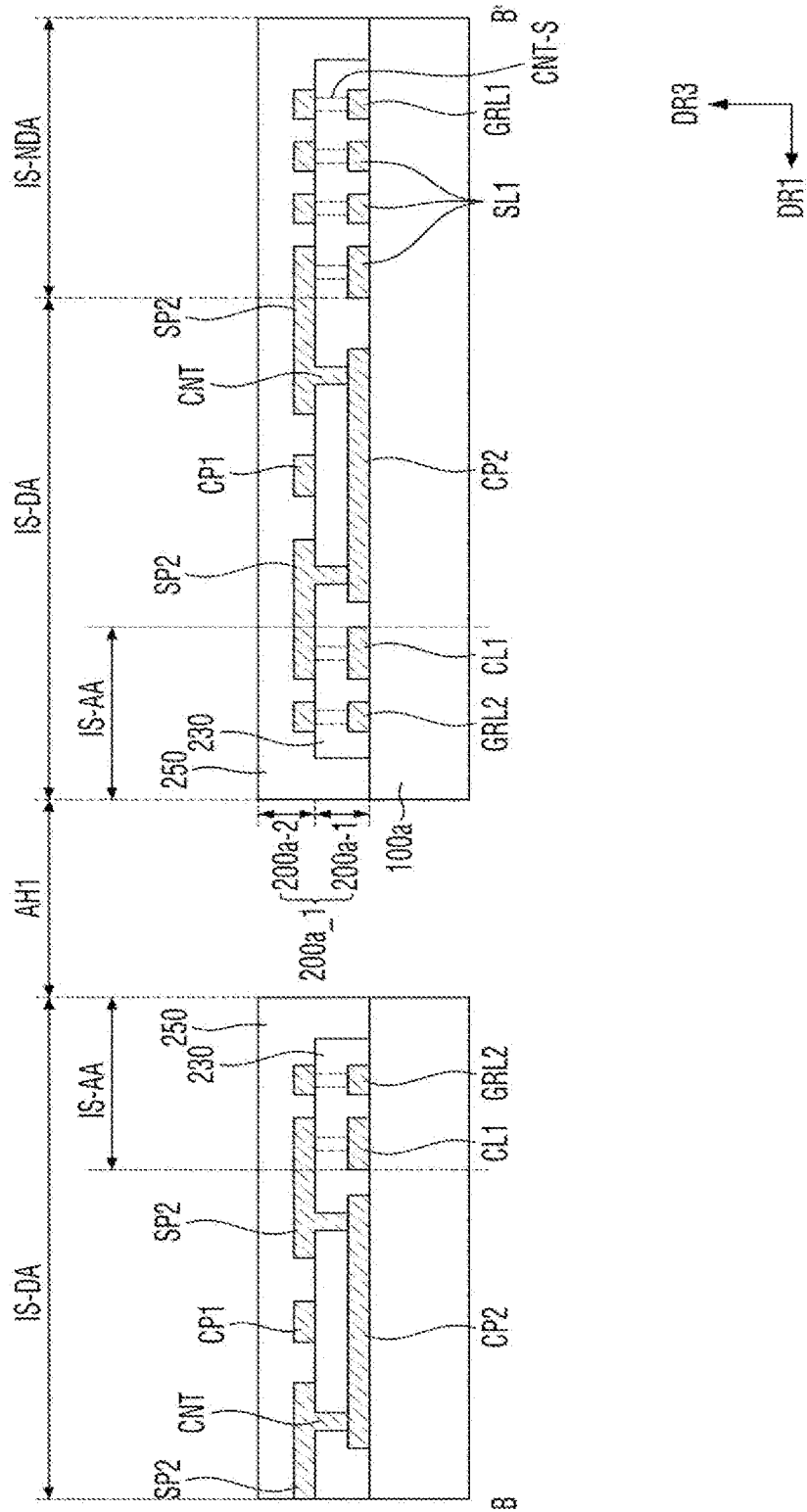
Figure 28:
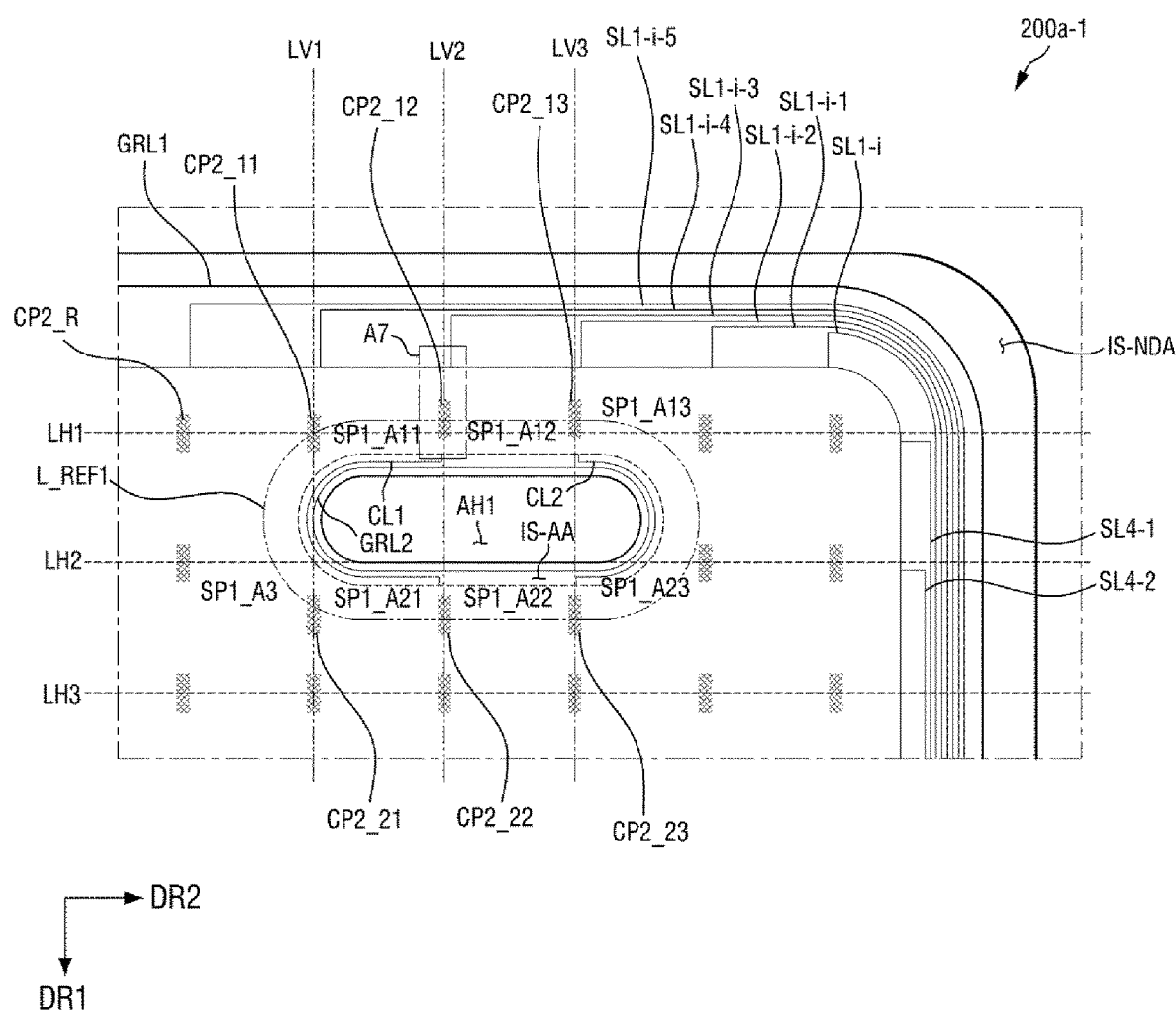
FIG. 28 is a plan view of a portion of a first conductive layer included in FIG. 27A.
Figure 29:
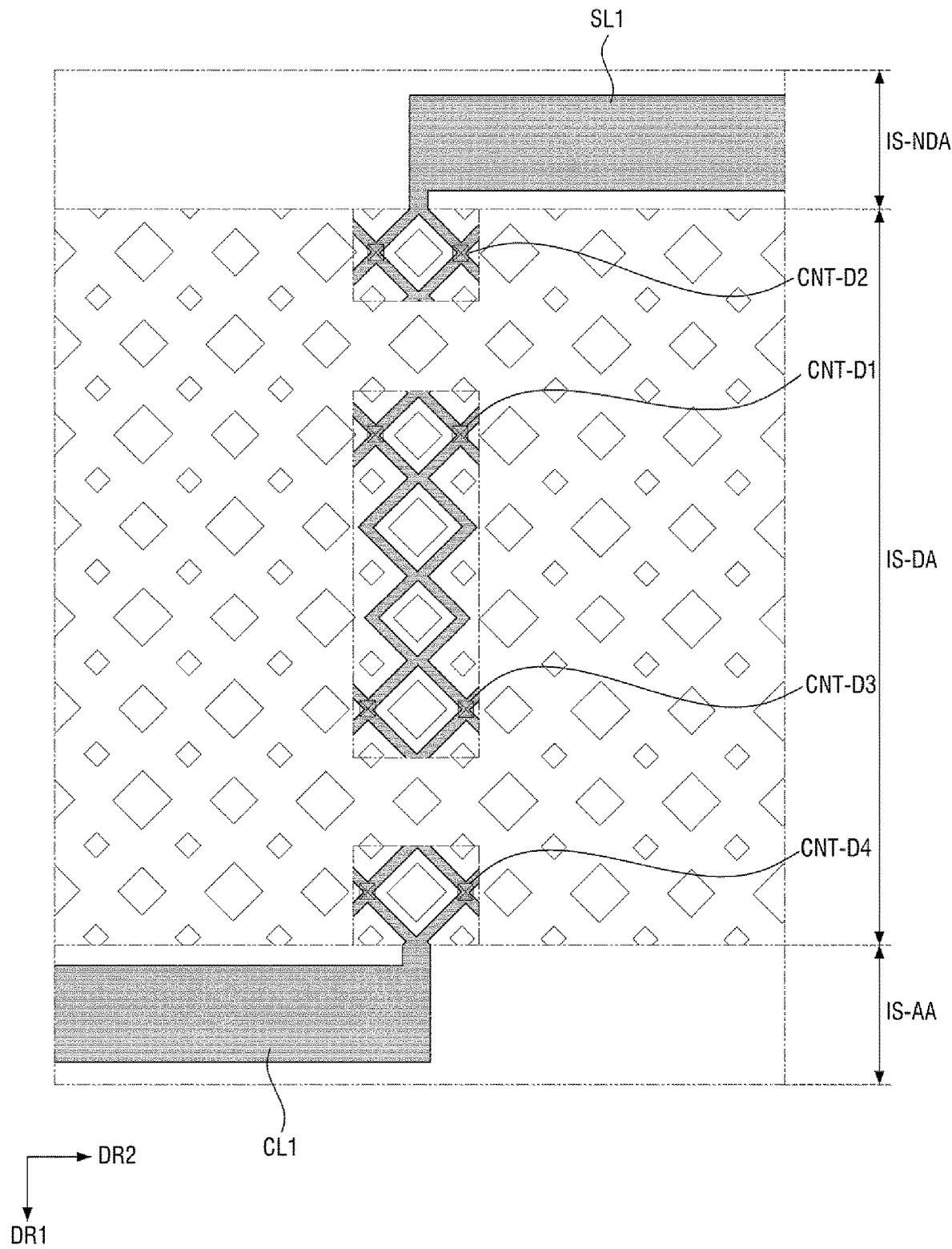
FIG. 29 is an enlarged view of area A7 of FIG. 28.
Figure 30:
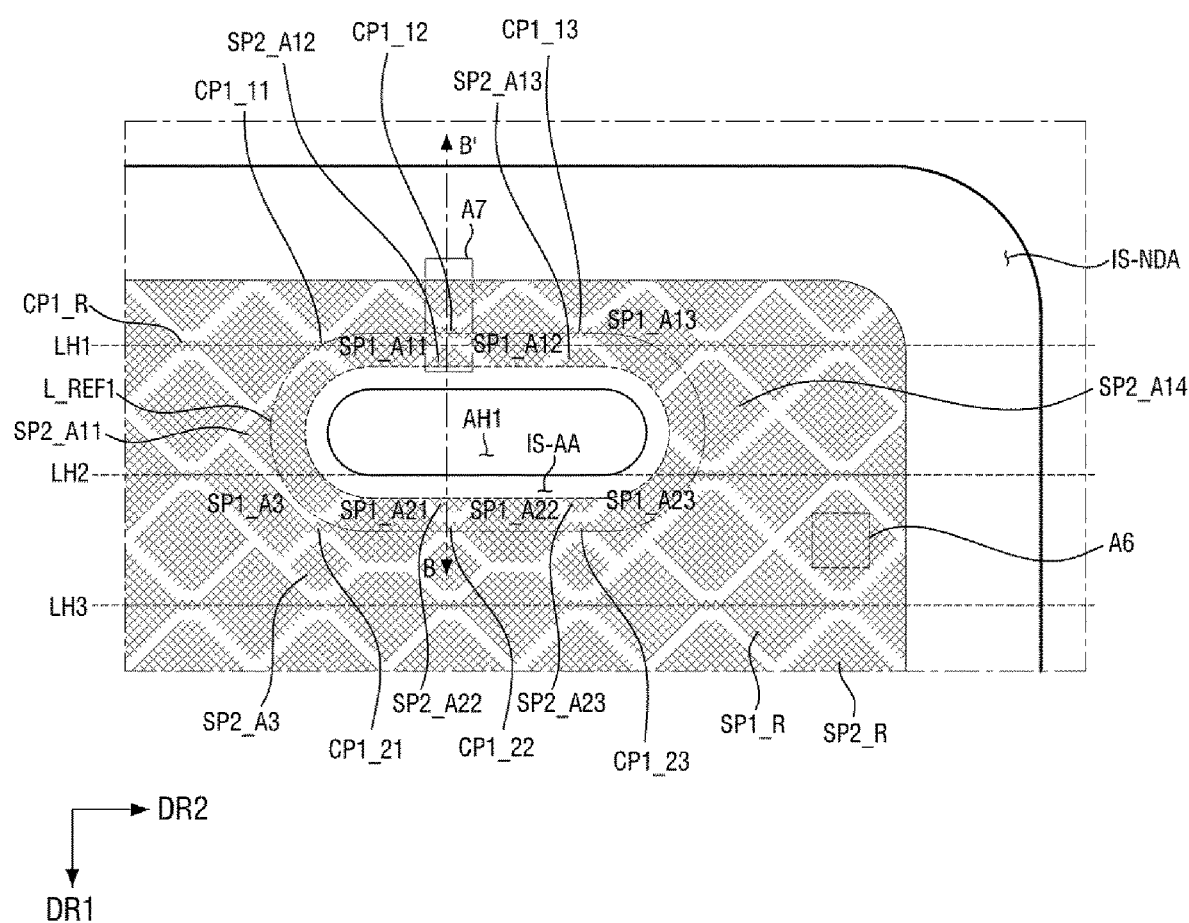
FIG. 30 is a plan view of a portion of a second conductive layer included in FIG. 27A.
Figure 31:
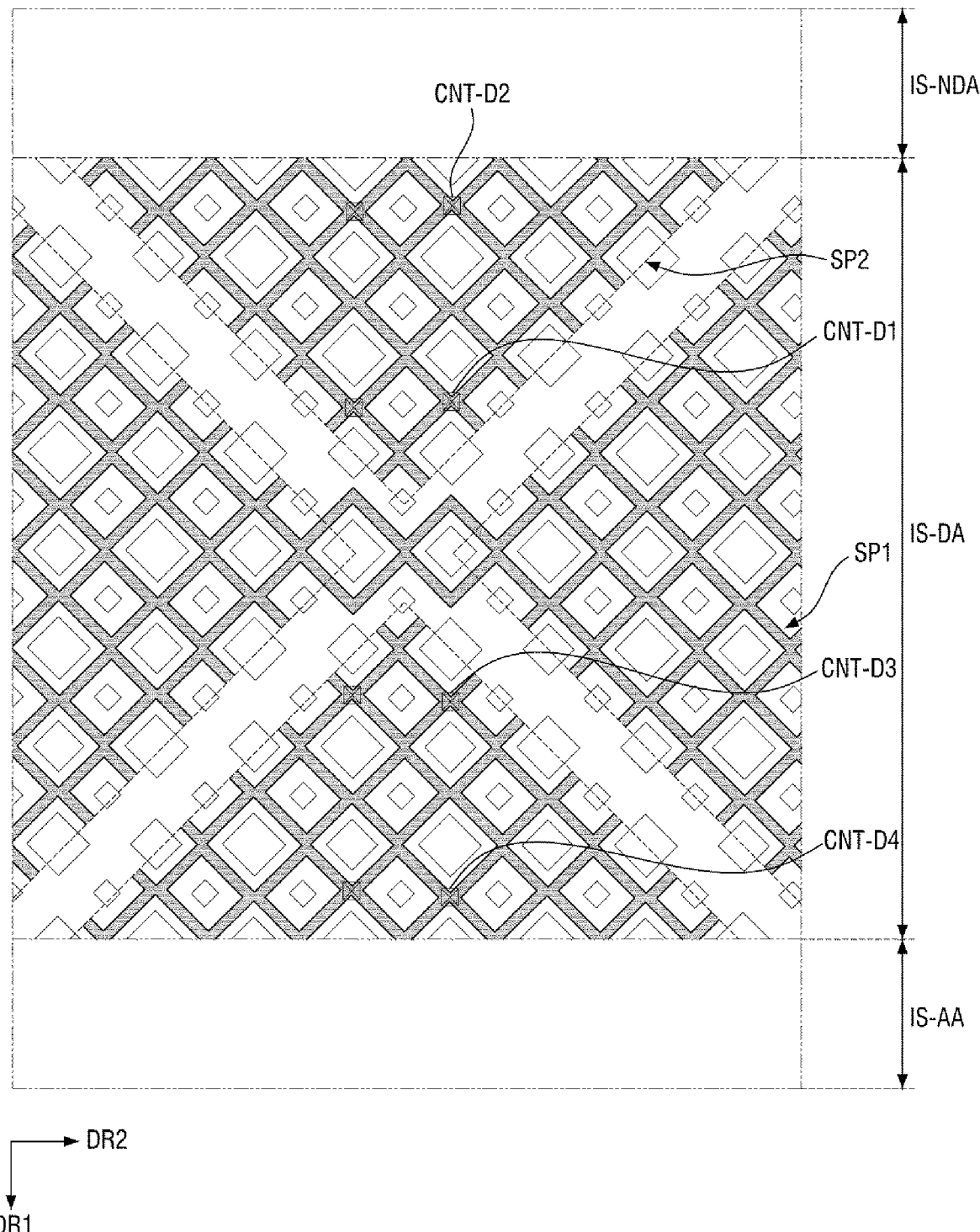
FIG. 31 is an enlarged view of area A7 of FIG. 30.

Referring to FIGS. 26, 27A, 27B, 28, 29, 30, and 31, the input sensing layer 200a includes a first input sensing layer 200a-1 disposed on the display panel 100a and a second input sensing layer 200a-2 disposed on the first input sensing layer 200a-1. In FIG. 27A, a cross-section of the input sensing layer 200a corresponding to FIG. 5 is illustrated. In FIG. 28, the first input sensing layer 200a-1 corresponding to FIG. 4B is illustrated. In FIG. 30, the second input sensing layer 200a-2 corresponding to FIG. 4C is illustrated.

Referring to FIG. 28, the first input sensing layer 200a-1 may include second connection parts CP2. In addition, the first input sensing layer 200a-1 may include first signal lines SL1, a first connection wiring CL1, and first and second guard wirings GRL1 and GRL2.

Referring to FIG. 29, a first connection part CP1 may be a metal mesh pattern. A first signal line SL1 may be a wiring having a specific line width. However, the present disclosure is not limited to this case. When the first signal line SL1 overlaps a sensing area IS-DA, a portion of the first signal line SL1 which overlaps the sensing area IS-DA may have a metal mesh pattern. Similarly, the first connection wiring CL1 may be a wiring having a specific line width. However, the present disclosure is not limited to this case. Like the first signal line SL1, the first connection wiring CL1 may also have a metal mesh pattern in a portion.

Although the line width of the first connection wiring CL1 (i.e., the width in an adjacent area IS-AA) is similar to the line width of the first signal line SL1 (i.e., the line width in a non-sensing area IS-NDA), the present disclosure is not limited to this case. As described above, the line width of the first connection wiring CL1 may be 4 to 10 times the line width of the first signal line SL1.

Referring to FIG. 27A, a first insulating layer 230 may be disposed on the first input sensing layer 200a-1 and may cover first connection parts CP1. Referring to FIG. 28, at least one contact hole CNT-D1, CNT-D2, CNT-D3 or CNT-D4 may be formed in each of the areas of the first insulating layer 230 which overlap both ends of the first connection part CP1, an end of the first connection wiring CL1, and an end of the first signal wiring SL1.

Referring to FIGS. 27A and 30, the second input sensing layer 200a-2 may include first sensor parts SP1, second sensor parts SP2, and first connection parts CP1.

The shape and size of the first sensor parts SP1 and the shape and size of the second sensor parts SP2 are substantially the same as the shape and size of the first sensor parts SP1 and the shape and size of the second sensor parts SP2 described with reference to FIG. 4A, and thus a redundant description will not be repeated.

The second sensor parts SP2 may be connected to the second connection parts CP2 through first contact holes CNT-D1 (or third contact holes CNT-D3). The second sensor parts SP2 may be connected to the first signal wirings SL1 through second contact holes CNT-D2 or may be electrically connected to the first connection wiring CL1 through fourth contact holes CNT-D4.

In embodiments, the first signal lines SL1, the first connection wiring CL1 and the first and second guard wirings GRL1 and GRL2 may be disposed in at least one of the first input sensing layer 200a-1 and the second input sensing layer 200a-2.

For example, referring to FIG. 27B, the first signal lines SL1, the first connection wiring CL1 and the first and second guard wirings GRL1 and GRL2 may be disposed in each of the first input sensing layer 200a-1 and the second input sensing layer 200a-2 and may be connected to corresponding elements through connection contact holes CNT-S. In this case, resistance values of the first signal lines SL1 and the first connection wiring CL1 may be reduced, thereby improving the sensing sensitivity of the input sensing layer 200a. In addition, the first and second guard wirings GRL1 and GRL2 can more effectively block the inflow of physical shock, static electricity, etc. from the periphery of the input sensing layer 200a (e.g., a hole AH1).

In addition, like the first input sensing layer 200a-1, the second input sensing layer 200a-2 may include the first signal lines SL1, the first connection wiring CL1, and the first and second guard wirings GRL1 and GRL2.

Referring again to FIG. 28, first adjacent connection parts CP1_11, CP1_12, CPI1_12, CP1_13, CP1_21, CP1_22, and CP1_23 may be spaced apart form a first hole AH1 by a specific distance and may be located on a first reference boundary line L_REF1. As described above, second adjacent connection parts CP2_11, CP2_12, CP2_13, CP2_21, CP2_22 and CP2_23 may respectively be disposed at intersection points (or intersection areas) of the first reference boundary line L_REF1 and first through third vertical reference lines LV1, LV2, and LV3.

Similarly, the second adjacent connection parts CP2_11, CP2_12, CP2_13, CP2_21, CP2_22 and CP2_23 may be disposed on the first reference boundary line L_REF1.

The first adjacent connection parts CP1_11, CP1_12, CP1_21, CP1_22, and CP1_23 may overlap the second adjacent connection parts CP2_12, CP2_13, CP2_21, CP2_22 and CP2_23 and may respectively be disposed at the intersection points (or intersection areas) of the first reference boundary line L_REF1 and the first through third vertical reference lines LV1, LV2, and LV3.

The shapes and sizes of adjacent sensor parts SP1_A11, SP1_12, SP1_A13, SP1_A21, SP1_A22, SP1_A23, SP2_A12, SP2_A13, SP2_A22, and SP2_A23 may be determined by the arrangement of the first adjacent connection parts CP1_11, CP1_12, CP1_21, CP1_22, and CP1_23 and the second adjacent connection parts CP2_11, CP2_12, CP2_13, CP2_21, CP2_22 and CP2_23.

First adjacent sensor parts SP1_A11, SP1_12, SP1_A13, SP1_A21, SP1_A22 and SP1_A23 may be directly connected to each other by the first adjacent connection parts CP1_11, CP1_12, CP1_21, CP1_22, and CP1_23 and may be electrically connected to fourth signal lines SL4-1 and SL4-2 described above.

Second adjacent sensor parts SP2_A12, SP2_A13, SP2_A22, and SP2_A23 may be electrically connected by the first and second connection wirings CL1 and CL2.

Accordingly, parasitic capacitance between first and second detection electrodes may be reduced. In addition, since the first and second detection electrodes do not overlap light emitting regions PXA-R, PXA-G, and PXA-B (i.e., areas where light is emitted from pixels PX), they may not be visible to a user of the display device 1_1.

The first and second detection electrodes having a mesh shape may include, but are not limited to, silver, aluminum, copper, titanium, nickel, titanium, etc. that can be processed at low temperature. Even if the input sensing layer 200a is formed by a continuous process, the damage to organic light emitting diodes OLED included in the display panel 100a can be prevented or reduced.

Referring to FIGS. 32 and 33, a first sensor parts SP1 may not overlap the light emitting regions PXA-R, PXA-G, and PXA-B and may overlap a non-light emitting region NPXA. Each of the light emitting regions PXA-R, PXA-G, and PXA-B may be defined the same as the light emitting region PXA illustrated in FIG. 6.

Mesh lines of the first sensor part SP1 may define a plurality of mesh holes IS-OPR, IS-OPG and IS-OPB (hereinafter, referred to as mesh holes). The mesh lines may have a three-layer structure of titanium/aluminum/titanium. The mesh holes IS-OPR, IS-OPG, and IS-OPB may correspond one-to-one to the light emitting regions PXA-R, PXA-G, and PXA-B.

The light emitting regions PXA-R, PXA-G, and PXA-B may be divided into a plurality of groups according to the colors of light generated from the organic light emitting diodes OLED. In FIG. 18, the light emitting regions PXA-R, PXA-G, and PXA-B are divided into three groups according to emission colors.

The light emitting regions PXA-R, PXA-G, and PXA-B may have different areas according to the colors of light emitted from light emitting layers EML of the organic light emitting diodes OLED. The areas of the light emitting regions PXA-R, PXA-G, and PXA-B may be determined by the types of the organic light emitting diodes.

The mesh holes IS-OPR, IS-OPG and IS-OPB may be divided into a plurality of groups having different areas. The mesh holes IS-OPR, IS-OPG and IS-OPB may be divided into three groups according to the corresponding light emitting regions PXA-R, PXA-G, and PXA-B.

Although the mesh holes IS-OPR, IS-OPG and IS-OPB are illustrated as corresponding one-to-one to the light emitting regions PXA-R, PXA-G, and PXA-B, the present disclosure is not limited to this case. Each of the mesh holes IS-OPR, IS-OPG and IS-OPB may also correspond to two or more light emitting regions PXA-R, PXA-G, and PXA-B.

Although the light emitting regions PXA-R, PXA-G, and PXA-B are illustrated as having various areas, the present disclosure is not limited to this case. The light emitting regions PXA-R, PXA-G, and PXA-B may also have the same size, and the mesh holes IS-OPR, IS-OPG and IS-OPB may also have the same size. The planar shape of the mesh holes IS-OPR, IS-OPG and IS-OPB is not limited and may have a polygonal shape different from a rhombus. The planar shape of the mesh holes IS-OPR, IS-OPG and IS-OPB may also be a polygonal shape with rounded corners.

The overlapping relationship between the first connection wiring CL1 illustrated in FIG. 29 and signal wirings (e.g., data wirings) and/or data wrings included in the display panel 100a may be substantially the same or similar to the overlapping relationship described with reference to FIGS. 15, 16, 19A, 19B, 19C, and 19D.

According to exemplary embodiments of the present disclosure, detection electrodes (or first adjacent sensor parts, sensing electrodes) interfered with a hole are connected to each other along a closed loop line spaced apart from an edge of the hole at a specific distance, and detection electrodes (or second adjacent sensor parts, driving electrodes) interfered with the hole and spaced apart from each other are electrically connected by a connection wiring disposed adjacent to the hole. Therefore, a display device can sense an external input through the entire display area surrounding the hole while including the hole in the display area.

In addition, double routing (or multipathing) is provided for detection electrodes interfering with the hole, thereby reducing the drop of a sensing signal and the reduction of sensing sensitivity.

However, the effects of the embodiments are not restricted to the one set forth herein. The above and other effects of the embodiments will become more apparent to one of daily skill in the art to which the embodiments pertain by referencing the claims. Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
a display unit which comprises a display area and a first hole formed in the display area; and
an input sensing unit which is disposed on the display unit and comprises a second hole corresponding to the first hole, the input sensing unit further comprising:
a base layer which comprises:
an adjacent area disposed adjacent to the second hole;
a sensing area overlapping the display area and surrounding the adjacent area;
detection electrodes which are disposed on the sensing area; and
a first connection wiring which is disposed on the adjacent area, the first connection wiring electrically connecting at least two detection electrodes spaced apart by the second hole, disposed at respective sides of the second hole,
wherein the display unit comprises:
a plurality of dams which are disposed adjacent to the first hole, each of the dams forming a closed loop along edges of the first hole, and
wherein the first connection wiring overlaps at least one of the plurality of dams.

2. The display device of claim 1, wherein the detection electrodes comprise:
sensing electrodes arranged in a first direction and connected to each other; and
driving electrodes arranged in a second direction perpendicular to the first direction and connected to each other,
wherein the at least two detection electrodes comprise a first driving electrode and a second driving electrode spaced apart from each other by the second hole, and
wherein the first driving electrode and the second driving electrode are electrically connected to each other by the first connection wiring.

3. The display device of claim 2, wherein the detection electrodes further comprise first connection parts which electrically connect an adjacent two of the sensing electrodes to each other,
wherein the sensing electrodes comprise: a first sensing electrode and a second sensing electrode disposed adjacent to the second hole, wherein the first connection parts comprise a first adjacent connection part electrically connecting the first sensing electrode and the second sensing electrode to each other, and wherein the first adjacent connection part is disposed on a first reference boundary line, the first reference boundary line spaced apart from the second hole at a reference distance.

4. The display device of claim 3, wherein the first connection parts are disposed along one imaginary line, and the first adjacent connection part is disposed at an intersection point of the imaginary line and the first reference boundary line.

5. The display device of claim 4, wherein the input sensing unit further comprises:

pads which are disposed on a non-sensing area of the base layer along edges of the sensing area; and sensing lines which are electrically connected to the pads and are disposed on the non-sensing area, wherein the first sensing electrode and the second sensing electrode are electrically connected to two of the pads by two of the sensing lines.

6. The display device of claim 5, wherein a sensing electrode disposed not adjacent to the second hole is electrically connected to only one of the sensing lines.

7. The display device of claim 1, wherein the input sensing unit further comprises a guard line which is disposed on the adjacent area of the base layer to form a closed loop along edges of the second hole.

8. The display device of claim 2, wherein each of the sensing electrodes and the first connection wiring comprises a transparent conductive pattern, and wherein the first connection wiring comprises a metal conductive pattern disposed on the transparent conductive pattern.

9. The display device of claim 1, wherein the input sensing unit further comprises a sensing wiring which is connected to an end of one of the detection electrodes, and a line width of the first connection wiring is greater than that of the sensing wiring.

10. The display device of claim 1, wherein the input sensing unit further comprises a second connection wiring which is disposed on the adjacent area and electrically connecting detection electrodes spaced apart by the second hole at respective sides of the second hole, wherein the line width of the first connection wiring is different from that of the second connection wiring.

11. The display device of claim 1, wherein the display unit comprises:

a first substrate;

a second substrate which is disposed opposing the first substrate;

a display element layer which is disposed between the first substrate and the second substrate; and a sealing member which is disposed between the first substrate and the second substrate to surround the first hole and seal the first substrate and the second substrate, wherein the first connection wiring overlaps the sealing member.

12. The display device of claim 1, further comprising:

a window unit which is disposed on the display unit, wherein the window unit comprises a light shielding pattern overlapping the adjacent area.

13. The display device of claim 1, wherein the display unit comprises wirings overlapping the adjacent area, and the first connection wiring overlaps at least two of the wirings.

14. The display device of claim 1, wherein the display unit further comprises a groove formed between the plurality of dams, the groove being inversely tapered.

15. An electronic device comprising:

a display device, which comprises a display area, a hole and an adjacent area between the display area and the hole; and a camera module which overlaps the hole of the display device, wherein the display device comprises:

a first substrate;

a display element layer disposed on the first substrate;

a first sensing electrode and a second sensing electrode disposed on the display element layer, the first sensing electrode and the second sensing electrode spaced apart by the hole; and a first connection wiring connecting the first sensing electrode and the second sensing electrode, the first connection wiring disposed in the adjacent area.

16. The electronic device of claim 15, further comprising:

a thin film encapsulation layer disposed between the display element layer and the first sensing electrode, wherein the first connection wiring is disposed on the thin film encapsulation layer.

17. The electronic device of claim 15, further comprising a circuit element layer disposed between the first substrate and the display element layer, the circuit element layer comprising a transistor;

wherein the display element layer comprises a light emitting element disposed in the display area and electrically connected to the transistor, and wherein the first substrate and the circuit layer form the hole therethrough.

18. The electronic device of claim 15, further comprising:

a plurality of dams disposed between the first substrate and the first connection wiring, wherein the plurality of dams are disposed in the adjacent area, each of the plurality of dams surrounds the hole, and the first connection wiring overlapping at least one of the plurality of dams.

19. The electronic device of claim 18, further comprising:

a groove formed between two adjacent dams of the plurality of dams, the groove being inversely tapered.

20. An electronic device comprising:

a display device, which comprises a display area, a hole and an adjacent area between the display area and the hole; and a camera module which overlaps the hole of the display device, wherein the display device comprises:

a first substrate;

a display element layer disposed on the first substrate;

a first sensing electrode and a second sensing electrode disposed on the display element layer, the first sensing electrode and the second sensing electrode spaced apart by the hole;

a first connection wiring connecting the first sensing electrode and the second sensing electrode, the first connection wiring disposed in the adjacent area;

a third sensing electrode and a fourth sensing electrode disposed on the display element layer, the third sensing electrode and the fourth sensing electrode spaced apart by the hole; and a second connection wiring connecting the third sensing electrode and the fourth sensing electrode, the second connection wiring disposed in the adjacent area, wherein a line width of the first connection wiring is different from a line width of the second connection wiring.

21. The electronic device of claim 20, wherein the first connection wiring and the second connection wiring are spaced apart from each other.

22. The electronic device of claim 20, wherein a portion of the second connection wiring is disposed between the hole and the first connection wiring in a plan view, and wherein a portion of the first connection wiring is disposed between the display area and the portion of the second connection wiring in the plan view.

23. The electronic device of claim 22, wherein the display device further comprises a guard line disposed on the display element layer, the guard line surrounding the hole in the plan view, wherein a portion of the guard line is disposed between the hole and the portion of the second connection wiring.

24. The electronic device of claim 23, wherein the line width of the first connection wiring is larger than a line width of the guard line.

25. The electronic device of claim 20, wherein a length of the first connection wiring is different from a length of the second connection wiring.

26. The electronic device of claim 20, wherein the first connection wiring is integrally formed with the first sensing electrode.

27. The electronic device of claim 26, wherein the second connection wiring is integrally formed with the third sensing electrode.

28. The electronic device of claim 20, wherein the first connection wiring and the second connection wiring overlap each other.

29. The electronic device of claim 20, wherein a distance between the first connection wiring and the second connection wiring is smaller than the line width of the first connection wiring.

30. The electronic device of claim 20, wherein the display device further comprises a first data line disposed between the first substrate and the display element layer, and wherein the first connection wing overlaps the first data line.

31. The electronic device of claim 30, wherein the line width of the first connection wiring is larger than a line width of the first data line.

32. The electronic device of claim 30, wherein the display device further comprises a second data line disposed between the first substrate and the display element layer, wherein the second data line is spaced apart from the first data line, and wherein the second connection wing overlaps the second data line.

33. The electronic device of claim 32, wherein the line width of the second connection wiring is larger than a line width of the second data line.

34. The electronic device of claim 20, wherein the hole is disposed between a portion of the first connection wiring and a portion of the second connection wiring in a plan view.

35. The electronic device of claim 20, wherein the first connection wiring and the second connection wiring do not overlap each other in a plan view.

36. The electronic device of claim 20, wherein the display device further comprises:

a second substrate disposed on the display element layer, and a sealing member which is disposed between the first substrate and the second substrate to surround the hole and seal the first substrate and the second substrate, wherein the display element layer is disposed between the first substrate and the second substrate, wherein the first connection wiring and the second connection wiring overlap the sealing member.

* * * * *